United States Patent
Endoh et al.

(10) Patent No.: US 8,842,364 B2
(45) Date of Patent: *Sep. 23, 2014

(54) OPTICAL DEVICE, MANUFACTURING METHOD THEREOF, AND METHOD OF MANUFACTURING MASTER

(71) Applicant: Dexerials Corporation, Tokyo (JP)

(72) Inventors: Sohmei Endoh, Miyagi (JP); Kazuya Hayashibe, Miyagi (JP)

(73) Assignee: Dexerials Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/043,295

(22) Filed: Oct. 1, 2013

(65) Prior Publication Data

US 2014/0036371 A1 Feb. 6, 2014

Related U.S. Application Data

(62) Division of application No. 12/870,229, filed on Aug. 27, 2010, now Pat. No. 8,611,009.

(30) Foreign Application Priority Data

Sep. 2, 2009 (JP) ................................. 2009-203179

(51) Int. Cl.
*G02B 1/10* (2006.01)
*G02B 27/00* (2006.01)
*G02B 5/28* (2006.01)
*G02B 1/11* (2006.01)
*G03F 7/00* (2006.01)
*G02B 5/02* (2006.01)

(52) U.S. Cl.
CPC .............. *G02B 1/118* (2013.01); *G03F 7/0005* (2013.01); *G02B 5/0215* (2013.01)
USPC ........... 359/580; 359/577; 359/588; 359/589; 359/601

(58) Field of Classification Search
USPC .......................... 359/580, 589, 577, 588, 601
See application file for complete search history.

(56) References Cited

U.S. PATENT DOCUMENTS

| 2002/0135847 A1 | 9/2002 | Nagasaka et al. |
| 2003/0011315 A1 | 1/2003 | Ito et al. |

(Continued)

FOREIGN PATENT DOCUMENTS

| JP | A-03-036024 | 2/1991 |
| JP | A-2003-004916 | 1/2003 |

(Continued)

OTHER PUBLICATIONS

Chinese Patent Office, Notification of the Second Office Action mailed Oct. 22, 2012 in Chinese Patent Application No. 20101026541.1 w/English-language Translation.

(Continued)

*Primary Examiner* — Scott J Sugarman
*Assistant Examiner* — Mustak Choudhury
(74) *Attorney, Agent, or Firm* — Oliff PLC

(57) ABSTRACT

An optical device that has an antireflection function, the optical device including: a base; and a plurality of structural bodies, which are formed by convex portions or concave portions, arranged on a surface of the base with a fine pitch that is equal to or smaller than a wavelength of visible light, wherein the plurality of structural bodies are arranged so as to form tracks of a plurality of rows on the surface of the base and form a quasi-hexagonal lattice pattern, a tetragonal lattice pattern, or a quasi-tetragonal lattice pattern, and wherein a packing ratio of the structural bodies to the surface of the base is equal to or higher than 65%.

12 Claims, 42 Drawing Sheets

(56) References Cited

U.S. PATENT DOCUMENTS

| | | |
|---|---|---|
| 2004/0124007 A1 | 7/2004 | Ashida |
| 2005/0074576 A1 | 4/2005 | Chalken et al. |
| 2007/0206287 A1* | 9/2007 | Tsukamoto .................. 359/599 |
| 2009/0061165 A1* | 3/2009 | Iwata et al. .................. 428/179 |
| 2009/0190225 A1* | 7/2009 | Yamada et al. ............... 359/580 |

FOREIGN PATENT DOCUMENTS

| | | |
|---|---|---|
| JP | A-2003-240904 | 8/2003 |
| JP | A-2003-294910 | 10/2003 |
| JP | A-2003-322705 | 11/2003 |
| JP | A-2004-317922 | 11/2004 |
| JP | A-2005-031538 | 2/2005 |
| JP | A-2006-038928 | 2/2006 |
| JP | A-2007-203576 | 8/2007 |
| JP | A-2008-304637 | 12/2008 |
| JP | A-2009-131390 | 6/2009 |
| WO | WO 2008/023816 A1 | 2/2008 |

OTHER PUBLICATIONS

"Optical and Eletro-Optical Engineering Contact", 2005, pp. 630-637, vol. 43, No. 11.

Japanese Patent Office, Notification of Reason(s) for Refusal mailed Aug. 28, 2013 in Japanese Patent Application No. 2009-203179 w/English-language Translation.

Feb. 18, 2014 Office Action issued in Chinese Patent Application No. 201010265401.1 (with English-language translation).

Jan. 24, 2014 Japanese Office Action issued in Japanese Patent Application No. 2009-203179 (with English-language Translation).

* cited by examiner

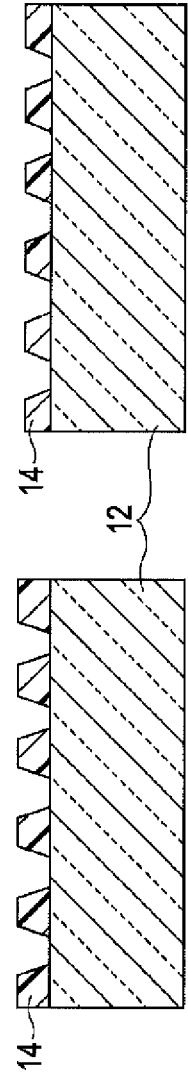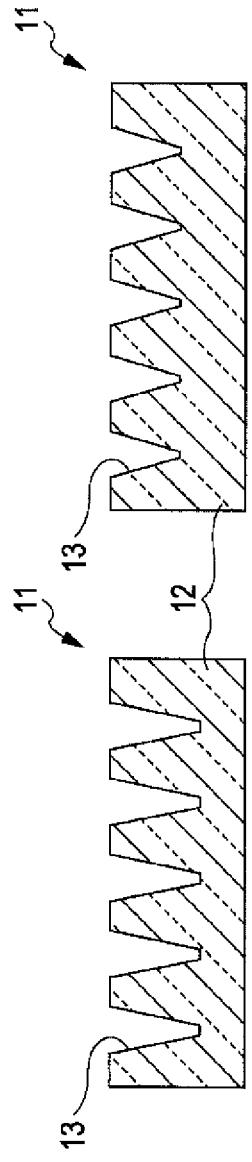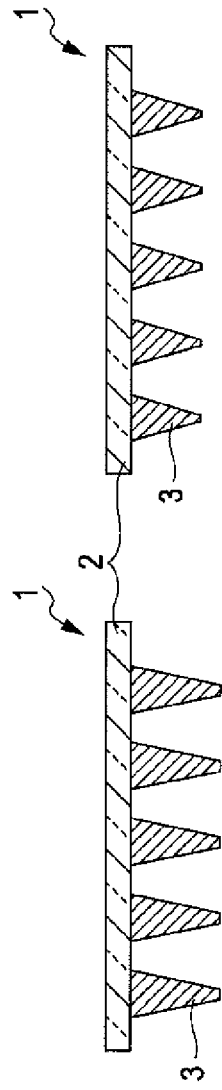
FIG. 13A
FIG. 13B
FIG. 13C

T1, T3, ···

T2, T4, ···

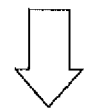

OPTICAL DEVICE, MANUFACTURING METHOD THEREOF, AND METHOD OF MANUFACTURING MASTER

CROSS REFERENCES TO RELATED APPLICATIONS

This application is a division of U.S. application Ser. No. 12/870,229, filed Aug. 27, 2010, and claims priority to Japanese Priority Patent Application No. 2009-203179, filed in the Japan Patent Office on Sep. 2, 2009. The prior applications, including the specifications, drawings and abstracts are incorporated herein by reference in their entirety.

BACKGROUND

The present application relates to an optical device, a method of manufacturing the optical device, and a method of manufacturing a master that is used in the optical device, and more particularly, to an optical device having a surface on which a plurality of structural bodies formed by convex portions or concave portions are arranged with a fine pitch that is equal to or smaller than the wavelength of visible light.

Generally, in some optical devices using a transparent substrate that is formed from glass, plastic, or the like, surface processing is performed so as to suppress the surface reflection of light. As surface processing of such a type, there is processing in which fine and dense concavo-convexes (moth eyes) are formed on the surface of the optical device (for example, see "Optical and Electro-Optical Engineering Contact" Vol. 43, No. 11 (2005), p 630-637).

Generally, in a case where periodical concave-convex shapes are disposed on the surface of the optical device, when light is transmitted through the concave-convex shapes, diffraction occurs. Accordingly, a direct advancing component of transmitted light decreases in a large amount. However, in a case where the pitch of the concave-convex shapes is shorter than the wavelength of the transmitted light, diffraction does not occur. Thus, for example, when the concave-convex shape is formed as a rectangular shape as described later, an effective antireflection effect can be acquired for the light of a single wavelength corresponding to the pitch, the depth, or the like.

As a moth-eye structure produced by using electron beam exposure, a moth-eye structure (pitch: about 300 nm; depth: about 400 nm) having a fine tent-like shape is disclosed (for example, see NTT Advanced Technology Corporation "Molding Die Master for Antireflection Bodies (Moth Eye) That Do Not Have Dependency on the Wavelength" online, Searched on Feb. 27, 2008, Internet Website http://keytech.ntt-at.co.jp/nano/prd__0033.html). According to such a moth-eye structure, the antireflection characteristic of high performance having the reflectivity that is equal to or lower than 1% can be acquired.

SUMMARY

However, recently, in order to improve visibility of various display devices such as liquid crystal display devices, a more superior antireflection characteristic is desired to be implemented. In addition, in a package of a CCD (Charge Coupled Device) image sensor device, a CMOS (Complementary Metal Oxide Semiconductor) image sensor device, a photodiode (PD), or the like, cover glass is used. Thus, it is also desired to improve the antireflection characteristic of the cover glass.

It is desirable to provide an optical device having a superior antireflection characteristic, a method of manufacturing the optical device, and a method of manufacturing a master that is used in the optical device.

According to an embodiment, there is provided an optical device that has an antireflection function. The optical device includes: a base; and a plurality of structural bodies, which are formed by convex portions or concave portions, arranged on a surface of the base with a fine pitch that is equal to or smaller than a wavelength of visible light. The plurality of structural bodies are arranged so as to form tracks of a plurality of rows on the surface of the base and form a quasi-hexagonal lattice pattern, a tetragonal lattice pattern, or a quasi-tetragonal lattice pattern, and a packing ratio of the structural bodies to the surface of the base is equal to or higher than 65%.

According to another embodiment, there is provided an optical device that has an antireflection function. The optical device includes: a base; and a plurality of structural bodies, which are formed by convex portions or concave portions, arranged on a surface of the base with a fine pitch that is equal to or smaller than a wavelength of visible light. The plurality of structural bodies are arranged so as to form tracks of a plurality of rows on the surface of the base and form a quasi-hexagonal lattice pattern, and, when an arrangement pitch of the plurality of structural bodies within a same track is P1 and a diameter of a bottom surface of the structural body in a direction of the tracks is 2r, a ratio (($2r/P1$)×100) of the diameter 2r to the arrangement pitch P1 is equal to or higher than 85%.

According to another embodiment, there is provided an optical device that has an antireflection function. The optical device includes: a base; and a plurality of structural bodies, which are formed by convex portions or concave portions, arranged on a surface of the base with a fine pitch that is equal to or smaller than a wavelength of visible light.

The plurality of structural bodies are arranged so as to form tracks of a plurality of rows on the surface of the base and form a tetragonal lattice pattern or a quasi-tetragonal lattice pattern, and, when an arrangement pitch of the plurality of structural bodies within a same track is P1 and a diameter of a bottom surface of the structural body in a direction of the tracks is 2r, a ratio (($2r/P1$)×100) of the diameter 2r to the arrangement pitch P1 is equal to or higher than 90%.

According to another embodiment, there is provided a method of manufacturing a master that is used for producing an optical device that has an antireflection function. The method includes the steps of: forming a resist layer on a circumferential surface of the master having a solid cylinder shape or a hollow cylinder shape; forming a latent image with a pitch shorter than a wavelength of visible light by intermittently irradiating laser beams onto the resist layer while a spot of the laser beams is relatively moved in parallel with a center axis of the master having the solid cylinder shape or the hollow cylinder shape together with rotating the master in which the resist layer is formed; forming a resist pattern on a surface of the master by developing the resist layer; and forming a structural body having a concave shape or a convex shape on the surface of the master by performing an etching process using the resist pattern as a mask. In the forming of a latent image, the latent image is arranged so as to form tracks of a plurality of rows on the surface of the master and forms a quasi-hexagonal lattice pattern, a tetragonal lattice pattern, or a quasi-tetragonal lattice pattern, and a packing ratio of the structural body to the surface of the master is equal to or higher than 65%.

According to another embodiment, there is provided a method of manufacturing a master that is used for producing an optical device that has an antireflection function. The method includes the steps of: forming a resist layer on a circumferential surface of the master having a solid cylinder shape or a hollow cylinder shape; forming a latent image with a pitch shorter than a wavelength of visible light by intermittently irradiating laser beams onto the resist layer while a spot of the laser beams is relatively moved in parallel with a center axis of the master having the solid cylinder shape or the hollow cylinder shape together with rotating the master in which the resist layer is formed; forming a resist pattern on a surface of the master by developing the resist layer; and forming structural bodies having a concave shape or a convex shape on the surface of the master by performing an etching process using the resist pattern as a mask. In the forming of a latent image, the latent image is arranged so as to form tracks of a plurality of rows on the surface of the master and forms a quasi-hexagonal lattice pattern, and, when an arrangement pitch of the plurality of structural bodies within a same track is P1 and a diameter of the structural body in a direction of the tracks is 2r, a ratio (($2r/P1$)×100) of the diameter 2r to the arrangement pitch P1 is equal to or higher than 85%.

According to another embodiment, there is provided a method of manufacturing a master that is used for producing an optical device that has an antireflection function. The method includes the steps of: forming a resist layer on a surface of the master having a solid cylinder shape or a hollow cylinder shape; forming a latent image with a pitch shorter than a wavelength of visible light by intermittently irradiating laser beams onto the resist layer while a spot of the laser beams is relatively moved in parallel with a center axis of the master having the solid cylinder shape or the hollow cylinder shape together with rotating the master in which the resist layer is formed; forming a resist pattern on a surface of the master by developing the resist layer; and forming structural bodies having a concave shape or a convex shape on the surface of the master by performing an etching process using the resist pattern as a mask. In the forming of a latent image, the latent image is arranged so as to form tracks of a plurality of rows on the surface of the base, and a tetragonal lattice pattern or a quasi-tetragonal lattice pattern is formed, and, when an arrangement pitch of the plurality of structural bodies within a same track is P1 and a diameter of the structural body in a direction of the tracks is 2r, a ratio (($2r/P1$)×100) of the diameter 2r to the arrangement pitch P1 is equal to or higher than 64%.

According to another embodiment, there is provided a method of manufacturing an optical device that has an antireflection function. The method includes the steps of: forming a resist layer on a circumferential surface of the master having a solid cylinder shape or a hollow cylinder shape; forming a latent image with a pitch shorter than a wavelength of visible light by intermittently irradiating laser beams onto the resist layer while a spot of the laser beams is relatively moved in parallel with a center axis of the master having the solid cylinder shape or the hollow cylinder shape together with rotating the master in which the resist layer is formed; forming a resist pattern on a surface of the master by developing the resist layer; forming structural bodies having a concave shape or a convex shape on the surface of the master by performing an etching process using the resist pattern as a mask; and producing the optical device to which the structural bodies are transferred by using the master in which the structural bodies are formed. In the forming of a latent image, the latent image is arranged so as to form tracks of a plurality of rows on the surface of the master and forms a quasi-hexagonal lattice pattern, a tetragonal lattice pattern, or a quasi-tetragonal lattice pattern, the transferring of the structural bodies includes forming a resin layer containing siloxane resin on the base, and transferring the structural bodies of the master by pressing the master against the resin layer, and a packing ratio of the structural bodies to the surface of the master is equal to or higher than 65%.

According to an embodiment, it is preferable that the main structural bodies are periodically arranged in a tetragonal lattice shape or a quasi-tetragonal lattice shape. Here, the tetragonal lattice shape represents a lattice having the shape of a square. The quasi-tetragonal lattice shape, differently from the tetragonal lattice shape, represents a lattice having a distorted square shape.

For example, in a case where structural bodies are arranged on a straight line, the quasi-tetragonal lattice represents a distorted tetragonal lattice acquired by stretching a lattice having a square shape in the arrangement direction (track direction) that is linear. In a case where the structural bodies meander so as to be arranged, the quasi-tetragonal lattice represents a lattice having a square shape that is distorted due to the meandering arrangement of the structural bodies. Alternatively, the quasi-tetragonal lattice represents a tetragonal lattice that is distorted by linearly stretching a lattice having a square shape in the arrangement direction (track direction), which is linear, and is distorted in accordance with the meandering arrangement of the structural bodies.

According to an embodiment, it is preferable that the structural bodies are periodically disposed in a hexagonal lattice shape or a quasi-hexagonal lattice shape. Here, the hexagonal lattice represents a lattice having a regular hexagon. The quasi-hexagonal lattice, differently from a lattice having a regular hexagon, represents a lattice having a distorted hexagon shape.

For example, in a case where the structural bodies are disposed on a straight line, the quasi-hexagonal lattice represents a hexagonal lattice that is distorted by stretching a lattice having a regular hexagon in the arrangement direction (track direction) that is linear. In a case where the structural bodies meander so as to be arranged, the quasi-hexagonal lattice represents a distorted hexagonal lattice acquired by allowing a lattice having a regular hexagon in accordance with the meandering arrangement of the structural bodies. Alternatively, the quasi-hexagonal lattice represents a hexagonal lattice that is distorted by linearly stretching a lattice having a regular hexagon shape in the arrangement direction (track direction), which is linear, and is distorted in accordance with the meandering arrangement of the structural bodies.

In an embodiment, an ellipse includes not only a perfect ellipse that is mathematically defined but also an ellipse that is more or less distorted. In addition, a circular shape includes not only a perfect circle that is mathematically defined but also a circular shape that is more or less distorted.

In an embodiment, it is preferable that the arrangement pitch P1 of the structural bodies within the same track is longer than the arrangement pitch P2 of the structural bodies between two adjacent tracks. Accordingly, the packing ratio of the structural bodies having an elliptic cone shape or an elliptic truncated cone shape can be improved, and thereby the antireflection characteristic can be improved.

In an embodiment, in a case where the structural bodies form a hexagonal lattice pattern or a quasi-hexagonal lattice pattern on the surface of the base, when an arrangement pitch of the plurality of structural bodies within the same track is P1 and an arrangement pitch of the plurality of structural bodies between two adjacent tracks is P2, it is preferable that a ratio of P1/P2 satisfies relationship of $1.00 \leq P1/P2 \leq 1.1$ or $1.00 < P1/$ P2≤1.1. By allowing the ratio in such a numeric range, the packing ratio of the structural bodies having an elliptic cone shape or an elliptic truncated cone shape can be improved, and thereby the antireflection characteristic can be improved.

In an embodiment, in a case where the structural bodies form a hexagonal lattice pattern or a quasi-hexagonal lattice pattern on the surface of the base, it is preferable that each structural body has the major axis directed in the extending direction of the track and has an elliptic cone shape or an elliptic truncated cone shape in which the tilt of the center portion is formed to be steeper than that of the front end portion or the bottom portion. By forming such a shape, the antireflection characteristic and the transmission characteristic can be improved.

In an embodiment, in a case where the structural bodies form a hexagonal lattice pattern or a quasi-hexagonal lattice pattern on the surface of the base, it is preferable that the height or depth of the structural body in the extending direction of the track is smaller than the height or depth of the structural body in the row direction of the track. In a case where such a relationship is not satisfied, the arrangement pitch in the extending direction of the track is increased. Accordingly, the packing ratio of the structural bodies in the extending direction of the track decreases. When the packing ratio decreases as such, the reflection characteristic deteriorates.

In an embodiment, in a case where the structural bodies form a tetragonal lattice pattern or a quasi-tetragonal lattice pattern on the surface of the base, it is preferable that the arrangement pitch P1 of the structural bodies within the same track is longer than the arrangement pitch P2 of the structural bodies between two adjacent tracks. Accordingly, the packing ratio of the structural bodies having an elliptic cone shape or an elliptic truncated cone shape can be improved, and thereby the antireflection characteristic can be improved.

In a case where the structural bodies form a tetragonal lattice pattern or a quasi-tetragonal lattice pattern on the surface of the base, it is preferable that, when an arrangement pitch of the plurality of structural bodies within a same track is P1 and an arrangement pitch of the structural bodies between two adjacent tracks is P2, the ratio of P1/P2 satisfies relationship of 1.4<P1/P2≤1.5. By allowing the ratio in such a numeric range, the packing ratio of the structural bodies having an elliptic cone shape or an elliptic truncated cone shape can be improved, and thereby the antireflection characteristic can be improved.

In a case where the structural bodies form a tetragonal lattice pattern or a quasi-tetragonal lattice pattern on the surface of the base, it is preferable that each structural body has the major axis directed in the extending direction of the track and has an elliptic cone shape or an elliptic truncated cone shape in which the tilt of the center portion is formed to be steeper than that of the front end portion or the bottom portion. By forming such a shape, the antireflection characteristic and the transmission characteristic can be improved.

In a case where the structural bodies form a tetragonal lattice pattern or a quasi-tetragonal lattice pattern on the surface of the base, it is preferable that the height or depth of the structural body in the direction of 45 degrees or about 45 degrees with respect to the track is smaller than the height or depth of the structural body in the row direction of the track. In a case where such a relationship is not satisfied, the arrangement pitch in the direction of 45 degrees or about 45 degrees with respect to the track is increased. Accordingly, the packing ratio of the structural bodies in the direction of 45 degrees or about 45 degrees with respect to the track decreases. When the packing ratio decreases as such, the reflection characteristic deteriorates.

According to an embodiment, a plurality of the structural bodies that are arranged on the surface of the base with a fine pitch form tracks of a plurality of rows and form a hexagonal lattice pattern, a quasi-hexagonal lattice pattern, a tetragonal lattice pattern, or a quasi-tetragonal lattice pattern between three adjacent tracks. Accordingly, the packing density of the structural bodies on the surface can be increased. Therefore, the antireflection efficiency of visible light is increased, and thereby an optical device having a superior antireflection characteristic and extremely high transmissivity can be acquired. In addition, when a recording technology for an optical disc is used for manufacturing the structural bodies, the master used for producing the optical device can be manufactured in a short time with high efficiency, and an increase in the size of the base can be easily implemented. Therefore, the productivity of the optical devices can be improved. In addition, in a case where the fine arrangements of the structural bodies are disposed not only on the light incident surface but also on the light emitting surface, the transmission characteristic can be further improved.

As described above, according to an embodiment, an optical device having a superior antireflection characteristic can be realized.

Additional features and advantages are described herein, and will be apparent from the following Detailed Description and the figures.

BRIEF DESCRIPTION OF THE FIGURES

FIGS. 13A to 13C are process flow diagrams illustrating a method of manufacturing an optical device according to the first embodiment.

DETAILED DESCRIPTION

The present application is described below in detail with reference to the drawings according to an embodiment. The detailed description is provided as follows:

1. First Embodiment (example in which structural bodies are arranged in two dimensions in a linear shape and a hexagonal lattice shape: see FIGS. 1A to 1F)
2. Second Embodiment (example in which structural bodies are arranged in two dimensions in a linear shape and a tetragonal lattice shape: see FIGS. 14A to 14F)
3. Third Embodiment (example in which structural bodies are arranged in two dimensions in an arc shape and a hexagonal lattice shape: see FIGS. 17A to 17D)
4. Fourth Embodiment (example in which structural bodies are arranged so as to meander: see FIGS. 20A and 20B)
5. Fifth Embodiment (example in which structural bodies having a concave shape are formed on the surface of the base: See FIGS. 21A to 21D)
6. Sixth Embodiment (example in which an optical device is produced by using room-temperature nanoimprint technology: see FIG. 23).
7. Seventh Embodiment (first application to display device: see FIG. 25)
8. Eighth Embodiment (second application to display device: see FIG. 26)
9. Ninth Embodiment (application to a package of an image sensor device: see FIG. 27)
10. Examples

1. First Embodiment

Configuration of Optical Device

Figure 1A:
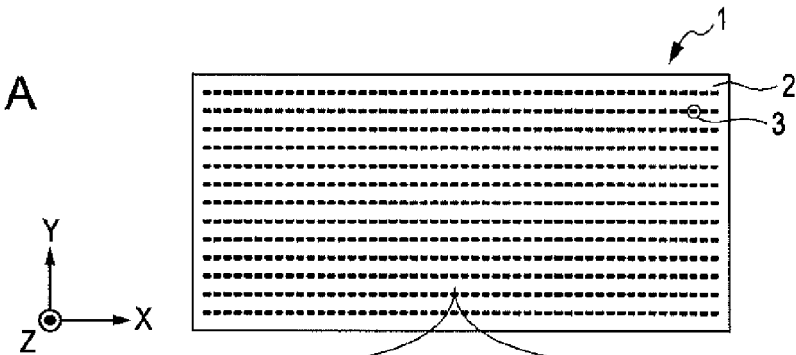
FIG. 1A is a schematic plan view showing an example of the configuration of an optical device according to a first embodiment.
Figure 1B:
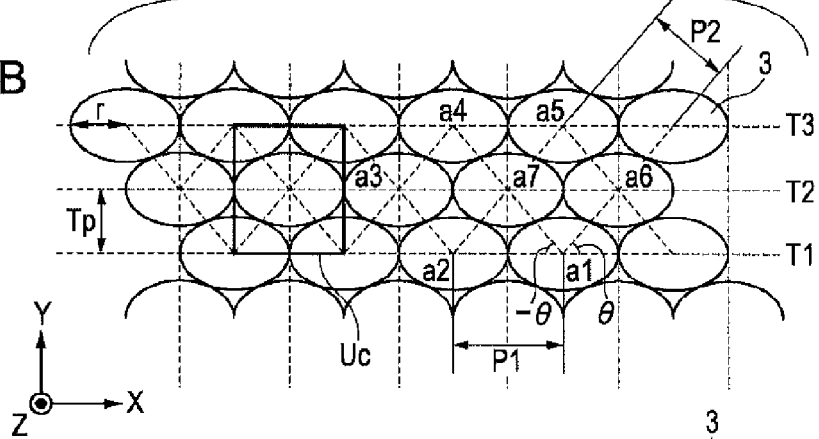
FIG. 1B is an enlarged plan view showing a part of the optical device shown in FIG. 1A.
Figure 1C:
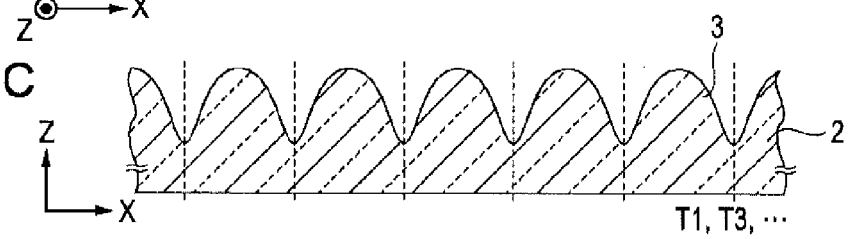
FIG. 1C is a cross-sectional view taken along tracks T1, T3, . . . shown in FIG. 1B.
Figure 1D:
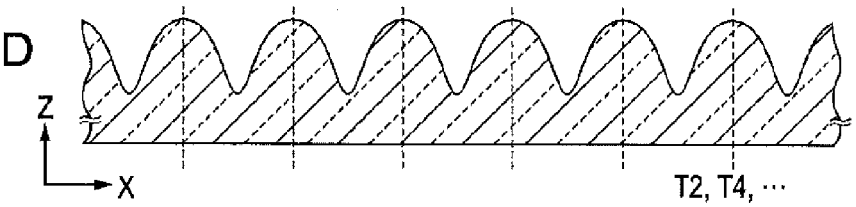
FIG. 1D is a cross-sectional view taken along tracks T2, T4, . . . shown in FIG. 1B.
Figure 1E:
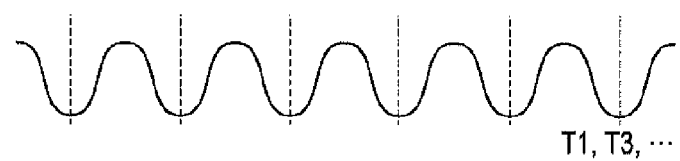
FIG. 1E is an outlined line drawing representing a modulated waveform of a laser beam that is used for forming a latent image corresponding to tracks T1, T3, . . . shown in FIG. 1B.
Figure 1F:
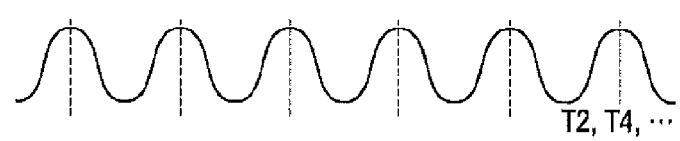
FIG. 1F is an outlined line drawing representing a modulated waveform of a laser beam that is used for forming a latent image corresponding to tracks T2, T4, . . . shown in FIG. 1B.

FIG. 1A is a schematic plan view showing an example of the configuration of an optical device according to a first embodiment. FIG. 1B is an enlarged plan view showing a part of the optical device shown in FIG. 1A. FIG. 1C is a cross-sectional view taken along tracks T1, T3, . . . shown in FIG. 1B. FIG. 1D is a cross-sectional view taken along tracks T2, T4, . . . shown in FIG. 1B. FIG. 1E is an outlined line drawing representing a modulated waveform of a laser beam that is used for forming a latent image corresponding to tracks T1, T3, . . . shown in FIG. 1B. FIG. 1F is an outlined line drawing representing a modulated waveform of a laser beam that is used for forming a latent image corresponding to tracks T2, T4, . . . shown in FIG. 1B. FIGS. 2 and 4 to 6 are enlarged perspective views of a part of the optical device 1 shown in FIG. 1A. FIG. 3A is a cross-sectional view of the optical device shown in FIG. 1A in the direction (the X direction (hereinafter, also appropriately referred to as the track direction)) of extension of the tracks. FIG. 3B is a cross-sectional view of the optical device shown in FIG. 1A in the direction of θ.

The optical device 1, for example, is an optical sheet (sub wavelength structure) that has an antireflection effect according to the incident angle of incident light. This optical device 1 can be very appropriately applied to various optical devices such as an optical device (for example, an optical device such as a camera) having various wavelength bands, a display, optical electronics, and a telescope.

The optical device 1 includes a base 2 that has a principal surface and a plurality of structural bodies 3 that are convex portions arranged on the principal surface with a fine pitch equal to or less than the wavelength of light of which the reflection is to be reduced. This optical device 1 has a function of preventing reflection of light that is transmitted through the base 2 in the Z direction shown in FIG. 2 on the interface between the structural body 3 and the air on the periphery thereof.

Hereinafter, the base 2 and the structural bodies 3 that are included in the optical device 1 will be sequentially described.

Base

The base 2, for example, is a transparent base that has transparency. As the material of the base 2, for example, there is a material that contains a transparent synthetic resin such as polycarbonate (PC) or polyethylene terephthalate (PET), glass, and the like as its major components. However, the material of the base 2 is not limited thereto. As the shape of the base 2, for example, there is a sheet shape, a plate shape, a block shape, or the like. However, the shape of the base 2 is not particularly limited thereto. Here, a sheet is defined as including a film. It is preferable that the shape of the base 2 is appropriately selected in accordance with the shape of a portion, which demands a predetermined antireflection function, of an optical device such as a camera or the like.

Structural Body

On the surface of the base 2, a plurality of the structural bodies 3 that are convex portions are arranged. These structural bodies 3 are periodically arranged in two dimensions with a small arrangement pitch that is equal to or smaller than the wavelength band of light of which the reflection is to be reduced, that is, for example, an arrangement pitch of the same degree as the wavelength of visible light. Here, the arrangement pitch means an arrangement pitch P1 and an arrangement pitch P2. The wavelength band of light of which the reflection is to be reduced, for example, is a wavelength band of ultraviolet light, a wavelength band of visible light, or a wavelength band of infrared light. Here, the wavelength band of ultraviolet light represents a wavelength band of 10 nm to 360 nm, the wavelength band of visible light represents a wavelength band of 360 nm to 830 nm, and the wavelength band of infrared light represents a wavelength band of 830 nm to 1 mm. In particular, the arrangement pitch is preferably equal to or larger than 175 nm and equal to or smaller than 350 nm. When the arrangement pitch is smaller than 175 nm, it tends to be difficult to manufacture the structural body 3. On the other hand, when the arrangement pitch exceeds 350 nm, diffraction of visible light tends to occur.

The structural bodies 3 of the optical device 1 have an arrangement form so as to form a plurality of rows of tracks T1, T2, T3, . . . (hereinafter, collectively referred to as "tracks T") on the surface of the base 2. In an embodiment, a track represents a portion in which the structural bodies 3 are linearly connected so as to form a row. In addition, the row direction represents a direction that is orthogonal to the direction (X direction) of extension of a track on the molding surface of the base 2.

The structural bodies 3 are arranged in positions deviated by a half pitch between two adjacent tracks T. In particular, between two adjacent tracks T, for example, in intermediate positions (positions deviated by a half pitch) of the structural bodies 3 arranged in one track (for example, T1), the structural bodies 3 of the other track (for example T2) are arranged. As a result, as shown in FIG. 1B, the structural bodies 3 are arranged so as to form a hexagonal lattice pattern or a quasi-hexagonal lattice pattern having the centers of the structural bodies 3 located at points of a1 to a7 between three adjacent tracks (T1 to T3). In this first embodiment, the hexagonal lattice represents a lattice pattern having a regular hexagon shape. In addition, the quasi-hexagon lattice pattern, differently from the lattice pattern of the regular hexagon shape, represents a distorted hexagonal lattice pattern drawn out in the direction (the X-axis direction) of extension of the track.

In a case where the structural bodies 3 are arranged so as to form a quasi-hexagonal lattice pattern, as shown in FIG. 1B, it is preferable that the arrangement pitch P1 (a distance between a1 and a2) of the structural bodies 3 within the same track (for example, T1) is longer than the arrangement pitch of the structural bodies 3 between two adjacent tracks (for example, T1 and T2), that is, the arrangement pitch P2 (for example, a distance between a1 to a7 or a2 to a7) of the structural bodies 3 in the direction of ±θ with respect to the direction of extension of the tracks.

By arranging the structural bodies 3 as described above, the packing density of the structural bodies 3 can be improved further.

From the viewpoint of easiness in molding, it is preferable that the structural body 3 has a cone shape or a shape acquired by stretching or contracting a cone shape in the track direction. It is preferable that the structural body 3 has an axis-symmetrical cone shape or a shape acquired by stretching or contracting a cone shape in the track direction. In a case where a structural body 3 is bonded to an adjacent structural body 3, it is preferable that the structural body 3 has an axis-symmetrical cone shape or a shape that is acquired by stretching or contracting a cone in the track direction except for the lower portion thereof connected to the adjacent structural body 3. As the cone shape, for example, there is a circular cone shape, a circular truncated cone shape, an elliptic cone shape, an elliptic truncated cone shape, or the like. Here, the cone shape, as described above, is a concept including an elliptic cone shape and an elliptic truncated cone shape in addition to a circular cone shape and a circular truncated cone shape. The circular truncated cone shape represents a shape that is acquired by cutting off the apex portion of a circular cone shape, and the elliptic truncated cone shape represents a shape that is acquired by cutting off the apex portion of an elliptic cone shape.

Figure 2:
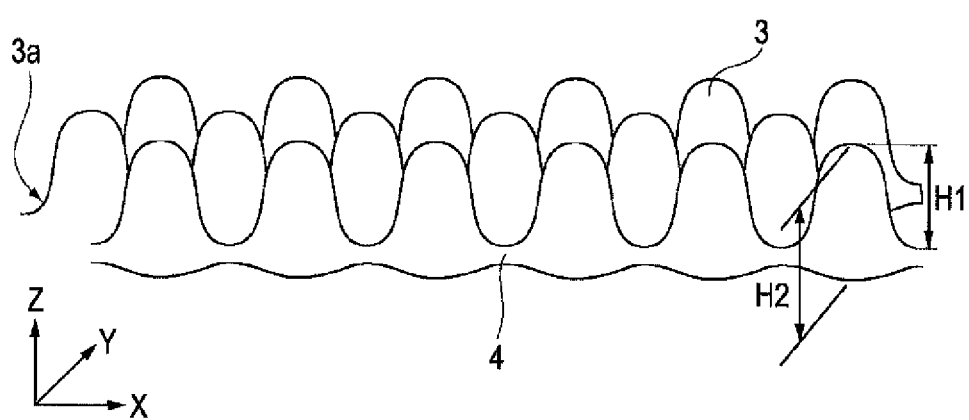
FIG. 2 is an enlarged perspective view of a part of the optical device shown in FIG. 1A.
Figure 3A:
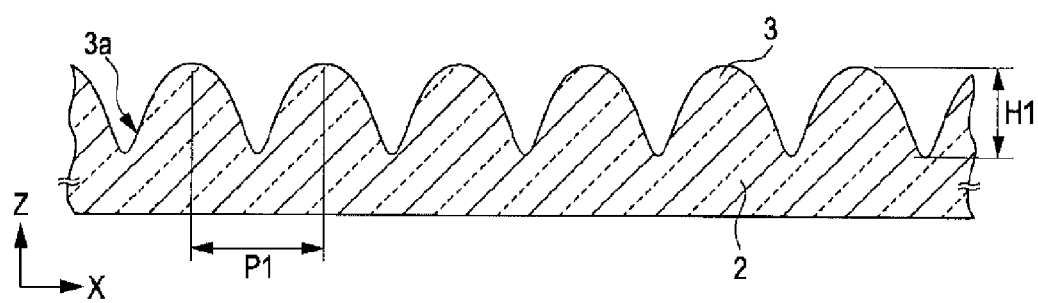
FIG. 3A is a cross-sectional view of the optical device shown in FIG. 1A in the extending direction of the tracks.
Figure 3B:
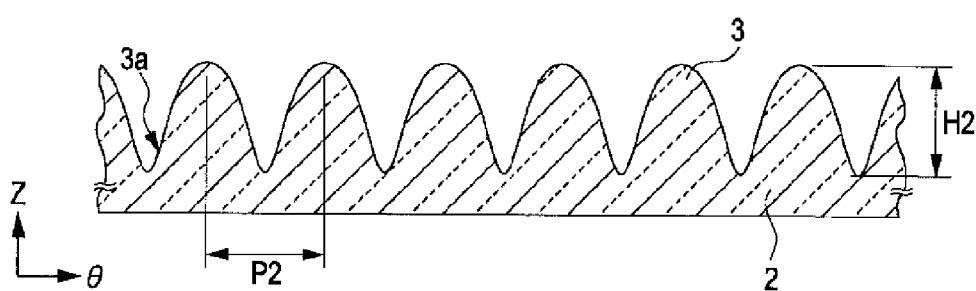
FIG. 3B is a cross-sectional view of the optical device shown in FIG. 1A in the direction of θ.
Figure 4:
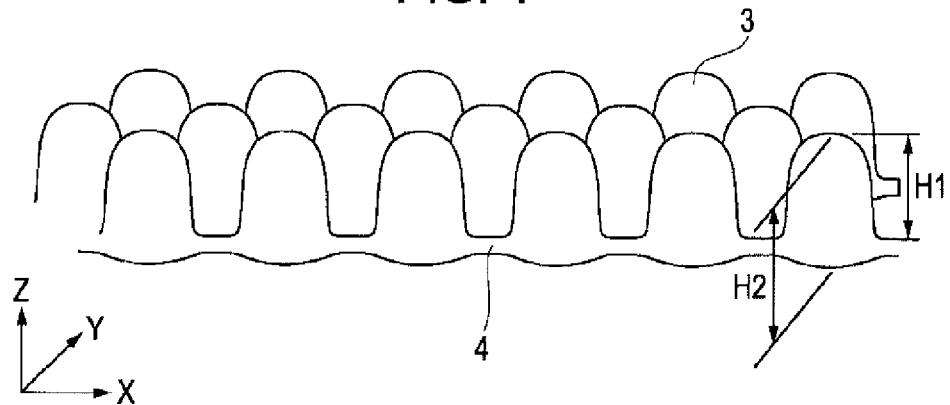
FIG. 4 is an enlarged perspective view of a part of the optical device shown in FIG. 1A.
Figure 5:
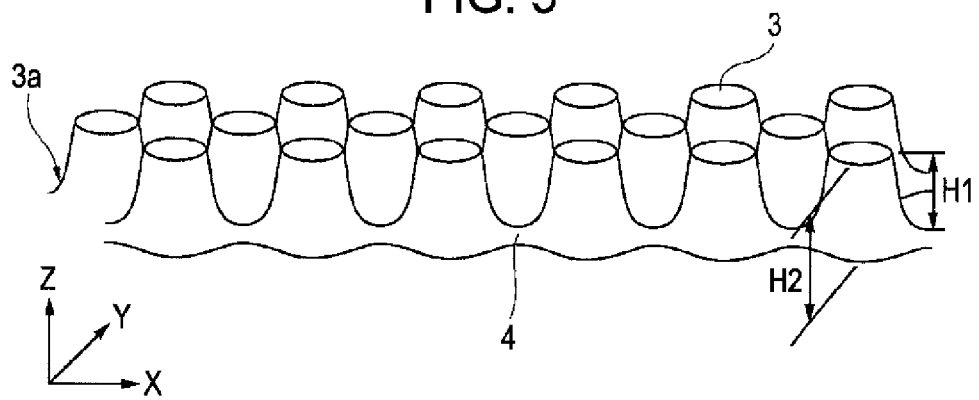
FIG. 5 is an enlarged perspective view of a part of the optical device shown in FIG. 1A.

As shown in FIGS. 2 and 4, it is preferable that the structural body 3 has a cone structure in which the bottom surface thereof has an ellipse shape, an oval shape, or an egg type having a major axis and a minor axis and has an elliptic cone shape of which the apex portion is a curved face. Alternatively, as shown in FIG. 5, the structural body 3 preferably has a cone structure in which the bottom surface thereof has an ellipse shape, an oval shape, or an egg type having a major axis and a minor axis and has an elliptic truncated cone shape of which the apex portion is flat. In such a case, the packing ratio for the row direction can be improved.

From the viewpoint of improvement of the reflection characteristic, it is preferable that the structural body 3 has a cone shape (see FIG. 4) that has the apex portion having a gentle slope and has the slope that becomes steeper toward the bottom portion from the center portion. In addition, from the viewpoint of improvement of the reflection characteristic and the transmission characteristic, it is preferable that the structural body 3 has a cone shape (see FIG. 2) in which the slope of the center portion is steeper than those of the bottom portion and the apex portion or a cone shape (see FIG. 5) of which the apex portion is flat. In a case where the structural body 3 has an elliptic cone shape or an elliptic truncated cone shape, it is preferable that the direction of the major axis of the bottom surface is parallel to the direction of extension of the track. In FIG. 2 and the like, the structural bodies 3 have the same shape. However, the shapes of the structural bodies 3 are not limited thereto. Thus, the structural bodies 3 having two types of shapes or more may be formed on the surface of the base. In addition, the structural bodies 3 may be integrally formed with the base 2.

Figure 6:
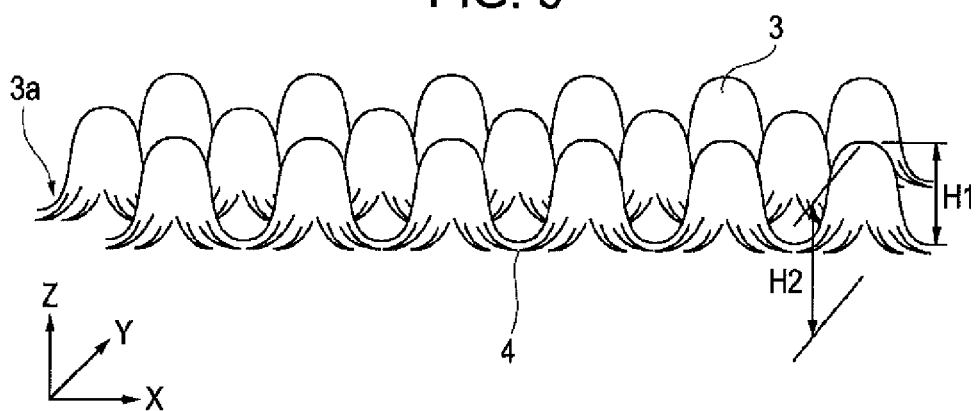
FIG. 6 is an enlarged perspective view of a part of the optical device shown in FIG. 1A.

In addition, as shown in FIGS. 2 and 4 to 6, it is preferable that a protrusion portion 5 is disposed in a part or the entirety of the periphery of the structural body 3. In such a case, even in a case where the packing ratio of the structural bodies 3 is low, the reflectivity can be suppressed to be low. In particular, for example, the protrusion portion 5, as shown in FIGS. 2, 4, and 5, is disposed between adjacent structural bodies 3. A long and thin protrusion portion 5, as shown in FIG. 6, may be disposed in the entirety or a part of the periphery of the structural body 3. The long and thin protrusion portion 5, for example, extends from the apex portion of the structural body 3 toward the lower portion thereof. The shape of the protrusion portion 5 may have a cross section of a triangle or a rectangle. However, the shape of the protrusion portion 5 is not limited thereto. Thus, the shape of the protrusion portion 5 may be selected in consideration of easiness in molding the protrusion portion 5. In addition, the surface of a part or the entirety of the periphery of the structural body 3 may be roughly formed so as to form fine unevenness. In particular, for example, the surface located between adjacent structural bodies 3 may be roughly formed so as to form fine unevenness. In addition, on the surface of the structural body 3, for example, in the apex portion thereof, a fine hole may be formed.

The shape of the structural body 3 is not limited to the convex shape shown in the figure. Thus, the structural body 3 may be configured by a concave portion formed on the surface of the base 2. The height of the structural body 3 is not particularly limited. For example, the height of the structural body 3 is about 420 nm, and more particularly, 415 nm to 421 nm. In a case where the structural body 3 is configured as a concave portion, the height of the structural body 3 becomes the depth of the structural body 3.

It is preferable that the height H1 of the structural body 3 in the extending direction of the track is smaller than the height H2 of the structural body 3 in the row direction. In other words, it is preferable that the heights H1 and H2 of the structural body 3 satisfy the relationship of "H1<H2". The reason is as follows. When the structural body 3 is arranged so as to satisfy the relationship of "H1≧H2", the arrangement pitch P1 for the extending direction of the track is lengthened. Accordingly, the packing ratio of the structural body 3 for the extending direction of the track is decreased. When the packing ratio is decreased as described above, the reflection characteristic deteriorates.

In addition, the aspect ratios of the structural bodies 3 are not limited to a case where all the aspect ratios are the same. Thus, the structural bodies 3 may be configured to have a predetermined height distribution (for example, an aspect ratio range of about 0.83 to 1.46). By disposing the structural bodies 3 having a height distribution, the dependency of the reflection characteristic on the wavelength can be decreased. Accordingly, an optical device 1 having a superior antireflection characteristic can be realized.

Here, the height distribution means that the structural bodies 3 having two types of heights (depths) or more are disposed on the surface of the base 2. In other words, the height distribution means that a structural body 3 having a reference height and a structural body 3 having a height different from the reference height of the structural body 3 are disposed on the surface of the base 2. The structural bodies 3 having the height different from the reference height, for example, are disposed on the surface of the base 2 periodically or non-periodically (randomly). The direction of the periodicity, for example, may be the extending direction of the track, the row direction, or the like.

It is preferable that a hem portion 3a is disposed on the outer edge portion of the structural body 3. The reason is that, in such a case, an optical device can be easily detached from a die or the like in the manufacturing process of the optical device. Here, the hem portion 3a represents a protrusion portion that is disposed on the outer edge portion of the bottom portion of the structural body 3. From the viewpoint of the detachment characteristic described above, it is preferable that the hem portion 3a has a curved face of which the height gently decreases from the apex portion of the structural body 3 toward the side of the lower portion thereof. In addition, the hem portion 3a may be disposed in a part of the outer edge portion of the structural body 3. However, it is preferable that the hem portion 3a is disposed in the entirety of the outer edge portion of the structural body 3, from the viewpoint of improvement of the above-described detachment characteristic. In a case where the structural body 3 is a concave portion, the hem portion becomes a curved face that is disposed on the outer edge of the opening of the concave portion of the structural body 3.

The height (depth) of the structural body 3 is not particularly limited. Thus, the height (depth) of the structural body 3 is appropriately set in accordance with the wavelength region of light to be transmitted and, for example, is set in the range of about 236 nm to 450 nm. It is preferable that the aspect ratio (height/arrangement pitch) of the structural body 3 is set in the range of 0.81 to 1.46. It is more preferable that the above-described aspect ratio is in the range of 0.94 to 1.28. The reason is as follows. When the aspect ratio is less than 0.81, the reflection characteristic and the transmission characteristic tend to deteriorate. On the other hand, when the aspect ratio exceeds 1.46, the detachment characteristic in manufacturing of the optical device deteriorates, so that replication of a replica tends not to be performed in a clean manner.

In addition, from the viewpoint of improvement of the reflection characteristic, the aspect ratio of the structural body 3 is preferably set in the range of 0.94 to 1.46. Furthermore, from the viewpoint of improvement of the transmission characteristic, the aspect ratio of the structural body 3 is preferably set in the range of 0.81 to 1.28.

In an embodiment, the aspect ratio is defined by the following Equation (1).

$$\text{Aspect Ratio} = H/P \qquad \text{Equation (1)}$$

Here, H is the height of the structural body, and P is an average arrangement pitch (average period). Here, the average arrangement pitch P is defined by the following Equation (2).

$$\text{Average Arrangement pitch } P = (P1+P2+P2)/3 \qquad \text{Equation (2)}$$

Here, P1 is the arrangement pitch (the period for the extending direction of the track) for the extending direction of the track, and P2 is the arrangement pitch (the period for the θ direction) in the direction of ±θ (here, θ=60°−δ, and preferably 0°<δ≤11°, and more preferably 3°≤δ≤6°) with respect to the extending direction of the track.

In addition, the height H of the structural body 3 is assumed to be the height of the structural body 3 for the row direction. The height of the structural body 3 for the extending direction (X direction) of the track is smaller than the height for the row direction (Y direction), and the height of the structural body 3 for a direction other than the extending direction of the track is almost the same as the height thereof for the row direction. Thus, the height of the subwavelength structural body is represented by the height for the row direction. However, when the structural body 3 is a concave portion, the height H of the structural body in the above-described Equation (1) is the depth H of the structural body.

When the arrangement pitch of the structural bodies 3 within the same track is P1, and the arrangement pitch of the structural bodies 3 between two adjacent tracks is P2, it is preferable that a ratio P1/P2 satisfies the relationship of 1.00≤P1/P2≤1.1 or 1.00<P1/P≤1.1. By allowing the ratio to be in such a range, the packing ratio of the structural bodies 3 having an elliptic cone shape or an elliptic truncated cone shape can be improved, and accordingly, the antireflection characteristic can be improved.

The packing ratio of the structural bodies 3 on the surface of the base is equal to or higher than 65%, is preferably equal to or higher than 73%, and is more preferably equal to or higher than 86%, with 100% as the upper limit thereof. By allowing the packing ratio to be in such a range, the antireflection characteristic can be improved. In order to improve the packing ratio, it is preferable that the lower portions of the adjacent structural bodies 3 are bonded together or the structural bodies 3 are distorted by adjusting the ellipticity of the bottom surface of the structural bodies or the like.

Here, the packing ratio (average packing ratio) of the structural bodies 3 is a value acquired as described below.

First, the surface of the optical device 1 is photographed by a scanning electron microscope (SEM) in the top view. Next, a unit lattice Uc is randomly selected from a photographed SEM picture, and the arrangement pitch P1 and the track pitch Tp of the unit lattice Uc are measured (see FIG. 1B). In addition, the area S of the bottom surface of the structural boy 3 that is positioned in the center of the unit lattice Uc is measured by image processing. Next, the packing ratio is calculated by using the following Equation (3) using the arrangement pitch P1, the track pitch Tp, and the area S of the bottom surface which have been measured.

$$\text{Packing Ratio} = (S(\text{hex.})/S(\text{unit})) \times 100 \qquad \text{Equation (3)}$$

Here, the unit lattice area S(unit)=P1×2Tp, and the area of the bottom surfaces of the structural bodies that exist within the unit lattice S(hex.)=2S.

The above-described process of calculation of the packing ratio is performed for ten unit lattices that are randomly selected from the photographed SEM picture. Then, the average of the packing ratios is calculated by simply averaging (arithmetic averaging) the measured values, and this average is assumed to be the packing ratio of the structural bodies 3 on the surface of the base.

When the structural bodies 3 are overlapped with each other or when there is a sub-structural body such as the protrusion portion 5 between the structural bodies 3, the packing ratio can be acquired by using a method of determining an area ratio with a portion corresponding to 5% of the height of the structural body 3 used as a threshold value.

Figure 7:
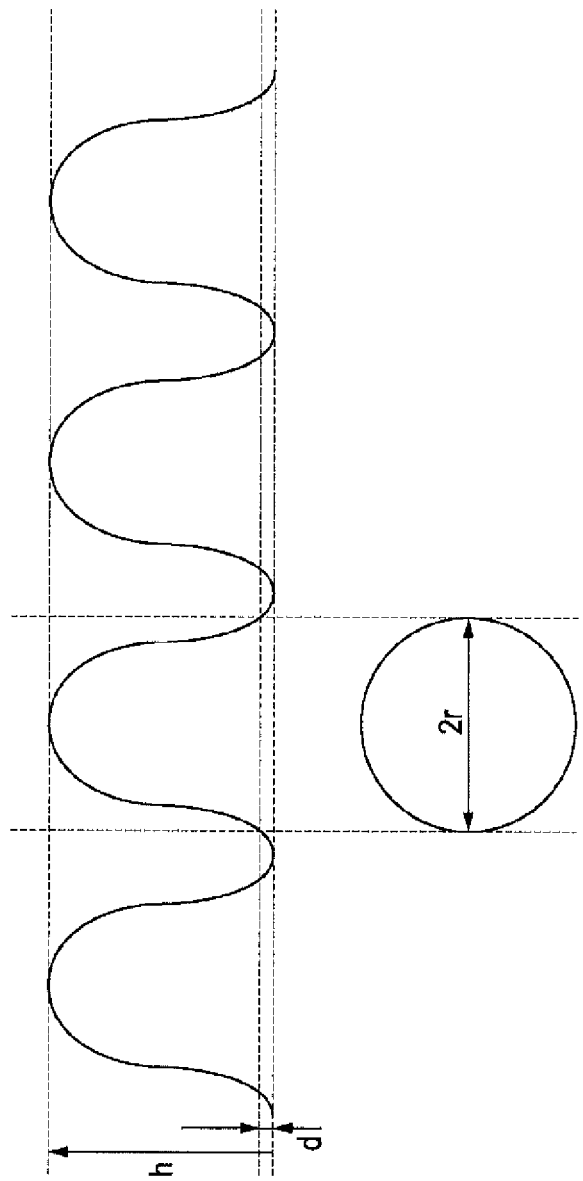
FIG. 7 is a diagram illustrating a method of setting the bottom surface of the structural bodies in a case where the boundary of the structural bodies is not clear.
Figure 8A:
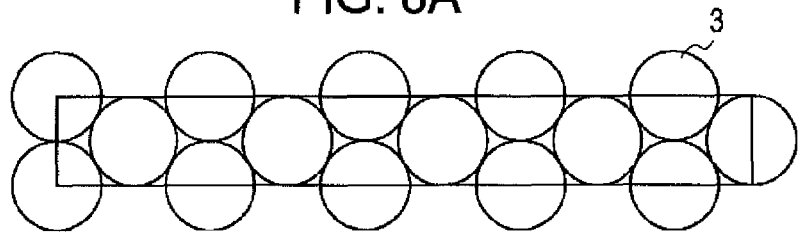
FIGS. 8A to 8D are diagrams each representing the shape of the bottom surface when the ellipticity of the bottom surface of the structural body is changed.
Figure 8B:
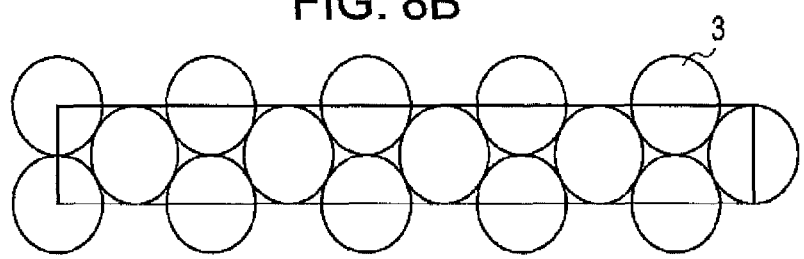
Figure 8C:
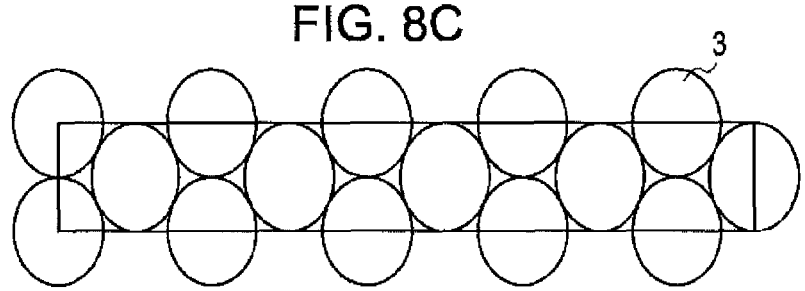
Figure 8D:
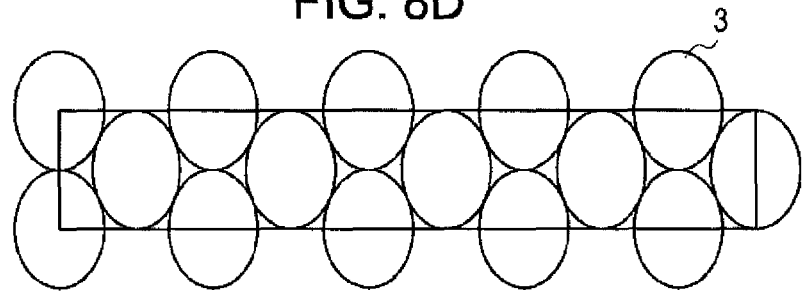

FIG. 7 is a diagram illustrating a method of calculating the packing ratio in a case where the boundary of the structural bodies 3 is not clear. When the boundary of the structural bodies 3 is not clear, through SEM observation of the cross section, as shown in FIG. 7, the packing ratio is calculated by using the portion corresponding to 5% (=(d/h)×100) of the height h of the structural body 3 as a threshold value and converting the diameter of the structural body 3 by using the height h. When the bottom surface of the structural body 3 has an elliptic shape, the same process is performed by using the major axis and the minor axis of the ellipse.

FIGS. 8A to 8D are diagrams each representing the shape of the bottom surface when the ellipticity of the bottom surface of the structural body 3 is changed. The ellipticity of each ellipse shown in FIGS. 8A to 8D is 100%, 110%, 120%, and 141%. By changing the ellipticity as described above, the packing ratio of the structural bodies 3 on the surface of the base can be changed. In a case where the structural bodies 3 form a quasi-hexagonal lattice pattern, it is preferable that the ellipticity e of the bottom surface of the structural body satisfies the relationship of "100%<e<150%". By allowing the ellipticity to be in such a range, the packing ratio of the structural bodies 3 is improved. Accordingly, a superior antireflection characteristic can be acquired.

Here, when the diameter a of the bottom surface of the structural body in the track direction (X direction) is a, and the diameter thereof in the row direction (Y direction) orthogonal thereto is b, the ellipticity e is defined as (a/b)×100. Here, the diameters a and b of the structural body 3 are values that are calculated as below. The surface of the optical device 1 is photographed by using a scanning electron microscope (SEM) in the top view, and ten structural bodies 3 are randomly extracted from a photographed SEM picture. Next, the diameters a and b of the bottom surface of each of the extracted structural bodies 3 are measured. Then, average values of the diameters a and b are calculated by simply averaging (arithmetic averaging) the respective measured values a and b, and the average values are set as the diameters a and b of the structural body 3.

Figure 9A:
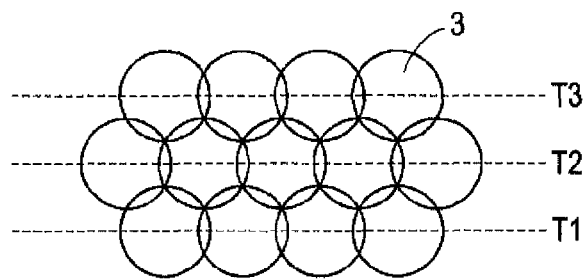
FIG. 9A represents an example of arrangement of the structural bodies having a circular cone shape or a circular truncated cone shape.
Figure 9B:
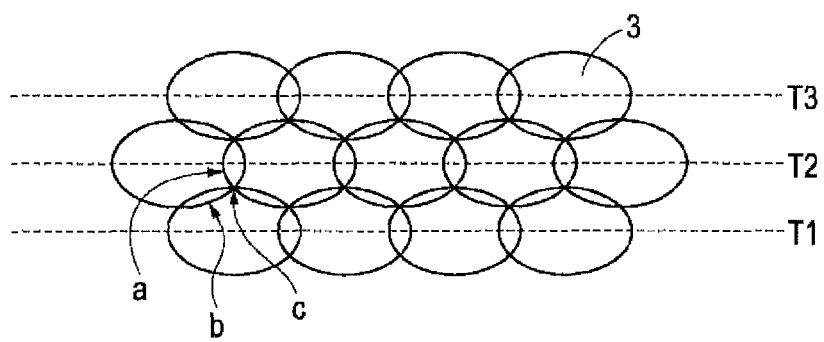
FIG. 9B represents an example of arrangement of structural bodies having an elliptic cone shape or an elliptic truncated cone shape.

FIG. 9A represents an example of an arrangement of the structural bodies 3 having a circular cone shape or a circular truncated cone shape. FIG. 9B represents an example of an arrangement of structural bodies 3 having an elliptic cone shape or an elliptic truncated cone shape. As shown in FIG. 9A and FIG. 9B, it is preferable that the lower portions of the structural bodies 3 are bonded together so as to be overlapped with each other. In particular, it is preferable, the lower portion of a structural body 3 is bonded to a part or the entirety of the lower portion of a structural body 3 located adjacently thereto. In particular, it is preferable that the lower portions of the structural bodies 3 are bonded together in the track direction, in the direction of θ, or in the above-described both directions. In particular, it is preferable that the lower portions of the structural bodies 3 are bonded together in the track direction, in the direction of θ, or in the above-described both directions. In FIG. 9A and FIG. 9B, an example in which the lower portions of all the structural bodies 3 that are adjacently located to each other are bonded together is shown. By bonding the structural bodies 3 as described above, the packing ratio of the structural bodies 3 can be improved. In addition, it is preferable that the structural bodies are bonded together in a portion that is equal to or less than ¼ of the maximum value of the wavelength band of light under the use environment of the light path length that is in consideration of the refraction index. Accordingly, a superior reflection characteristic can be acquired.

As shown in FIG. 9B, in a case where the lower portions of the structural bodies 3 having an elliptic cone shape or an elliptic cone truncated shape are bonded together, the height of the bonded portion becomes smaller, for example, in the order of bonded portions a, b, and c.

The ratio ((2r/P1)×100) of the diameter 2r to the arrangement pitch P1 is equal to or larger than 85%. It is preferable that above-described arrangement pitch is equal to or larger than 90%, and it is more preferable that the above-described pitch is equal to or larger than 95%. The reason for this is that the packing ratio of the structural bodies 3 is improved so as to improve the antireflection characteristic by allowing the above-described ratio to be in such a range. When the ratio ((2r/P1)×100) increases, and the overlapping of the structural bodies 3 becomes too large, the antireflection characteristic tends to deteriorate. Accordingly, it is preferable that the upper limit value of the above-described ratio ((2r/P1)×100) is set such that the structural bodies are bonded together in a portion equal to or less than ¼ of the maximum value of the wavelength band of light under the use environment of the light path length that is in consideration of the refraction index. Here, the arrangement pitch P1 is the arrangement pitch in the track direction of the structural bodies 3, and the diameter 2r is the diameter of the bottom surface of the structural body in the track direction. In a case where the bottom surface of the structural body has a circular shape, the diameter 2r becomes the diameter. On the other hand, in a case where the bottom surface of the structural body has an elliptic shape, the diameter 2r becomes the major diameter.

Configuration of Roll Master

Figure 10A:
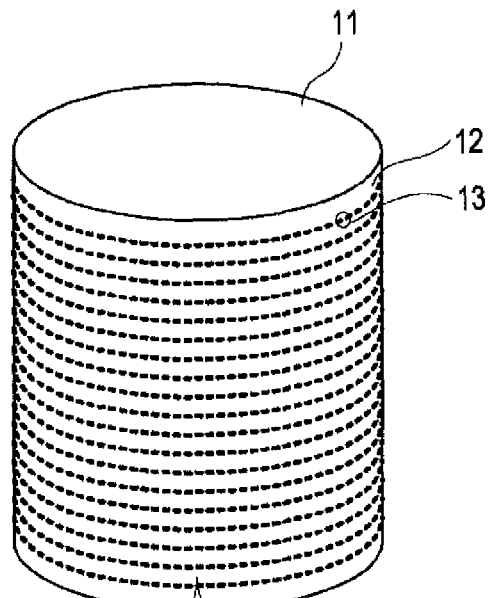
FIG. 10A is a perspective view showing an example of the configuration of a roll master that is used for manufacturing an optical device.
Figure 10B:
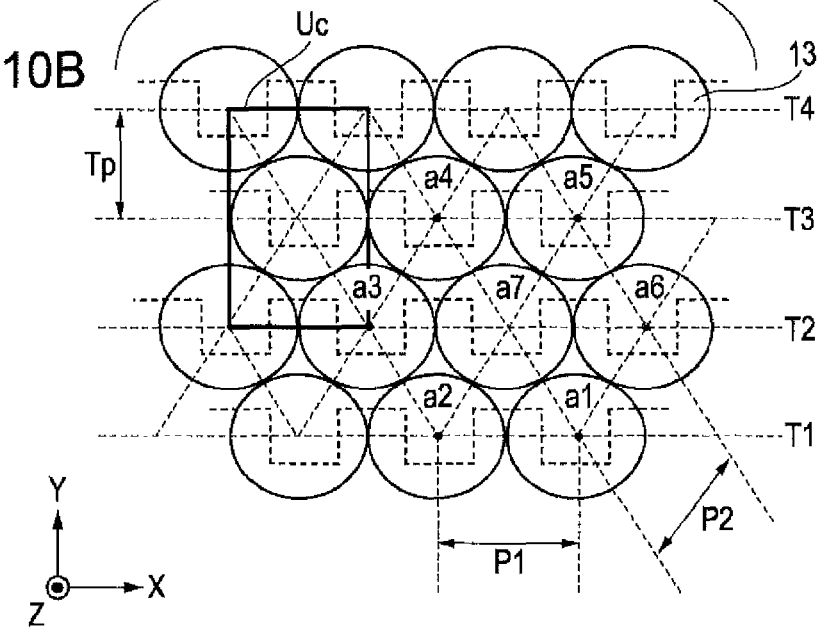
FIG. 10B is a plan view showing an example of the configuration of a roll master that is used for producing an optical device.

FIGS. 10A and 10B show an example of the configuration of a roll master that is used for manufacturing an optical device having the above-described configuration. As shown in FIGS. 10A and 10B, the roll master 11, for example, has a configuration in which a plurality of structural bodies 13 as concave portions are arranged with a pitch that is almost the same as the wavelength of light such as visible light on the surface of a master 12. The master 12 has the shape of a solid cylinder or a hollow cylinder. As the material of the master 12, for example, glass can be used. However, the material of the master 12 is not limited thereto. Two-dimensional patterns are spatially linked to each other by using a roll master exposure device to be described later and are patterned with an appropriate transmission pitch at a CAV by generating a polarity inversion formatter signal and a signal for synchronizing a rotation controller of a recording device for each single track. Accordingly, a hexagonal lattice pattern or a quasi-hexagonal lattice pattern can be recorded. By appropriately setting the frequency of the polarity inversion formatter signal and the number of revolutions of the roll, a lattice pattern having a uniform spatial frequency is formed in a desired recording area.

Method of Manufacturing Optical Device

Next, a method of manufacturing an optical device 1 configured as described above will be described with reference to FIGS. 11, 12A to 12C, and 13A to 13C.

The method of manufacturing the optical device according to the first embodiment includes a resist film forming process in which a resist layer is formed on a master, an exposure process in which a latent image having a mosaic pattern is formed on the resist film by using a roll master exposure device, and a developing process in which a resist layer, in which the latent image is formed, is developed. In addition, the above-described method of manufacturing the optical device includes an etching process in which a roll master is produced by using plasma etching and a replication process in which a replication substrate is manufactured by using an ultraviolet curing resin.

Configuration of Exposure Device

Figure 11:
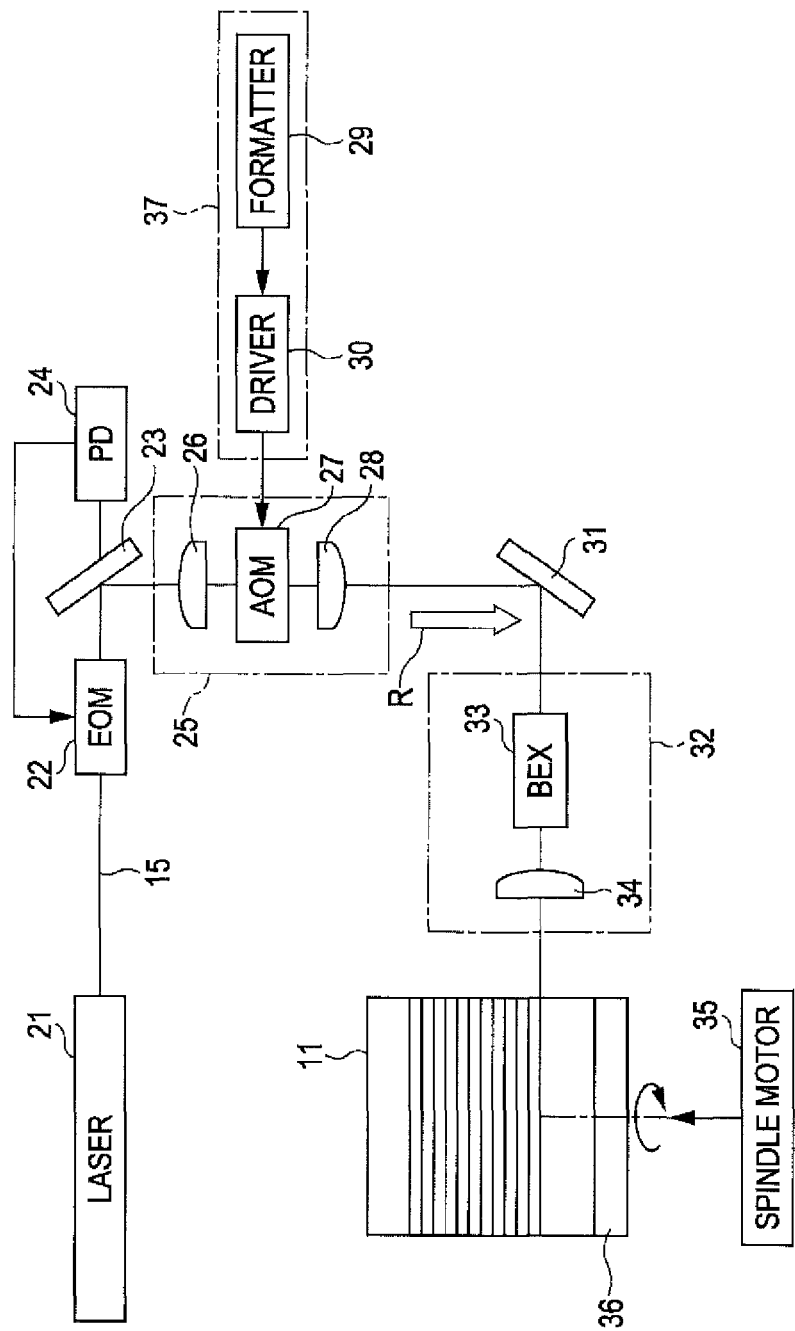
FIG. 11 is a schematic diagram showing an example of the configuration of a roll master exposure device.

First, the configuration of the roll master exposure device that is used in the exposure process of the mosaic pattern will be described with reference to FIG. 11. This roll master exposure device is configured by using an optical disc recording device as its base.

A laser light source 21 is a light source that is used for exposure of a resist that is formed as a film on the surface of the master 12 as a recording medium. For example, the laser light source 21 oscillates laser beams 15 of a wavelength λ=266 nm for recording. The laser beams 15 emitted from the laser light source 21 travels straight with the beans being maintained to be parallel to each other and is incident to an electro optical modulator (EOM) 22. The laser beams 15 transmitted through the electro optical modulator 22 are reflected by a mirror 23 and are guided to a modulation optical system 25.

The mirror 23 is configured by a polarized beam divider and has a function of reflecting one polarization component and transmitting the other polarization component. The polarization component transmitted through the mirror 23 is received by a photo diode 24. Then, the phase modulation of the laser beams 15 is performed by controlling the electro optical modulator 22 based on the received signal.

In the modulation optical system 25, the laser beams 15 are collected in an acousto-optic modulator (AOM) 27 that is formed from glass ($SiO_2$) or the like by a collecting lens 26. After the laser beams 15 are modulated in intensity by the acousto-optic modulator 27 and diverge, the laser beams 15 are converted into parallel beams by a lens 28. The laser beams 15 output from the modulation optical system 25 are reflected by a mirror 31 and are guided to be horizontal and parallel on a movement optical table 32.

The movement optical table 32 includes a beam expander 33 and an objective lens 34. After the laser beams 15 guided to the movement optical table 32 are shaped in a desired beam shape by the beam expander 33, the laser beams 15 are irradiated to the resist layer positioned on the master 12 through the objective lens 34. The master 12 is placed on a turntable 36 that is connected to a spindle motor 35. Then, simultaneously with rotating the master 12, the laser beams 15 are intermittently irradiated to the resist layer while moving the laser beams 15 in the height direction of the master 12, and thereby an exposure process of the resist layer is performed. The formed latent image has an approximately elliptic shape having the major axis in the circumferential direction. The movement of the laser beams 15 is performed by moving the movement optical table 32 in the direction denoted by arrow R.

The exposure device includes a control mechanism 37 that is used for forming a latent image corresponding to the two-dimensional pattern of the hexagonal lattice or the quasi-hexagonal lattice shown in FIG. 1B on the resist layer. The control mechanism 37 includes a formatter 29 and a driver 30. The formatter 29 includes a polarity inverting unit. The polarity inverting unit controls the irradiation timings of the laser beams 15 for the resist layer. The driver 30 receives the output of the polarity inverting unit and controls the acousto-optic modulator 27.

In this roll master exposure device, a polarity inverting formatter signal and a signal for synchronizing the rotation controller of the recording device are generated for each single track so as to spatially link the two dimensional pattern, and intensity modulation is performed for the signals by the acousto-optic modulator 27. By patterning with the number of revolutions appropriate for constant angular velocity (CAV), an appropriate modulation frequency, and an appropriate transmission pitch, the hexagonal lattice or the quasi-hexagonal lattice pattern can be recorded. For example, as shown in FIG. 10B, in order to set the period in the circumferential direction to 315 nm and set the period in the direction of about 60 degrees (about 60-degree direction) with respect to the circumferential direction to 300 nm, the transmission pitch may be set to 251 nm (Pythagorean theorem). The frequency of the polarity inverting formatter signal is changed in accordance with the number of revolutions of the roll (1800 rpm, 900 rpm, or 450 rpm) (see Table 1). A quasi-hexagonal lattice pattern having a uniform spatial frequency (a circumferential period of 315 nm and a period of 300 nm in the direction (direction of about −60 degrees) of about 60 degrees with respect to the circumferential direction) on a desired recording area can be acquired by enlarging far-ultraviolet laser beams to have a beam diameter enlarged by five-times by the beam expander (BEX) 33 positioned on the movement optical table 32 and irradiating the beams onto the resist layer positioned on the master 12 through the objective lens 34 having a numerical aperture (NA) of 0.9 so as to form a delicate latent image.

TABLE 1

| Number of Revolutions [rpm] | 1800 | 900 | 450 | 225 |
|---|---|---|---|---|
| Moth eye [MHz] | 37.70 | 18.85 | 9.43 | 4.71 |

Resist Film Forming Process

Figure 12A:
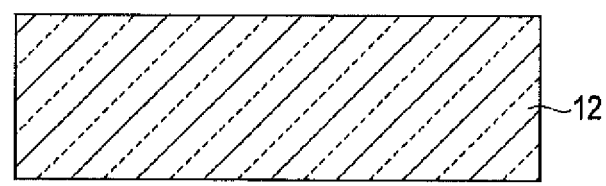
FIGS. 12A to 12C are process flow diagrams illustrating a method of manufacturing an optical device according to the first embodiment.
Figure 12B:
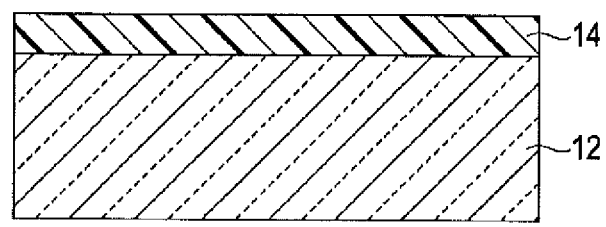

First, as shown in FIG. 12A, a solid cylinder-shaped master 12 is prepared. For example, this master 12 is a glass master. Next, as shown in FIG. 12B, a resist layer 14 is formed on the surface of the master 12. As the material of the resist layer 14, for example, any one of an organic resist and an inorganic resist may be used. As the organic resist, for example, a novolac-type resist or a chemical amplification-type resist can be used. In addition, as the inorganic resist, metal oxide that is formed from one type or two types or more of transition metal such as tungsten or molybdenum can be used.

Exposure Process

Figure 12C:
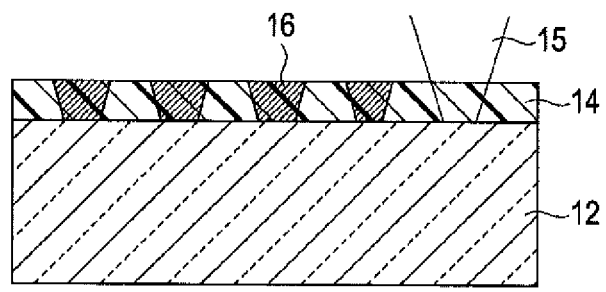

Next, as shown in FIG. 12C, simultaneously with rotating the master 12, the laser beams (exposure beams) 15 are irradiated to the resist layer 14 by using the above-described roll master exposure device. At this time, by intermittently irradiating the laser beams 15 while moving the laser beams 15 in the height direction (the direction parallel to the center axis of the solid cylinder-shaped or hollow cylinder-shaped master 12) of the master 12, the entire surface of the resist layer 14 is exposed. Accordingly, a latent image 16 corresponding to the trajectory of the laser beams 15 is formed on the entire surface of the resist layer 14 with a pitch that is almost the same as the wavelength of visible light.

The latent image 16, for example, is arranged so as to form a plurality of rows of tracks on the surface of the master and forms a hexagonal lattice pattern or a quasi-hexagonal lattice pattern. For example, the latent image 16 has an elliptic shape having the major axis directed in the extending direction of the track.

Developing Process

Next, a liquid developer is dropped to the resist layer 14 while rotating the master 12, and thereby, as shown in FIG. 13A, a developing process is performed for the resist layer 14. As shown in the figure, in a case where the resist layer 14 is formed with a positive-type resist, the solution rate of the liquid developer for an exposed portion that has been exposed with the laser beams 15 is higher than that of a non-exposed portion. Accordingly, a pattern corresponding to the latent image (exposed portion) 16 is formed on the resist layer 14.

Etching Process

Next, an etching process is performed for the surface of the master 12 by using the pattern (resist pattern) of the resist layer 14 formed on the master 12 as a mask. Accordingly, as shown in FIG. 13B, a concave portion having an elliptic cone shape or an elliptic cone truncated shape that has the major axis directed in the extending direction of the track, that is, the structural body 13 can be acquired. As the method of the etching, for example, dry etching is used. At this time, by performing the etching process and an ashing process in an alternating manner, for example, the pattern of a cone shaped structural body 13 can be formed. In addition, a glass master having a depth (the selection ratio is equal to or larger than three) that is three times the resist layer 14 or more can be produced. Accordingly, a high aspect ratio of the structural body 3 can be implemented. As the dry etching, plasma etching using a roll etching device is preferably performed. The roll etching device is a plasma etching device having a solid cylinder-shaped electrode. The roll etching device is configured such that the solid cylinder-shaped electrode is inserted into a tube-shaped hollow space of the master 12, and a plasma etching process is performed for the cylindrical surface of the master 12.

As described above, a roll master 11 that has a hexagonal lattice pattern or a quasi-hexagonal lattice pattern of a concave shape, for example, having a depth of about 120 nm to 350 nm can be acquired.

Replication Process

Next, for example, the roll master 11 and a base 2 such as a sheet coated with a transfer material are brought into close contact with each other. Then, the base 2 is detached while curing the base 2 by irradiating ultraviolet rays thereto. Accordingly, as shown in FIG. 13C, a plurality of structural bodies as convex portions are formed on the cylindrical surface of the base 2, and thereby an optical device 1 such as a moth-eye ultraviolet-curable replication sheet is produced.

The transfer material, for example, is formed by an ultraviolet curing material and an initiator. In addition, the transfer material includes a filler, a functional additive, and the like as is necessary.

The ultraviolet-curable material, for example, is formed by a monofunctional monomer, a bifunctional monomer, or a multi-functional monomer. In particular, the ultraviolet-curable material is acquired by using any one of the following materials or mixing a plurality of the following materials.

As a monofunctional monomer, for example, there are a carboxylic acid-based material (acrylic acid), a hydroxy-based material (2-hydroxyethyl acrylate, 2-hydroxypropyl acrylate, or 4-hydroxybutyl acrylate), alkyl, and an alicyclic-based material (isobutyl acrylate, t-butyl acrylate, iso-octyl acrylate, lauryl acrylate, stearyl acrylate, isobornyl acrylate, and cyclo-hexyl acrylate), and other functional monomers (2-methoxyethyl acrylate, methoxyethylene glycol acrylate, 2-ethoxyethyl acrylate, tetrahydro furfuryl acrylate, benzyl acrylate, ethyl carbitol acrylate, penoxyethyl acrylate, N,N-dimethylaminoethyl acrylate, N,N-dimethylaminopropylacryl amide, N,N-dimethylacrylamide, acryloylmorpholine, N-isopropyl acrylamide, N,N-diethyl acryl amide, N-vinylpyrrolidone, 2-(perfluoro octyl)ethyl acrylate, 3-perfluoro hexyl-2-hydroxypropyl acrylate, 3-perfluoro octyl-2-hydroxypropyl acrylate, 2-(perfluoro decyl)ethyl acrylate, 2-(perfluoro-3-methylbutyl)ethyl acrylate), 2,4,6-tribromo phenol acrylate, 2,4,6-tribromo phenol methacrylate, 2-(2,4,6-tribromophenoxy)ethyl acrylate), 2-ethylhexyl acrylate, and the like.

As bifunctional monomers, for example, there are tri(propylene glycol) diacrylate, trimethylolpropan diallyl ether, urethane acrylate, and the like.

As multi-functional monomers, for example, there are trimethylolpropan tri-acrylate, di-penta erythritol penta, and hexa acrylate, di-trimethylolpropantetra acrylate, and the like.

As the initiator, for example, there are 2,2,-dimetoxy-1,2-diphenyl ethane-1-on, 1-hydroxy-cyclohexylphenylketone, 2-hydroxy-2-methyl-1-phenyl propan-1-on, and the like.

As the filler, for example, any of inorganic microparticles and organic microparticles can be used. As the inorganic microparticles, for example, there are metal oxide microparticles such as $SiO_2$, $TiO_2$, $ZrO_2$, $SnO_2$, or $Al_2O_3$.

As the functional additive, for example, there are a leveling agent, a surface regulator, and a deforming agent. As the material of the base 2, for example, methyl methacrylate (co) polymer, polycarbonate, styrene (co) polymer, methyl methacrylate-styrene copolymer, cellulose diacetate, cellulose triacetate, cellulose acetate butyrate, polyester, polyamide, polyimide, polyether sulphone, poly sulphone, polypropylene, polymethylpentene, polyvinyl chloride, polyvinyl acetal, poly etherketone, polyurethane, glass, and the like.

The method of molding the base 2 is not particularly limited. Thus, the molding may be performed by using an injection molding body, a pressing molding body, or a casting molding body. As is necessary, a surface process such as a corona process may be configured to be performed for the surface of the base.

2. Second Embodiment

Configuration of Optical Device

Figure 14A:
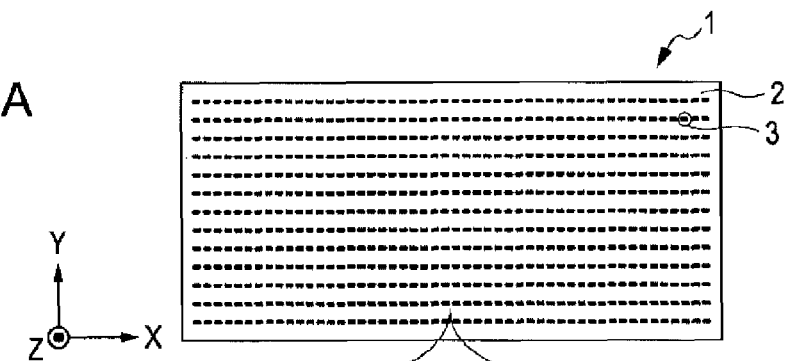
FIG. 14A is a schematic plan view showing an example of the configuration of an optical device according to a second embodiment.
Figure 14B:
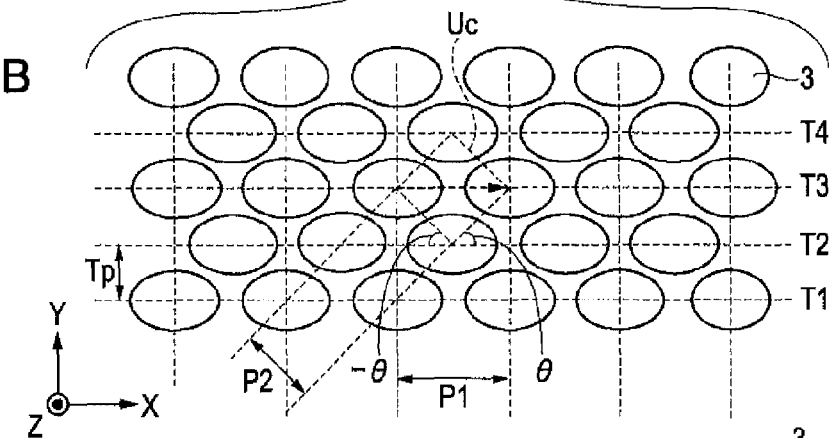
FIG. 14B is an enlarged plan view showing a part of the optical device shown in FIG. 14A.
Figure 14C:
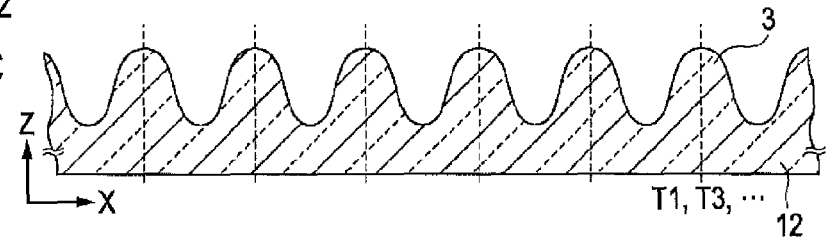
FIG. 14C is a cross-sectional view taken along tracks T1, T3, . . . shown in FIG. 14B.
Figure 14D:
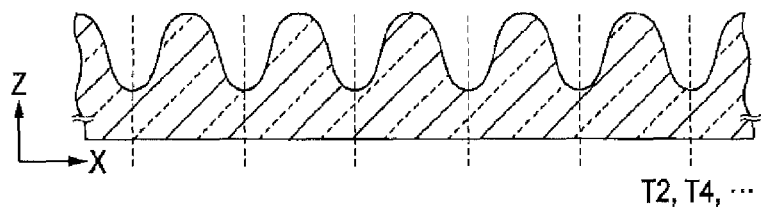
FIG. 14D is a cross-sectional view taken along tracks T2, T4, . . . shown in FIG. 14B.
Figure 14E:
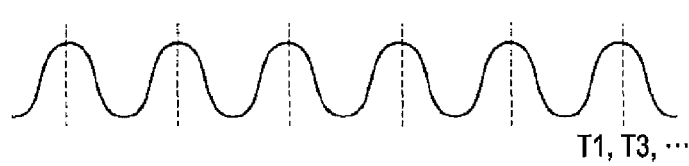
FIG. 14E is an outlined line drawing representing a modulated waveform of a laser beam that is used for forming a latent image corresponding to tracks T1, T3, . . . shown in FIG. 14B.
Figure 14F:
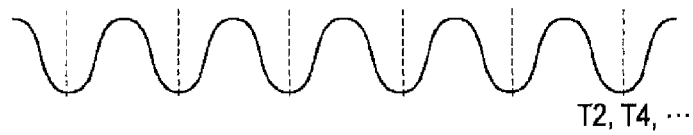
FIG. 14F is an outlined line drawing representing a modulated waveform of a laser beam that is used for forming a latent image corresponding to tracks T2, T4, . . . shown in FIG. 14B.

FIG. 14A is a schematic plan view showing an example of the configuration of an optical device according to a second embodiment. FIG. 14B is an enlarged plan view showing a part of the optical device shown in FIG. 14A. FIG. 14C is a cross-sectional view taken along tracks T1, T3, . . . shown in FIG. 14B. FIG. 14D is a cross-sectional view taken along tracks T2, T4, . . . shown in FIG. 14B. FIG. 14E is an outlined line drawing representing a modulated waveform of a laser beam that is used for forming a latent image corresponding to tracks T1, T3, . . . shown in FIG. 14B. FIG. 14F is an outlined line drawing representing a modulated waveform of a laser beam that is used for forming a latent image corresponding to tracks T2, T4, . . . shown in FIG. 14B.

The optical device 1 according to the second embodiment is different from that according to the first embodiment in that structural bodies 3 form a tetragonal lattice pattern or a quasi-tetragonal lattice pattern between tracks of adjacent three rows. In the description here, a quasi-tetragonal lattice pattern, differently from the square lattice pattern, represents a distorted tetragonal lattice pattern that is stretched in the extending direction (X direction) of the track.

The height or the depth of the structural body 3 is not particularly limited. Thus, for example, the height or the depth of the structural body 3 is in the range of about 159 nm to 312 nm. In addition, the pitch P2 in the direction of (about) 45 degrees with respect to the track is, for example, in the range of about 275 nm to 297 nm. The aspect ratio (height/arrangement pitch) of the structural body 3, for example, is in the range of about 0.54 to 1.13. Furthermore, the aspect ratios of the structural bodies 3 are not limited to being the same with each other. Thus, the structural bodies 3 may be configured so as to have a constant distribution of heights.

It is preferable that the arrangement pitch P1 of the structural bodies 3 within the same track is longer than the arrangement pitch P2 of the structural bodies 3 between two adjacent tracks. In addition, when the arrangement pitch of the structural bodies 3 within the same track is P1, and the arrangement pitch of the structural bodies 3 between two adjacent tracks is P2, it is preferable that a ratio P1/P2 satisfies the relationship of $1.4 < P1/P2 \leq 1.5$. By allowing the ratio to be in such a range, the packing ratio of the structural bodies 3 having an elliptic cone shape or an elliptic truncated cone shape can be improved, and accordingly, the antireflection characteristic can be improved. In addition, it is preferable that the height or the depth of the structural body 3 in the direction of 45 degrees or about 45 degrees with respect to the track is smaller than the height or the depth of the structural body 3 in the extending direction of the track.

It is preferable that the height H2 of the structural body 3 in the arrangement direction (θ direction) that is tilted from the extending direction of the track is smaller than the height H1 of the structural body 3 in the extending direction of the track. In other words, it is preferable that the heights H1 and H2 of the structural body 3 satisfy the relationship of "H1>H2".

Figure 15:
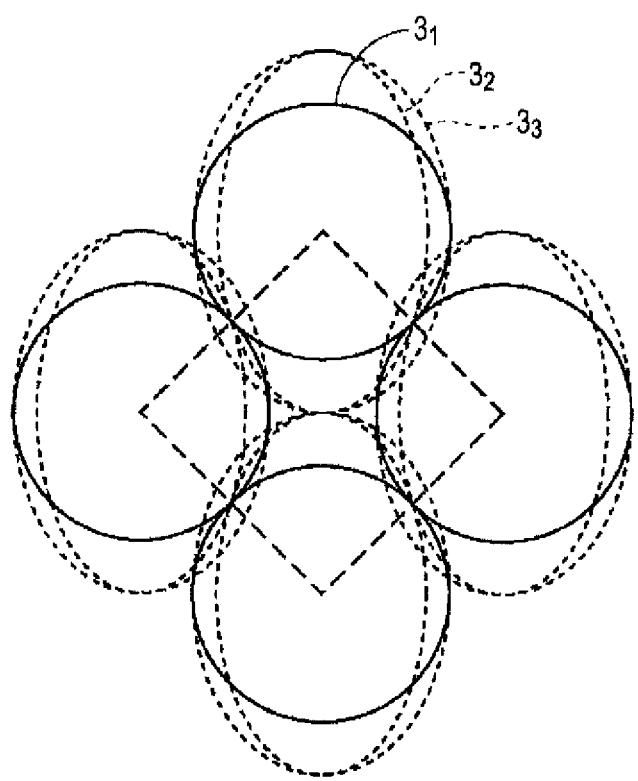
FIG. 15 is a diagram representing the shape of the bottom surface when the ellipticity of the bottom surface of the structural body is changed.

FIG. 15 is a diagram representing the shape of the bottom surface when the ellipticity of the bottom surface of the structural body 3 is changed. The ellipticity of each ellipse 31, 32, and 33 is 100%, 163.3%, and 141%. By changing the ellipticity as described above, the packing ratio of the structural bodies 3 on the surface of the base can be changed. In a case where the structural bodies 3 form a tetragonal lattice pattern or a quasi-tetragonal lattice pattern, it is preferable that the ellipticity e of the bottom surface of the structural body satisfies the relationship of "150%≤e≤180%". By allowing the ellipticity to be in such a range, the packing ratio of the structural bodies 3 is improved. Accordingly, a superior antireflection characteristic can be acquired.

The packing ratio of the structural bodies 3 on the surface of the base is equal to or higher than 65%, is preferably equal to or higher than 73%, and is more preferably equal to or higher than 86%, with 100% as the upper limit thereof. By allowing the packing ratio to be in such a range, the antireflection characteristic can be improved.

Here, the packing ratio (average packing ratio) of the structural bodies 3 is a value acquired as described below.

First, the surface of the optical device 1 is photographed by a scanning electron microscope (SEM) in the top view. Next, a unit lattice Uc is randomly selected from a photographed SEM picture, and the arrangement pitch P1 and the track pitch Tp of the unit lattice Uc are measured (see FIG. 14B). In addition, the area S of the bottom surface of any one of four structural bodies 3 included in the unit lattice Uc is measured by image processing. Next, the packing ratio is calculated by using the following Equation (4) using the arrangement pitch P1, the track pitch Tp, and the area S of the bottom surface which have been measured.

$$\text{Packing Ratio} = (S(\text{tetra})/S(\text{unit})) \times 100 \quad \text{Equation (4)}$$

Here, the unit lattice area $S(\text{unit}) = 2 \times ((P1 \times Tp) \times (1/2)) = P1 \times Tp$, and the area of the bottom surfaces of the structural bodies that exist within the unit lattice $S(\text{tetra}) = S$.

The above-described process of calculation of the packing ratio is performed for ten unit lattices that are randomly selected from the photographed SEM picture. Then, the average of the packing ratios is calculated by simply averaging (arithmetic averaging) the measured values, and this average is assumed to be the packing ratio of the structural bodies 3 on the surface of the base.

The ratio $((2r/P1) \times 100)$ of the diameter 2r to the arrangement pitch P1 is equal to or larger than 64%. It is preferable that above-described arrangement pitch is equal to or larger than 69%, and it is more preferable that the above-described pitch is equal to or larger than 73%. The reason for this is that the packing ratio of the structural bodies 3 is improved so as to improve the antireflection characteristic by allowing the above-described ratio to be in such a range. Here, the arrangement pitch P1 is the arrangement pitch in the track direction of the structural bodies 3, and the diameter 2r is the diameter of the structural body in the track direction. In a case where the bottom surface of the structural body has a circular shape, the diameter 2r becomes the diameter. On the other hand, in a case where the bottom surface of the structural body has an elliptic shape, the diameter 2r becomes the major diameter.

Figure 16A:
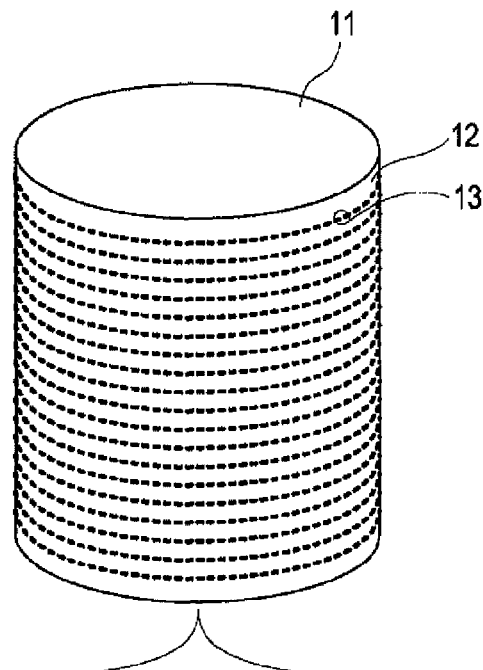
FIG. 16A is a perspective view showing an example of the configuration of a roll master that is used for manufacturing an optical device.
Figure 16B:
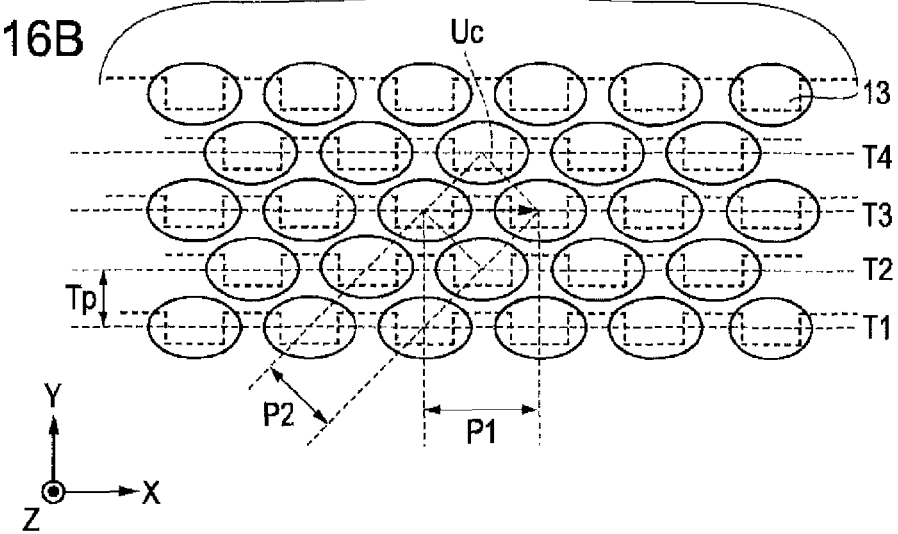
FIG. 16B is a plan view showing an example of the configuration of a roll master that is used for manufacturing an optical device.

FIGS. 16A and 16B show an example of the configuration of a roll master that is used for manufacturing an optical device having the above-described configuration. This roll master is different from that of the first embodiment in that structural bodies 13 that are in a concaved state on the surface form a tetragonal lattice pattern or a quasi-tetragonal lattice pattern.

Configuration of Roll Master

Two-dimensional patterns are spatially linked to each other by using a roll master exposure device and are patterned with an appropriate transmission pitch at a CAV by generating a polarity inversion formatter signal and a signal for synchronizing a rotation controller of a recording device for each single track. Accordingly, a tetragonal lattice pattern or a quasi-tetragonal lattice pattern can be recorded. It is preferable that a lattice pattern having a uniform spatial frequency is formed in a desired area of the resist positioned on the master 12 by appropriately setting the frequency of the polarity inversion formatter signal and the number of revolutions of the roll through irradiation of laser beams.

3. Third Embodiment

Configuration of Optical Device

Figure 17A:
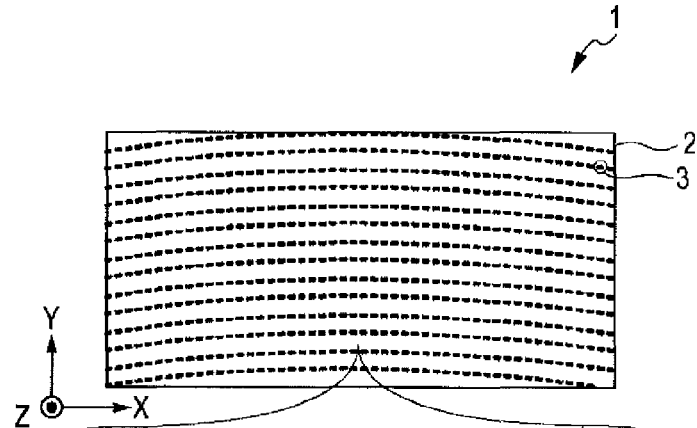
FIG. 17A is a schematic plan view showing an example of the configuration of an optical device according to a third embodiment.
Figure 17B:
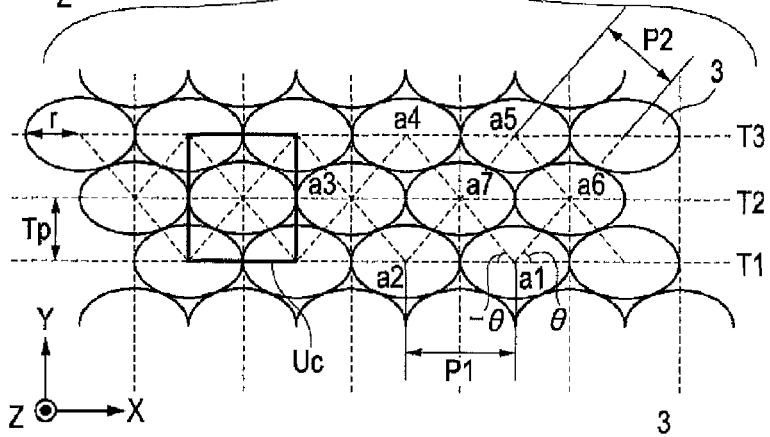
FIG. 17B is an enlarged plan view showing a part of the optical device shown in FIG. 17A.
Figure 17C:
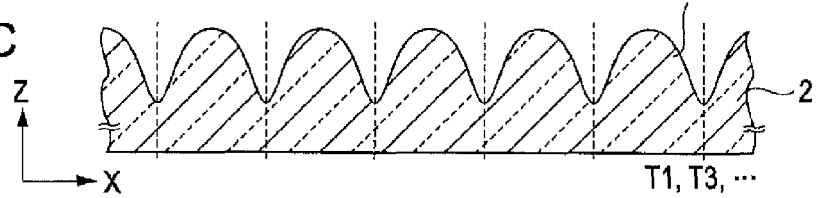
FIG. 17C is a cross-sectional view taken along tracks T1, T3, . . . shown in FIG. 17B.
Figure 17D:
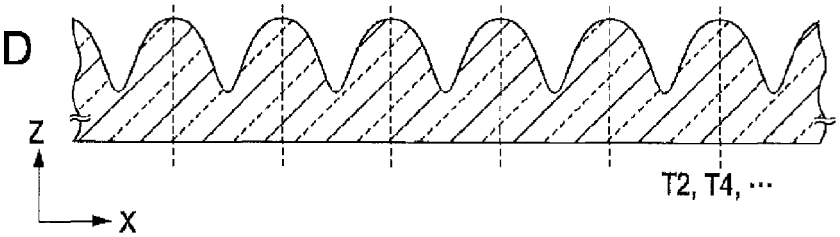
FIG. 17D is a cross-sectional view taken along tracks T2, T4, . . . shown in FIG. 17B.

FIG. 17A is a schematic plan view showing an example of the configuration of an optical device according to a third embodiment. FIG. 17B is an enlarged plan view showing a part of the optical device shown in FIG. 17A. FIG. 17C is a cross-sectional view taken along tracks T1, T3, . . . shown in FIG. 17B. FIG. 17D is a cross-sectional view taken along tracks T2, T4, . . . shown in FIG. 17B.

The optical device 1 according to the third embodiment is different from that according to the first embodiment in that each track T has an arc shape, and structural bodies 3 are arranged in the arc shape. As shown in FIG. 17B, the structural bodies 3 are arranged so as to form a quasi-hexagonal lattice pattern in which the centers of the structural bodies 3 are located at points a1 to a7 between the tracks (T1 to T3) of adjacent three rows. Here, the quasi-hexagonal lattice pattern, differently from a regular hexagonal lattice pattern, represents a hexagonal lattice pattern that is distorted along the arc shape of the track T. In other words, the quasi-hexagonal lattice pattern, differently from a regular hexagonal lattice pattern, represents a hexagonal lattice pattern that is distorted along the arc shape of the track T and is stretched so as to be distorted in the extending direction (X-axis direction) of the track.

The configuration of the optical device 1 other than those described above is the same as that of the first embodiment. Thus, the description thereof is omitted.

Configuration of Disc Master

Figure 18A:
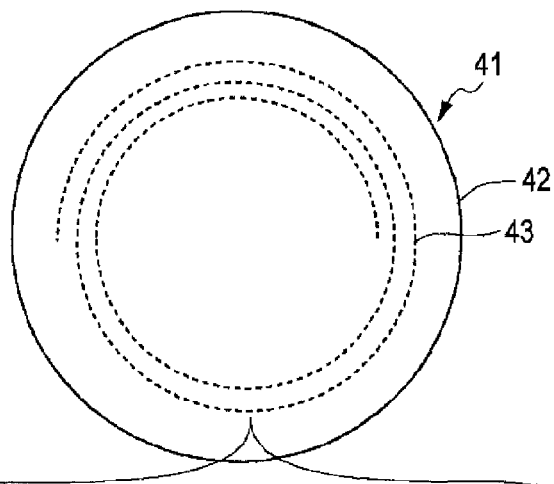
FIG. 18A is a plan view showing an example of the configuration of a disc master that is used for manufacturing an optical device.
Figure 18B:
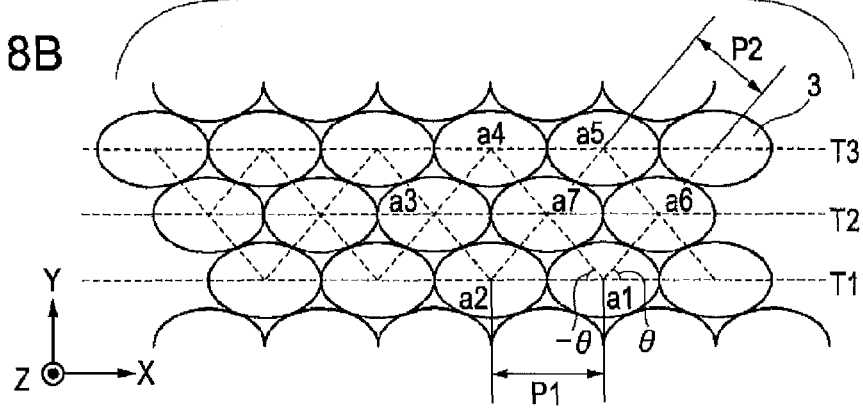
FIG. 18B is an enlarged plan view showing a part of the disc master shown in FIG. 18A.

FIGS. 18A and 18B show an example of the configuration of a disc master that is used for manufacturing an optical device having the above-described configuration. As shown in FIGS. 18A and 18B, the disc master 41 has the configuration in which a plurality of structural bodies 43 as concave portions are arranged on the surface of a disk-shaped master 42. These structural bodies 13 are periodically arranged in two dimensions with a pitch that is equal to or smaller than the wavelength band of light under the use environment of the optical device 1, that is, for example, a pitch that is almost the same as the wavelength of visible light. For example, the structural bodies 43 are arranged on tracks having a concentric circle shape or a spiral shape.

The configuration of the disc master 41 other than those described above is the same as the roll master 11 of the first embodiment. Thus, the description thereof is omitted.

Method of Manufacturing Optical Device

First, an exposure device that is used for manufacturing a disc master 41 having the above-described configuration will be described with reference to FIG. 19.

A movement optical table 32 includes a beam expander 33, a mirror 38, and an objective lens 34. After laser beams 15 guided to the movement optical table 32 are shaped in a desired beam shape by the beam expander 33, the laser beams 15 are irradiated to a resist layer positioned on the disk-shaped master 42 through the mirror 38 and the objective lens 34. The master 42 is placed on a turntable (not shown) that is connected to a spindle motor 35. Then, simultaneously with rotating the master 42, the laser beams are intermittently irradiated to the resist layer positioned on the master 42 while moving the laser beams 15 in the direction of the radius gyration of the master 42, and thereby an exposure process of the resist layer is performed. A formed latent image has an approximately elliptic shape having the major axis in the circumferential direction. The movement of the laser beams 15 is performed by moving the movement optical table 32 in the direction denoted by arrow R.

Figure 19:
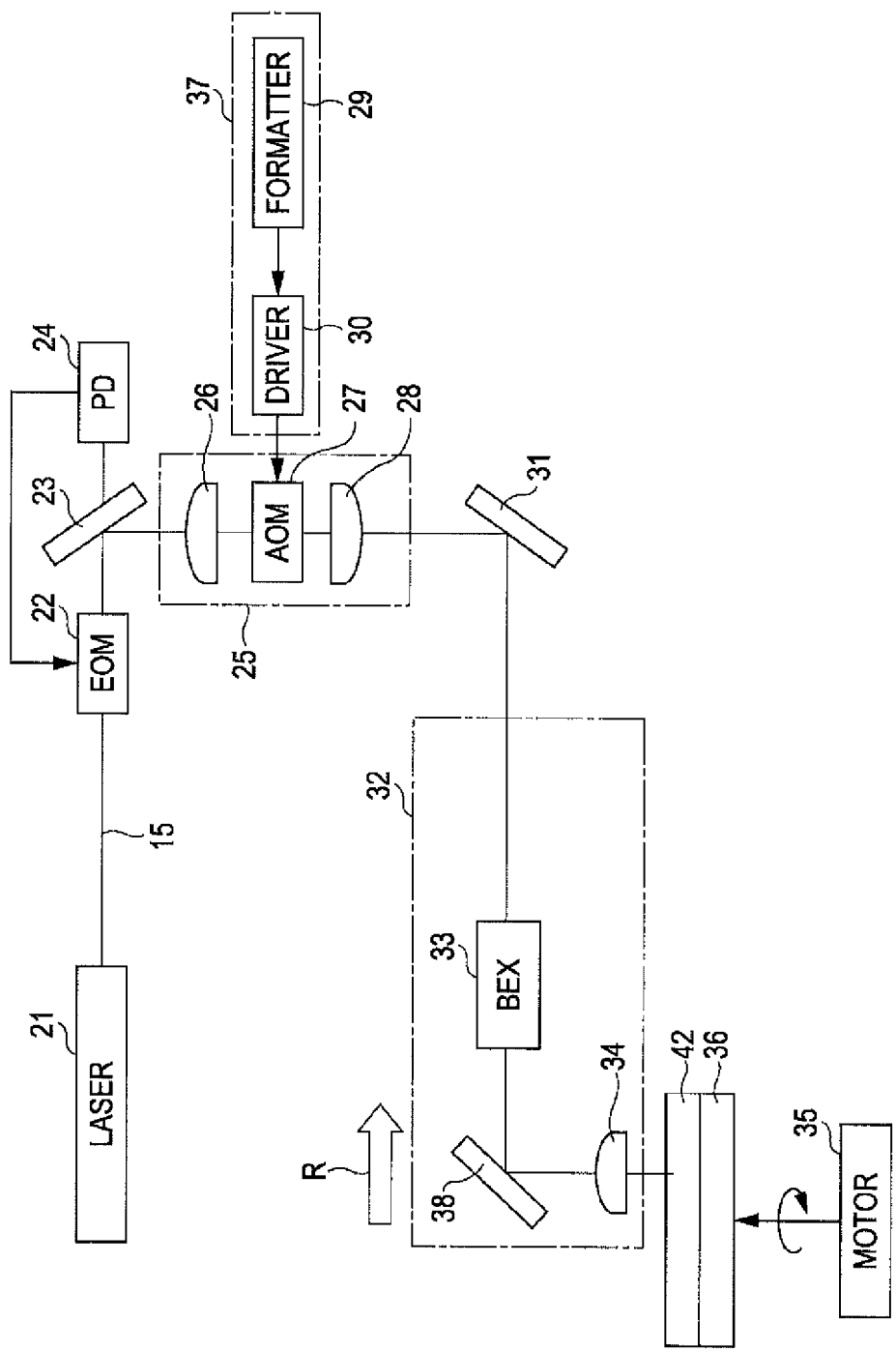
FIG. 19 is a schematic diagram showing an example of the configuration of a disc master exposure device.

The exposure device shown in FIG. 19 includes a control mechanism 37 that is used for forming a latent image, which is configured by a two-dimensional pattern of the hexagonal lattice or the quasi-hexagonal lattice shown in FIG. 17B, on the resist layer. The control mechanism 37 includes a formatter 29 and a driver 30. The formatter 29 includes a polarity inverting unit. The polarity inverting unit controls the irradiation timings of the laser beams 15 for the resist layer. The driver 30 receives the output of the polarity inverting unit and controls an acousto-optic modulator 27.

The control mechanism 37 synchronizes the intensity modulation of the laser beams 15 that is performed by the AOM 27, the driving rotation speed of the spindle motor 35, and the movement speed of the movement optical table 32 for each single track so as to spatially link the two dimensional pattern of the latent image. The rotation of the master 42 is controlled at a constant angular velocity (CAV). Then, a patterning process is performed with an appropriate number of revolutions of the master 42 through the spindle motor 35, appropriate frequency modulation of the laser intensity through the AOM 27, and an appropriate transmission pitch of the laser beams 15 through the movement optical table 32. Accordingly, a latent image of a hexagonal lattice pattern or a quasi-hexagonal lattice pattern is formed on the resist layer.

In addition, the control signal of the polarity inverting unit is slowly changed such that the spatial frequency (the pattern density of the latent image; P1 is 330 nm and P2 is 300 nm, P1 is 315 nm and P2 is 275 nm, or P1 is 300 nm and P2 is 265 nm) becomes uniform. Described in detail, an exposure process is performed while the irradiation period of the laser beams 15 for the resist layer is changed for each single track, and the frequency modulation of the laser beams 15 is performed by the control mechanism 37 such that P1 of each track T becomes about 330 nm (or 315 nm or 300 nm). In other words, the modulation is controlled such that the irradiation period of the laser beams is shortened as the track position is located farther from the center of the disk-shaped master 42. Accordingly, a nano pattern of which the spatial frequency is uniform on the entire surface of the substrate can be formed.

Hereinafter, an example of a method of manufacturing an optical device according to the third embodiment will be described.

First, the disc master 41 is produced by using the exposure device having the above-described configuration, similarly to the first embodiment except for exposing the resist layer that is formed on the disk-shaped master. Next, the disc master 41 and a base 2 such as an acrylic sheet coated with ultraviolet-curable resin are brought into close contact with each other. Then, after the ultraviolet-curable resin is cured by radiating ultraviolet rays thereon, the base 2 is detached from the disc master 41. Accordingly, a disk-shaped optical device 1 in which a plurality of structural bodies 3 are arranged on the surface can be acquired. Next, an optical device 1 having a predetermined shape such as a rectangle shape is cut out from the disk-shaped optical device 1. As a result, the target optical device 1 is produced.

According to the third embodiment, similarly to a case where the structural bodies 3 are arranged in a linear shape, the optical device 1 that has high productivity and a superior antireflection characteristic can be acquired.

4. Fourth Embodiment

Figure 20A:
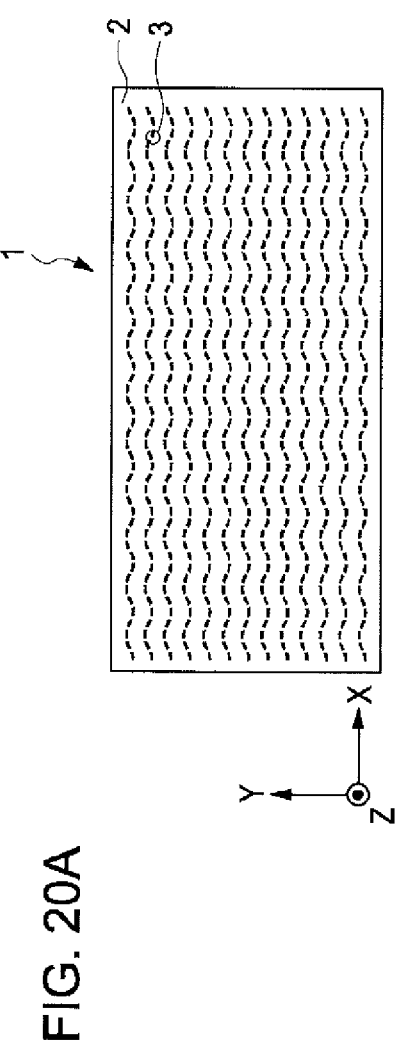
FIG. 20A is a schematic plan view showing an example of the configuration of an optical device according to a fourth embodiment.
Figure 20B:
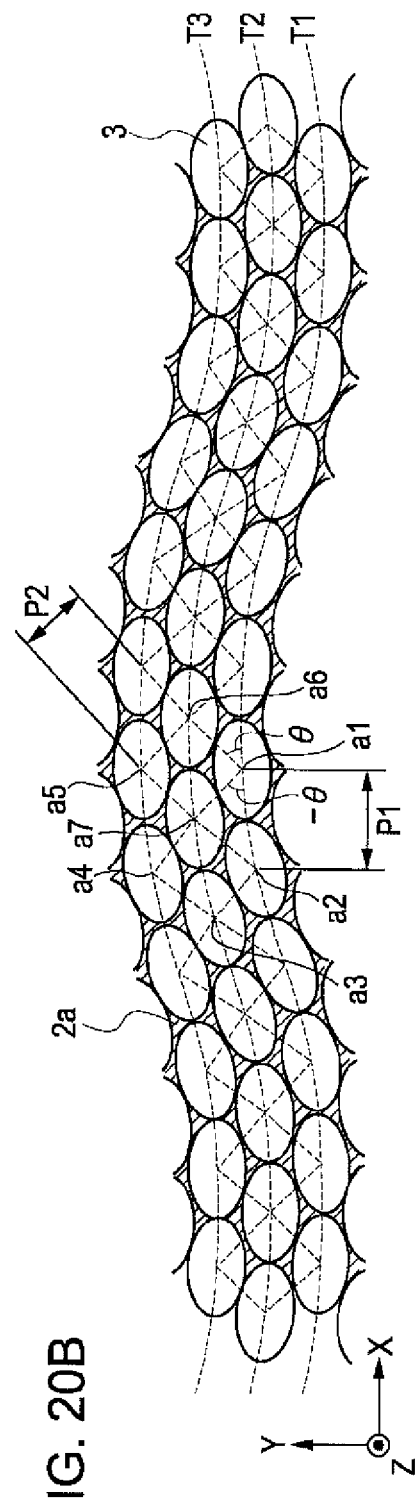
FIG. 20B is an enlarged plan view showing a part of the optical device shown in FIG. 20A.

FIG. 20A is a schematic plan view showing an example of the configuration of an optical device according to a fourth embodiment. FIG. 20B is an enlarged plan view showing a part of the optical device shown in FIG. 20A.

The optical device 1 according to the fourth embodiment is different from that according to the first embodiment in that the optical device 1 is arranged on a track (hereinafter, referred to as a wobble track) that meanders through the structural bodies 3. It is preferable that the wobbles of the tracks on the base 2 are synchronized with each other. In other words, the wobbles are preferably synchronized wobbles. By synchronizing the wobbles as described above, the unit lattice shape of the hexagonal lattice or the quasi-hexagonal lattice is maintained, and thereby the packing ratio can be maintained to be high. The waveform of the wobble track, for example, may be a sine wave, a triangle wave, or the like. The waveform of the wobble track is not limited to a periodic waveform. Thus, the waveform of the wobble track may be a non-periodic waveform. For example, the amplitude of the wobble of the wobble track is selected to be about ±10 μm.

According to the fourth embodiment, the configurations other than those described above are the same as those of the first embodiment.

According to the fourth embodiment, by arranging the structural bodies 3 on the wobble track, occurrence of unevenness in appearance can be suppressed.

5. Fifth Embodiment

Figure 21A:
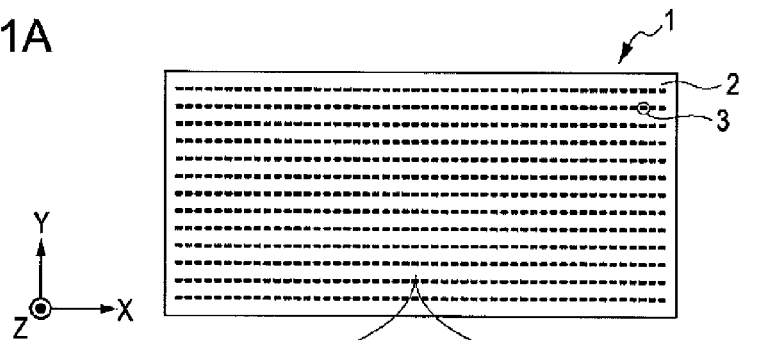
FIG. 21A is a schematic plan view showing an example of the configuration of an optical device according to a fifth embodiment.
Figure 21B:
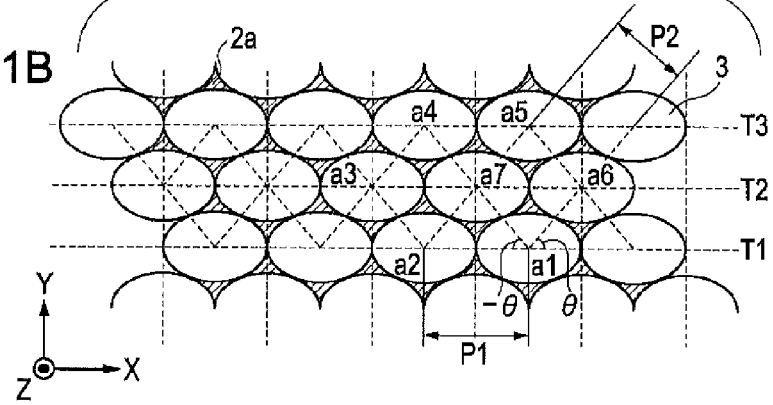
FIG. 21B is an enlarged plan view showing a part of the optical device shown in FIG. 21A.
Figure 21C:
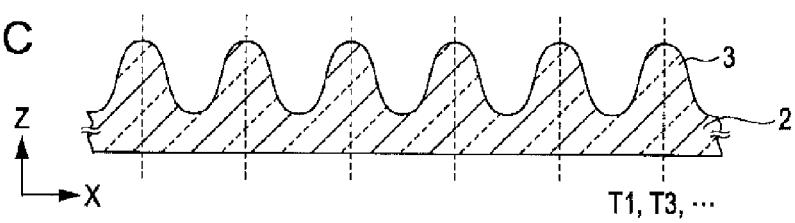
FIG. 21C is a cross-sectional view taken along tracks T1, T3, . . . shown in FIG. 21B.
Figure 21D:
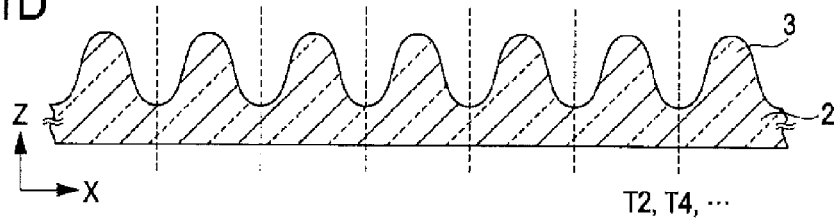
FIG. 21D is a cross-sectional view taken along tracks T2, T4, . . . shown in FIG. 21B.
Figure 22:
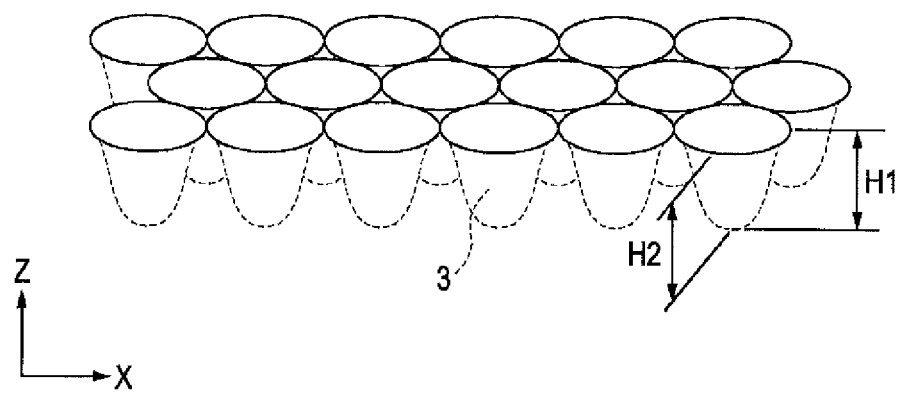
FIG. 22 is an enlarged perspective view of a part of the optical device shown in FIG. 21A.

FIG. 21A is a schematic plan view showing an example of the configuration of an optical device according to a fifth embodiment. FIG. 21B is an enlarged plan view showing a part of the optical device shown in FIG. 21A. FIG. 21C is a cross-sectional view taken along tracks T1, T3, ... shown in FIG. 21B. FIG. 21D is a cross-sectional view taken along tracks T2, T4, ... shown in FIG. 21B. FIG. 22 is an enlarged perspective view of a part of the optical device shown in FIG. 21A.

The optical device 1 according to the fifth embodiment is different from that according to the first embodiment in that a plurality of structural bodies 3 as concave portions is arranged on the surface of the base. The shape of the structural body 3 is formed as a concave portion by reversing the convex shape of the structural body 3 according to the first embodiment. In a case where the structural body 3 is formed as the concave portion as described above, an opening portion (an inlet portion of the concave portion) of the structural body 3 as the concave portion is defined as a lower portion, and a lowest portion (a deepest portion of the concave portion) of the base 2 in the depth direction is defined as an apex portion. In other words, the apex portion and the lower portion are defined by using the structural body 3 that is a not a concrete space. In the fifth embodiment, since the structural body 3 is the concave portion, the height H of the structural body 3 that is included in Equation (1) and the like becomes the depth H of the structural body 3.

In the fifth embodiment, the configurations other than those described above are the same as those of the first embodiment.

According to the fifth embodiment, the shape of the structural body 3, which is the convex shape in the first embodiment, is reversed so as to be the concave portion. Therefore, the same advantages as those of the first embodiment can be acquired.

6. Sixth Embodiment

Configuration of Optical Device

Figure 23:
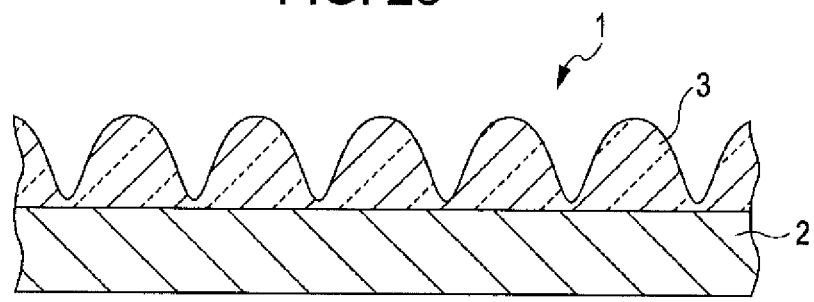
FIG. 23 is a cross-sectional view showing an example of the configuration of an optical device according to a sixth embodiment.

FIG. 23 is a cross-sectional view showing an example of the configuration of an optical device according to a sixth embodiment. As shown in FIG. 23, the optical device 1 according to the sixth embodiment is different from that of the first embodiment in that a structural body 3, which is acquired by using siloxane resin, is prepared on the base 2.

An embodiment can be very appropriately applied to a package of an optical device of cover glass, a window material having heat resistance and high permeability, or the like, an image sensor device (for example, a CCD image sensor device, a CMOS image sensor device, or the like) including the optical device, a photo diode, a semiconductor laser device, or the like. In addition, an embodiment can be very appropriately applied to an optical device such as a front panel having high hardness and heat resistance and a display including the optical device. In particular, an embodiment can be very appropriately applied to a package of an image sensor that is included in various cameras such as a digital camera (for example, a single-lens reflex camera, a compact camera, or the like), a digital camera of a cellular phone, a camera of industrial machinery, a monitoring camera, and a camera of an image recognition device.

Method of Manufacturing Optical Device

FIG. 24A to 24D are process flow diagrams illustrating a method of manufacturing an optical device according to the sixth embodiment. This method of manufacturing the optical device uses a room-temperature nanoimprint technology.

The method of manufacturing an optical device according to the sixth embodiment includes: a process of forming a resin layer by coating a base with a film-forming composition containing siloxane resin; a process of transferring a shape by pressing a mold against the resin layer, a process of detaching the mold from the resin layer; and a process of irradiating ultraviolet rays onto the resin layer from which the mold has been detached under reduced pressure.

Resin Layer Forming Process

Figure 24A:
FIG. 24A to 24D are process flow diagrams illustrating a method of manufacturing an optical device according to the sixth embodiment.

First, as shown in FIG. 24A, the resin layer 61 is formed by coating the base 2 with the film-forming material that contains siloxane resin. As the coating method, for example, a spin coating method or the like can be used. However, the coating method is not particularly limited. As the base 2, for example, a glass substrate (for example, a white board or quartz) that contains glass as its main component can be used. As the siloxane resin, silsesquioxane resin is preferably used. As the film-forming material, it is preferable to use a solution form that is acquired by dissolving a component such as siloxane resin in an appropriate organic solvent. In addition, as is necessary, an organic layer or an inorganic layer may be formed on the base 2. It is preferable that the film thickness of the resin layer 61 is equal to or larger than 300 nm and equal to or less than 500 nm depending on the type of the structural body 2 to be manufactured.

Shape Transferring Process

Figure 24B:
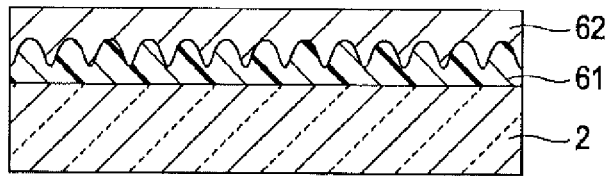

Next, as shown in FIG. 24B, the shape of the mold is transferred to the resin layer 61 by pressing the mold 62 having a predetermined shape against the resin layer 61 that is formed on the base 2. As the mold 61, for example, the die 41 used in the third embodiment can be used. However, the mold 61 is not particularly limited. For example, a die that is manufactured by performing a plating process or the like for the optical device 1 according to any one of the first to second embodiments and the fourth to fifth embodiments can be used. The pressure of the press for the mold 62 is preferably in the range of about 5 MPa to 100 MPa. In addition, the time of the press is preferably in the range of about 10 seconds to 20 seconds depending on the film thickness of the resin layer 61. By performing the press for a predetermined time in the state in which the mold 62 is pressed as described above; the shape of the resin layer 61 is cured further.

Detachment Process

Figure 24C:
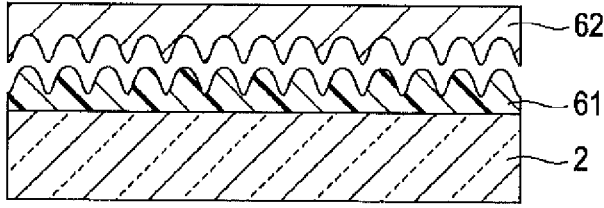

Next, as shown in FIG. 24C, the mold 62 is detached from the resin layer 61. Accordingly, structural bodies 3 to which the shape of the mold 61 is transferred are formed on the base 2.

Irradiation Process

Figure 24D:
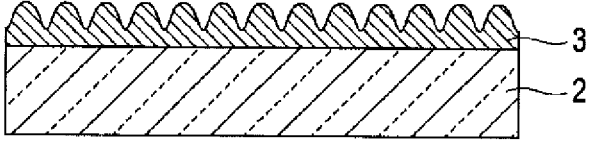

Next, as shown in FIG. 24D, it is preferable that, after ultraviolet rays L are irradiated onto the resin layer 61 from which the mold 62 has been detached under reduced pressure of about 10 Torr, the resin layer 61 is heated at 300° C. to 400° C. By heating the resin layer 61 as described above, the curing efficiency increases. For example, pencil hardness of 7H to 9H can be acquired through heating at 300° C., and pencil hardness of 8H to 9H can be acquired through heating at 400° C. In addition, when the resin layer 61 is cured by being heated at 300° C. to 400° C., the heat resistance of the optical device 1 produced as above is equal to or higher than 500° C., and is sufficient for a reflow process.

Accordingly, the structural bodies 3 to which the shape of the mold 62 is transferred can be formed on the base 2.

The optical device 1 according to the sixth embodiment, for example, can be used as cover glass or a window material that is included in a package of an image sensor device or as a front panel of a display or the like. Accordingly, cover glass or a window material that has heat resistance and high permeability, a front panel that has high hardness and heat resistance, a display that includes the front panel, and the like can be provided.

7. Seventh Embodiment

Configuration of Liquid Crystal Display Device

Figure 25:
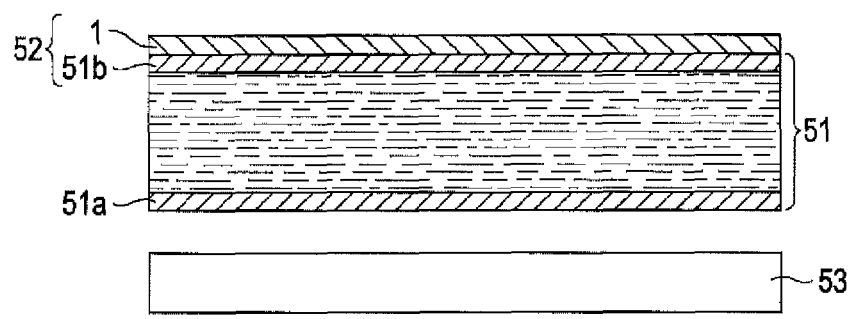
FIG. 25 shows an example of the configuration of a liquid crystal display device according to a fifth embodiment.

FIG. 25 shows an example of the configuration of a liquid crystal display device according to a seventh embodiment. As shown in FIG. 25, the liquid crystal display device includes a backlight 53 that emits light and a liquid crystal panel 51 that displays an image by modulating the light emitted from the backlight 53 temporally and spatially. On both faces of the liquid crystal panel 51, polarizers 51a and 51b that are optical components 1 are disposed. In the polarizer 51b disposed on the display surface side of the liquid crystal panel 51, an optical device 1 is disposed. Here, the polarizer 51b having a principal surface on which the optical device 1 is disposed is referred to as an antireflection function-implemented polarizer 52. This antireflection function-implemented polarizer 52 is an example of an antireflection function-implemented optical component.

Here, the backlight 53, the liquid crystal panel 51, the polarizers 51a and 51b, and the optical device 1 that configures the liquid crystal display device will be sequentially described.

Backlight

As the backlight 53, for example, a right-below-type backlight, an edge-type backlight, or a flat surface light source-type backlight can be used. The backlight 53, for example, includes a light source, a reflective plate, an optical film, and the like. As the light source, for example, a cold cathode fluorescent lamp (CCFL), a hot cathode fluorescent lamp (HCFL), an organic electroluminescence (OEL), an inorganic electroluminescence (IEL), a light emitting diode (LED), or the like is used.

Liquid Crystal Panel

As the liquid crystal panel 51, for example, a liquid crystal panel of a display mode such as a twisted nematic (TN) mode, a super twisted nematic (STN) mode, a vertically aligned (VA) mode, an in-plane switching (IPS) mode, an optically compensated birefringence (OCB) mode, a ferroelectric liquid crystal (FLC) mode, a polymer dispersed liquid crystal (PDLC) mode, a phase change guest host (PCGH) mode, or the like can be used.

Polarizer

On both faces of the liquid crystal panel 51, for example, polarizers 51a and 51b are disposed so as to allow the transmission axes thereof to be orthogonal to each other. The polarizers 51a and 51b pass one of polarized components, which are orthogonal to each other, of incident light and absorb the other so as to be shielded. As the polarizers 51a and 51b, a uniaxially stretched hydrophilic polymer film such as a polyvinyl alcohol-based film, a partial formalized polyvinyl alcohol-based film, or an ethylene acetate vinyl copolymer system partial saponified film to which a dichroic material such as iodine or dichroic dye is adsorbed can be used. On both faces of the polarizers 51a and 51b, a protection layer such as a triacetyl cellulose (TAC) film is preferably disposed. When the protection layer is disposed as described above, it is preferable that the base 2 of the optical device 1 is configured to serve also as the protection layer. By employing such a configuration, the thickness of the antireflection function-implemented polarizer 52 can be decreased.

Optical Device

The optical device 1 is similar to that of any of the above-described first to fourth embodiments. Thus, the description thereof is omitted.

According to the seventh embodiment, the optical device 1 is disposed on the display surface of the liquid crystal display device. Accordingly, the antireflection function of the display surface of the liquid crystal display device can be improved. Accordingly, the visibility of the liquid crystal display device can be improved.

8. Eighth Embodiment

Configuration of Liquid Crystal Display Device

Figure 26:
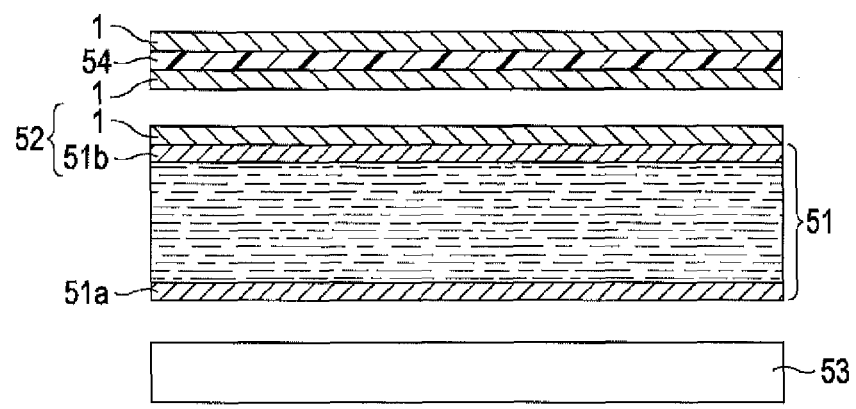
FIG. 26 shows an example of the configuration of a liquid crystal display device according to a sixth embodiment.

FIG. 26 shows an example of the configuration of a liquid crystal display device according to an eighth embodiment. The liquid crystal display device includes a front face member 54 on the front face side of the liquid crystal panel 51, and the optical device 1 is included on at least one of the front face of the liquid crystal panel 51 and the front face and the rear face of the front face member 54, which is different from the fifth embodiment. FIG. 26 shows an example in which the optical devices 1 are included on all of the front face of the liquid crystal panel 51 and the front face and the rear face of the front face member 54. Between the liquid crystal panel 51 and the front face member 54, for example, an air layer is formed. To a same portion as that of the above-described fifth embodiment, a same reference sign is assigned, and the description thereof is omitted. In an embodiment, the front face represents a face located on the side that becomes the display surface, that is, a face that becomes the observer side, and the rear face represents a face located on the side that is opposite to the display surface.

The front face member 54 is a front panel that is used for mechanical protection, heat protection, protection of weather resistance, and design of the front face (observer side) of the liquid crystal panel 51 or the like. The front face member 54, for example, has the shape of a sheet, a film, or a plate. As the material of the front face member 54, for example, glass, triacetyl cellulose (TAC), polyester (TPEE), polyethylene terephthalate (PET), polyimide (PI), polyamide (PA), aramid, polyethylene (PE), polyacrylate, polyether sulphone, polysulphone, poly propylene (PP), diacetyl cellulose, polyvinyl chloride, acrylic resin (PMMA), polycarbonate (PC) or the like can be used. However, the material of the front face member 54 is not particularly limited to such materials, and any material having transparency can be used.

According to the eighth embodiment, similarly to the seventh embodiment, the visibility of the liquid crystal display device can be improved.

9. Ninth Embodiment

Figure 28:
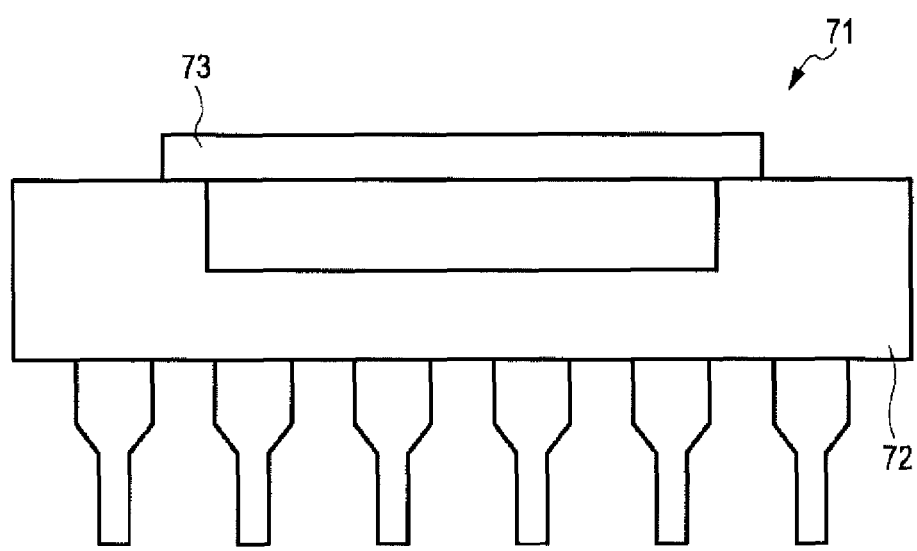
FIG. 28 is a cross-sectional view showing an example of the configuration of a package of an image sensor device according to an eighth embodiment.

FIG. 28 is a cross-sectional view showing an example of the configuration of a package of an image sensor device according to a ninth embodiment. As shown in FIG. 28, the package 71 includes an image sensor device 72 and a cover glass 73 that is fixed so as to cover the opening window of the image sensor device 72. The image sensor device 72, for example, is a CCD image sensor device, a CMOS image sensor device, or the like. As the cover glass 73, for example, the optical device 1 according to the sixth embodiment is preferably used.

10. Examples

Hereinafter, examples of the present application will be concretely described. However, the present application is not limited to the examples.

Example 1

First, a glass roll master having the outer diameter of 126 mm was prepared, and a resist was attached to the surface of the glass master as a film. In other words, a photo resist was diluted with thinner at the rate of 1/10, and by coating the diluted resist with dip on the cylindrical surface of the glass roll master so as to have a thickness of about 130 nm, the resist was attached as a film. Next, by transporting the glass master as a recording medium to the roll master exposure device shown in FIG. 11 and exposing the resist, the resist is connected in the shape of one spire, and a latent image forming a hexagonal lattice pattern between tracks of three adjacent tracks was patterned in the resist.

Described in detail, laser beams having power of 0.50 mj/m that expose up to the surface of the glass roll master were irradiated onto an area, in which a hexagonal lattice pattern is to be formed, so as to form a quasi-hexagonal lattice pattern of a concave shape. In addition, as shown in FIG. 13A, the thickness of the resist in the row direction of the track row was about 120 nm, and the thickness of the resist in the extending direction of the track was about 100 nm.

Next, by performing a developing process for the resist on the glass roll master, the resist positioned in the exposed portion was dissolved so as to be developed. Described in detail, an undeveloped glass roll master was placed on a turntable of a developing unit not shown in the figure. Then, while the turntable was rotated, developer was dropped to the surface of the glass roll master, and thereby the resist on the surface was developed. Accordingly, a resist glass master of which the resist layer was open in a quasi-hexagonal lattice pattern could be acquired.

Next, a plasma etching process was performed at the atmosphere of $CHF_3$ gas by using roll plasma etching. Accordingly, on the surface of the glass roll master, only the part of the quasi-hexagonal lattice pattern exposed from the resist layer was etched, and the other area was not etched due to the photoresist serving as a mask. Therefore, concave portions having an elliptic cone shape could be acquired. The etching amount (depth) of the pattern at this time was changed in accordance with the etching time. Finally, by completely eliminating the photoresist through $O_2$ ashing, a moth-eye glass roll master having a hexagonal lattice pattern of a concave shape could be acquired. The depth of the concave portion in the row direction was larger than that in the extending direction of the track.

The above-described moth-eye glass roll master and an acrylic sheet coated with ultraviolet-curable resin or the like are brought into contact with each other, and the acrylic sheet or the like is detached while being cured by irradiating ultraviolet rays. Accordingly, the optical device (FIG. 13C) was produced.

Example 2

By adjusting the frequency of the polarity inverting formatter signal, the number of revolutions of the roll, and the appropriate transmission pitch for each single track, a quasi-hexagonal lattice pattern was recorded in the resist layer by patterning the resist layer. Other than that, the optical device was produced similarly to Example 1.

Example 3

By adjusting the frequency of the polarity inverting formatter signal, the number of revolutions of the roll, and the appropriate transmission pitch for each single track, a tetragonal lattice pattern was recorded in the resist layer by patterning the resist layer. Other than that, the optical device was produced similarly to Example 1.

Example 4

By adjusting the frequency of the polarity inverting formatter signal, the number of revolutions of the roll, and the appropriate transmission pitch for each single track, a quasi-tetragonal lattice pattern was recorded in the resist layer by patterning the resist layer. Other than that, the optical device was produced similarly to Example 1.

Evaluation of Shape

The optical devices of Examples 1 to 4 produced as described above were observed by using an atomic force microscope (AFM). Then, the height of the structural body of each example was acquired from the cross-sectional profile of the AFM. The results are shown in Table 2 and Table 3.

TABLE 2

|  | Example 1 | Example 2 |
|---|---|---|
| Lattice Pattern | Hexagonal Lattice | Quasi-Hexagonal Lattice |
| Height in Extending Direction of Track | 243 nm | 308 nm |
| Height in Row Direction | 301 nm | 348 nm |
| Period in Extending Direction of Track (P1) | 300 nm | 315 nm |
| Period in Direction of 60 Degrees (P2) | 300 nm | 300 nm |
| Average Period | 300 nm | 305 nm |
| Aspect Ratio | 1 | 1.14 |

TABLE 3

|  | Example 3 | Example 4 |
|---|---|---|
| Lattice Pattern | Tetragonal Lattice | Quasi-Tetragonal Lattice |
| Height in Direction of (about) 45 Degrees with respect to Extending Direction of Track | 248 nm | 202 nm |
| Height in Row Direction | 275 nm | 226 nm |
| Period in Extending Direction of Track (P1) | 360 nm | 360 nm |
| Period of Track | 180 nm | 160 nm |
| Period (P2) | 255 nm | 241 nm |
| Aspect Ratio | 1.08 | 0.94 |

The moth-eye shapes of the optical devices of Example 1 and 2 are convex-shaped elliptic truncated cones (elliptic cones) of a hexagonal lattice and a quasi-hexagonal shape. By measuring the cross-sectional shape through the AFM, it is found that the height of the structural body in the extending direction of the track is smaller than that in the row direction of the track. In addition, the height of the structural body in the direction other than the extending direction of the track is almost the same as that in the row direction of the track. Accordingly, the height of the structural body is represented by the height in the row direction of the track.

The moth-eye shapes of the optical devices of Example 3 and 4 are convex shaped elliptic truncated cones (elliptic cones) of a tetragonal lattice and a quasi-tetragonal shape. By measuring the cross-sectional shape through the AFM, it is found that the height of the structural body in the direction of 45 degrees with respect to the extending direction of the track is smaller than that in the row direction of the track. In addition, the height of the structural body in the direction other than the direction of 45 degrees with respect to the extending direction of the track is almost the same as that in the row direction of the track. Accordingly, the height of the structural body is represented by the height in the row direction of the track.

Evaluation of Reflectivity and Transmissivity

Figure 29:
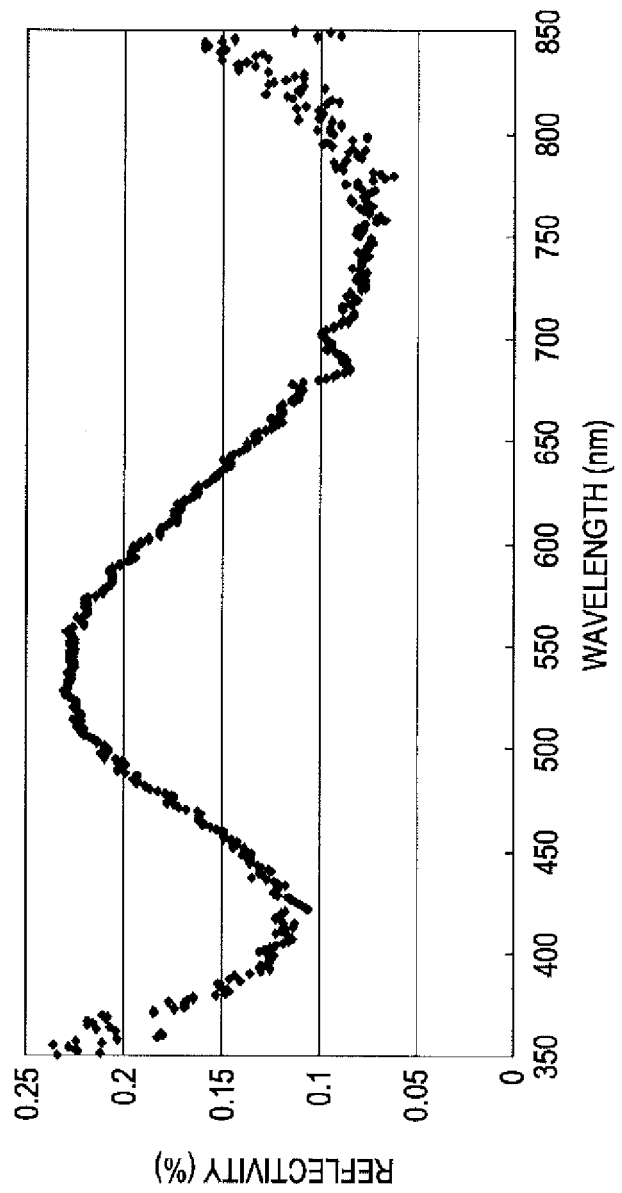
FIG. 29 is a graph representing the dependency of the reflectivity of the optical device of Example 1 on the wavelength.
Figure 30:
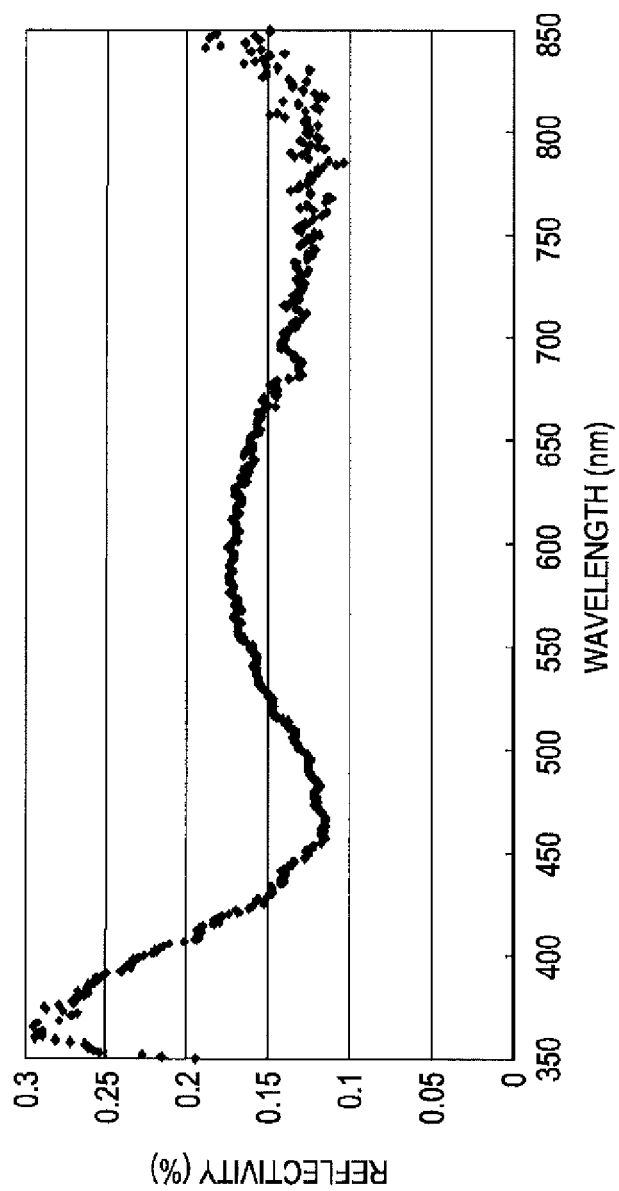
FIG. 30 is a graph representing the dependency of the reflectivity of the optical device of Example 2 on the wavelength.
Figure 31:
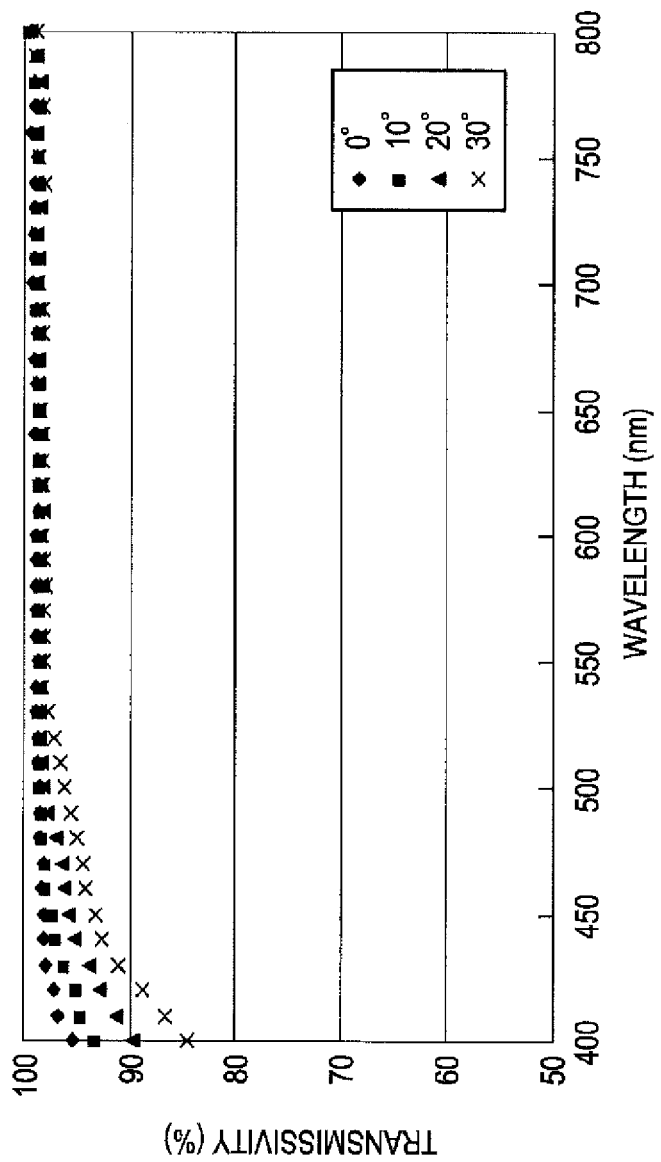
FIG. 31 is a graph representing the dependency of the reflectivity of the optical device of Example 3 on the wavelength.
Figure 32:
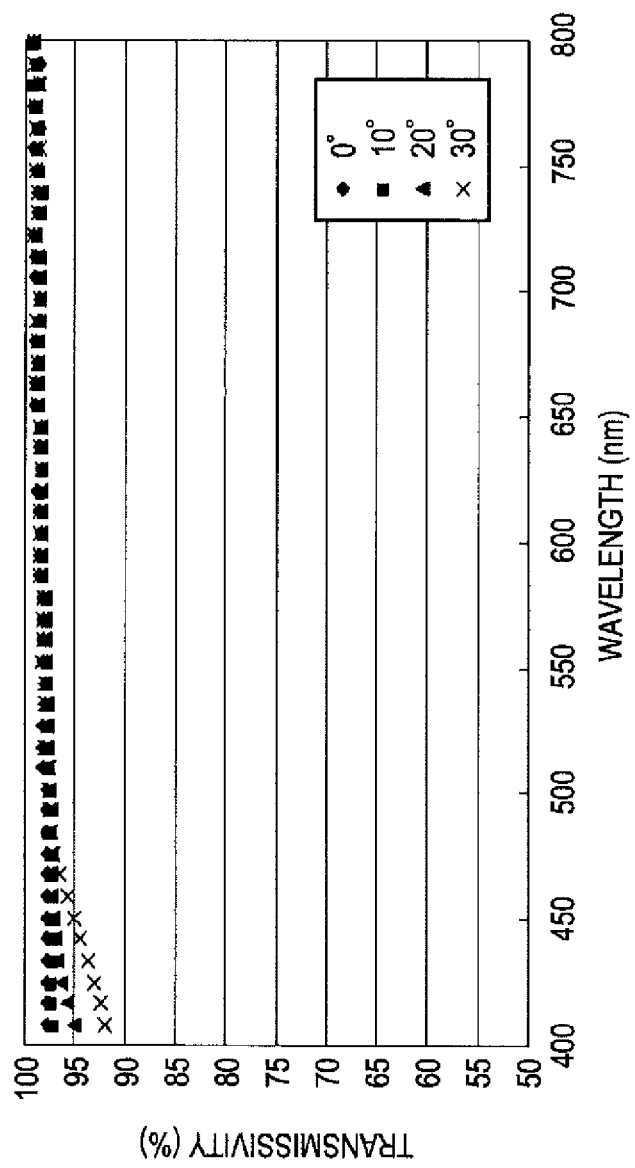
FIG. 32 is a graph representing the dependency of the reflectivity of the optical device of Example 4 on the wavelength.

The reflectivity and the transmissivity of the optical devices of Examples 1 to 4 were evaluated by using an evaluation device (V-550) manufactured by JASCO Corporation. FIGS. 29 and 30 show the dependency of the reflectivity of the optical devices of Examples 1 and 2 on the wavelength. In addition, FIGS. 31 and 32 show the dependency of the transmissivity of the optical devices of Examples 3 and 4 on the wavelength.

In the optical devices of Examples 1 and 2, there is dependency of the reflectivity on the wavelength. However, the reflectivity of the substrate that does not have a moth-eye pattern is 4.5%, and, in the region of the UV light to visible light (wavelength of 350 to 800 nm), the average reflectivity is 0.15%, which is a sufficiently small value. It was checked that a sufficient antireflection effect is acquired in the optical device of which the height of the structural body in the extending direction of the track is small.

In Examples 3 and 4, a sufficient transmission characteristic of 98 to 99% was acquired in the region of visible light (wavelength of 400 to 800 nm). Up to the incident angle of 30 degrees, the transmissivity is 99% and the dependency on the angle is sufficient for RGB light having a wavelength of 650 nm, 540 nm, and 460 nm. In the optical device of which the height of the structural body in the direction of 45 degrees with respect to the extending direction of the track was small, it was checked that a sufficient transmission characteristic could be acquired.

The moth-eye shape of the optical device, as described above, is a convex-shaped elliptic truncated cone (elliptic cone) of a hexagonal lattice, a quasi-hexagonal lattice, a tetragonal lattice, or a quasi-tetragonal lattice, and a sufficient antireflection characteristic could be acquired for the optical device of which the aspect ratio was in the range of 0.94 to 1.14. In addition, a concave-shaped elliptic cone groove was also checked in a moth-eye glass master.

Example 5

First, similarly to Example 2, a moth-eye glass master was acquired. Then, after the moth-eye glass master was coated with ultraviolet-curable resin, an acrylic sheet (thickness of 0.20 mm) was brought into contact with the ultraviolet-curable resin. Then, the ultraviolet-curable resin was cured by irradiating the ultraviolet rays thereon, and the acrylic sheet was detached from the ultraviolet-curable resin, and thereby a moth-eye ultraviolet-curable replication sheet was acquired.

Next, the rear face of the moth-eye ultraviolet-curable replication sheet was brought into contact with the convex surface of a piano-convex lens (focal distance of 70 mm) of Φ25 mm. Thereafter, while the piano-convex lens and the moth-eye ultraviolet-curable replication sheet are further brought into contact with each other by a lens holder during cleaning at 80° C., the moth-eye ultraviolet-curable replication sheet was bent in the shape of the convex lens. Next, the plano-convex lens and the moth-eye ultraviolet-curable sheet were taken out after being left in the cleaning for several fines, and the lens holder was detached. Accordingly, the moth-eye ultraviolet-curable replication sheet that is bent in the shape of the convex lens was produced.

Next, on a concave-convex pattern of the moth-eye ultraviolet-curable replication sheet bent in the shape of the convex lens, a conduction film formed by a nickel film was formed by using an electroless plating method or the like. Next, the optical disc master on which the conduction film had been formed was installed to an electroforming device, and a nickel plating layer was formed on the conduction film so as to have a thickness of about 300±5 [μm] by using an electric plating method. Next, the nickel plating layer is detached from the moth-eye ultraviolet-curable replication sheet by using a cutter or the like, and the photoresist on the signal forming surface of the nickel plating layer is cleaned by using acetone or the like, thereby a moth-eye Ni metal master that is bent in the shape of the convex lens was produced.

Next, the moth-eye molding replication substrate bent in the shape of the convex lens was produced as below. The moth-eye Ni metal master bent in the shape of the convex lens was arranged in a die, and the substrate was molded through injection molding by using transparent resin of polycarbonate (refractive index of 1.59). Accordingly, an approximately hexagonal lattice pattern formed on the signal forming surface was transferred to the transparent resin, and thereby the moth-eye molding replication substrate bent in the shape of the convex lens was produced.

Evaluation of Reflexivity and Transmissivity

Figure 33:
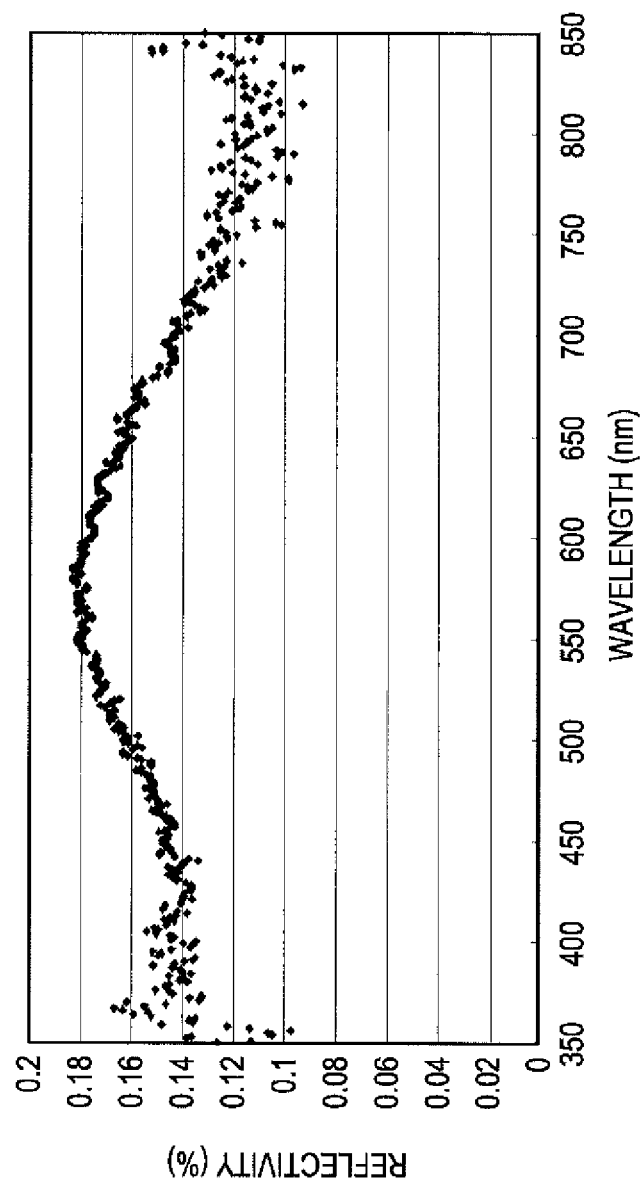
FIG. 33 is a graph representing the dependency of the reflectivity of the optical device of Example 5 on the wavelength.

The reflectivity and the transmissivity of the optical device of Example 5 were evaluated by using an evaluation device (V-550) manufactured by JASCO Corporation. FIG. 33 shows the dependency of the reflectivity of the optical device of Example 5 on the wavelength.

Example 6

By adjusting the frequency of the polarity inverting formatter signal, the number of revolutions of the roll, and the appropriate transmission pitch for each single track, a quasi-hexagonal lattice pattern was recorded in the resist layer by patterning the resist layer. Other than that, the optical device was produced similarly to Example 1.

Example 7

By adjusting the frequency of the polarity inverting formatter signal, the number of revolutions of the roll, and the appropriate transmission pitch for each single track, a tetragonal lattice pattern was recorded in the resist layer by patterning the resist layer. Other than that, the optical device was produced similarly to Example 1.

Example 8

By adjusting the frequency of the polarity inverting formatter signal, the number of revolutions of the roll, and the appropriate transmission pitch for each single track, a tetragonal lattice pattern was recorded in the resist layer by patterning the resist layer. Other than that, the optical device was produced, similarly to Example 1.

Evaluation of Shape

The optical devices of Examples 6 to 8 produced as described above were observed by using a scanning electron microscope (SEM) as a top view. The result is shown in Table 4.

TABLE 4

Figure 27:
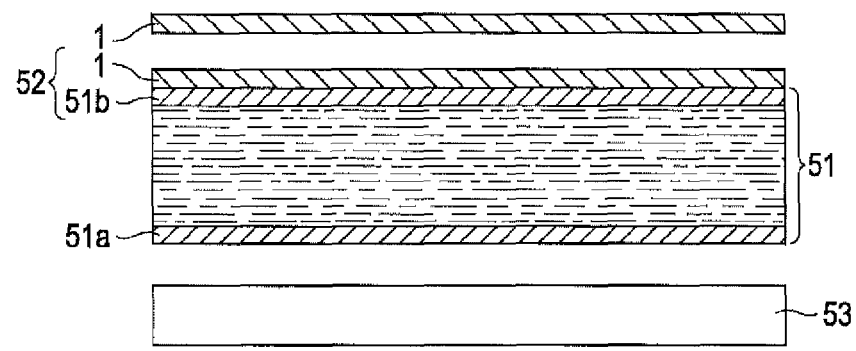
FIG. 27 shows an example of the configuration of a liquid crystal display device according to a seventh embodiment.

|  | Example 6 | Example 8 | Example 7 |
| --- | --- | --- | --- |
| SEM Image | FIG. 26 | FIG. 27 | FIG. 28 |
| Lattice Pattern | Quasi-Hexagonal Lattice | Tetragonal Lattice | Tetragonal Lattice |
| Shape of Bottom Surface of Structural Body | Ellipse | Ellipse | Ellipse |
| Height H2 in Row Direction | 317 nm | 218 nm | 279 nm |
| Arrangement pitch P1 | 315 nm | 280 nm | 300 nm |
| Pitch of Tracks | 250 nm | 140 nm | 150 nm |
| Arrangement pitch P2 | 296 nm | 198.0 nm | 212.1 nm |

Figure 34:
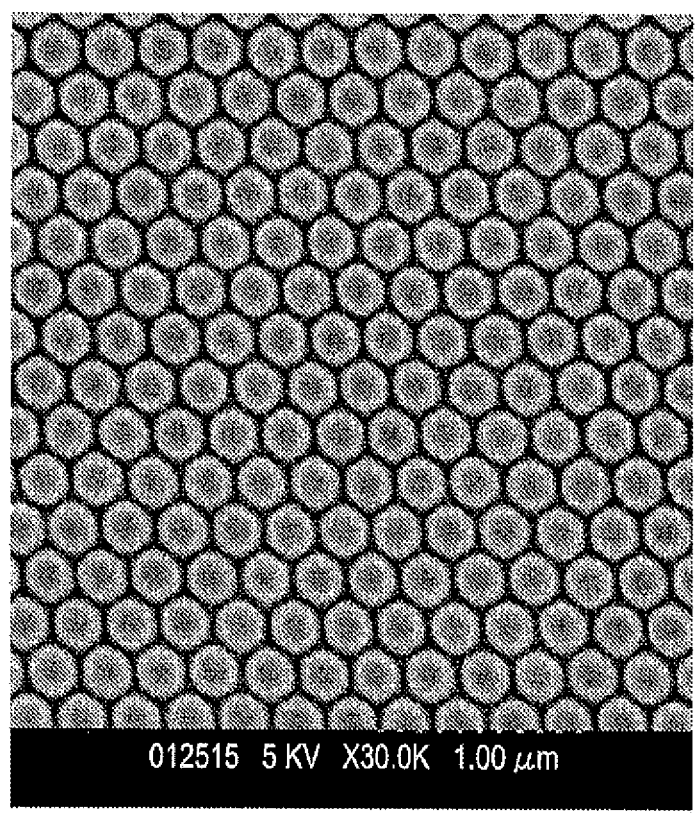
FIG. 34 is an SEM picture showing the top view of an optical device of Example 6.

Based on FIG. 34, it is found that the structural bodies are arranged in the shape of a quasi-hexagonal lattice in Example 6. In addition, it is found that the shape of the bottom surface of the structural body is an elliptic shape.

Figure 35:
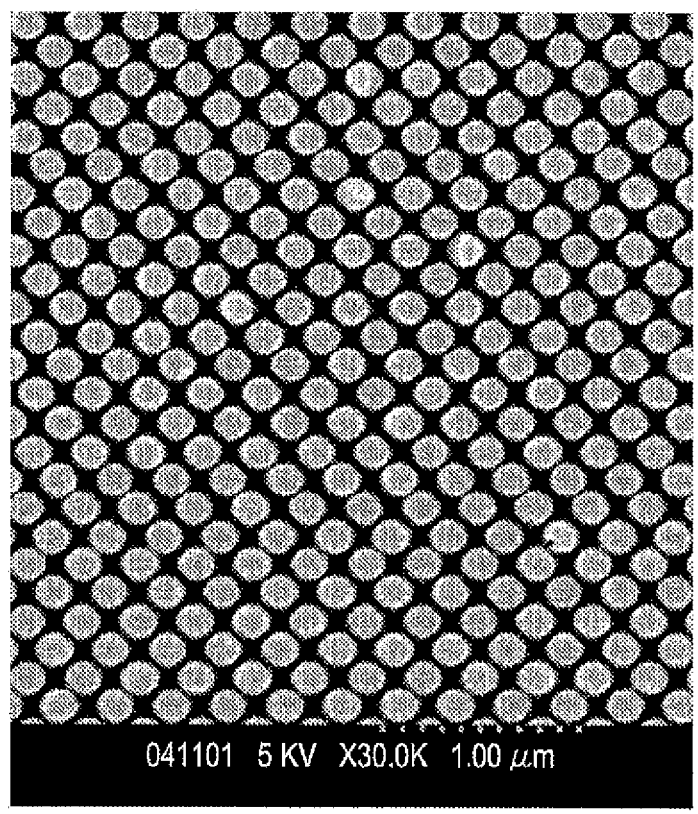
FIG. 35 is an SEM picture showing the top view of an optical device of Example 7.
Figure 36:
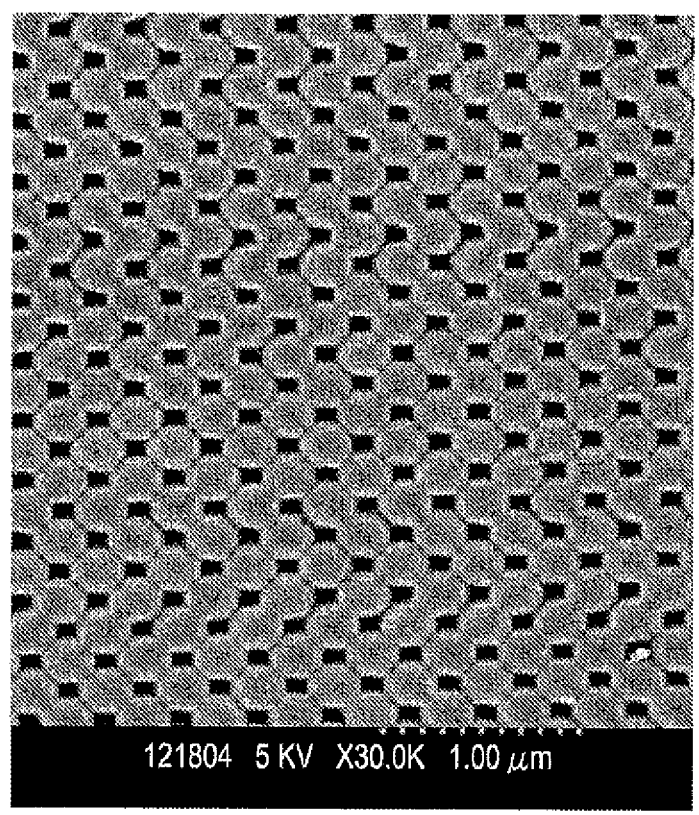
FIG. 36 is an SEM picture showing the top view of an optical device of Example 8.

Based on FIGS. 35 and 36, it is found that the structural bodies are arranged in the shape of a tetragonal lattice in Examples 7 and 8. In addition, it is found that the shape of the bottom surface of the structural body is an elliptic shape. In addition, it is found that the lower portions of the structural bodies are arranged so as to overlap each other in Example 8.

Next, the relationship between the height of the structural body and the reflectivity was reviewed through RCWA (Rigorous Coupled Wave Analysis) simulation.

Experimental Example 1

Figure 37:
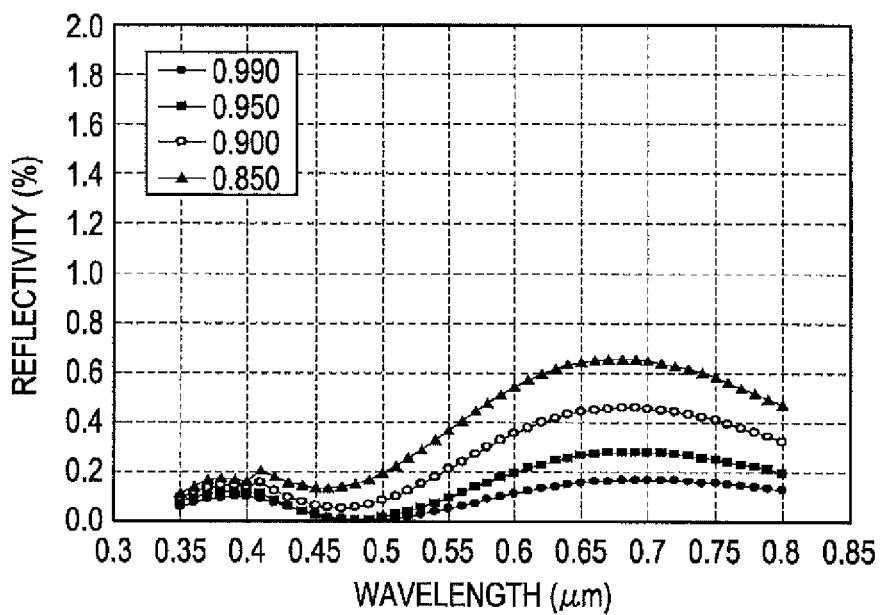
FIG. 37 is a graph representing the result of simulation of Experimental Example 1.

The RCWA simulation was performed with the diameter 2r of the bottom surface of the structural body being set to 85%, 90%, 95%, and 99% of the arrangement pitch P1. The result is shown in FIG. 37.

The conditions of the simulation are represented as below.
Shape of Structural Body: Bell Type
Polarization: Non Polarization
Refractive Index: 1.48
Track Pitch Tp: 320 nm
Height of Structural Bodies: 365 nm
Aspect Ratio: 1.14
Arrangement of Structural Bodies: Hexagonal Lattice Based on FIG. 37, it is found that the reflectivity deteriorates when the packing ratio decreases by changing the size of the diameter of the bottom surface of the structural body.

Experimental Example 2

The RCWA simulation was performed, similarly to Experimental Example 1 except for arranging a low protruded portion having the aspect ratio of 0.3 between the structural bodies in the track direction. The result is represented in FIG. 38.

Figure 38:
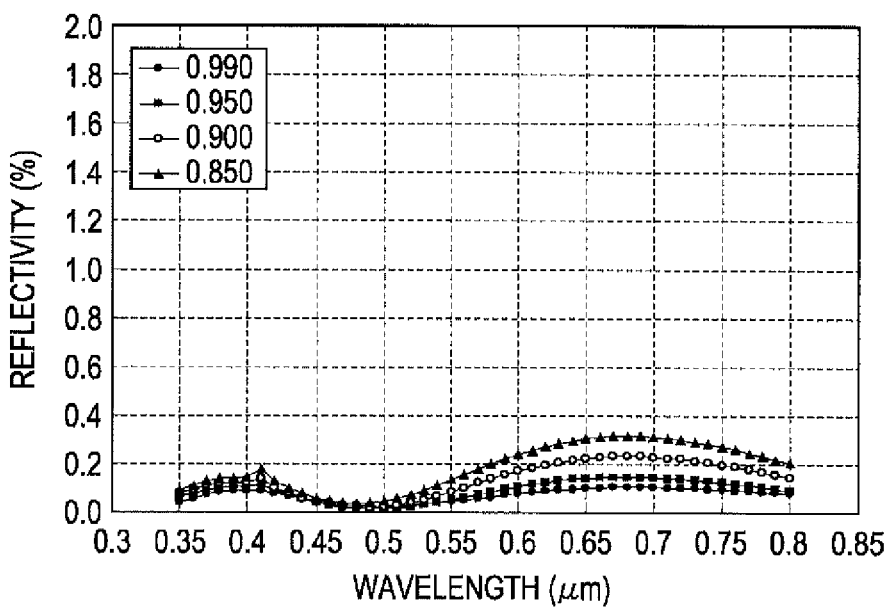
FIG. 38 is a graph representing the result of simulation of Experimental Example 2.

Based on FIG. 38, it is found that, in a case where there is a low protruded portion between the structural bodies in the track direction, the reflectivity can be suppressed to be low even when the packing ratio is decreased.

Experimental Example 3

Figure 39:
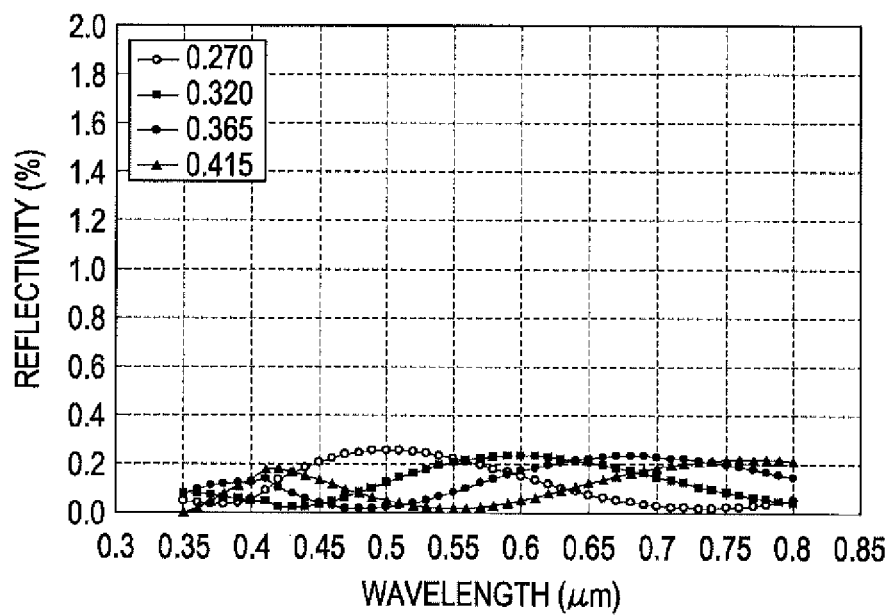
FIG. 39 is a graph representing the result of simulation of Experimental Example 3.

The RCWA simulation was performed under the following conditions with a low protruded portion as a layer that is ¼ of the height of the structural body being arranged between the structural bodies in the track direction by changing the height of the structural bodies. The result is represented in FIG. 39.
Shape of Structural Body: Bell Type
Polarization: Non Polarization
Refractive Index: 1.48
Track Pitch Tp: 320 nm
Diameter of Bottom Surface of Structural Body: 90% of Track Pitch Tp
Aspect Ratio: 0.93, 1.00, 1.14, and 1.30 (Height: 0.270, 0.320, 0.385, and 0.415 μm)
Arrangement of Structural Bodies: Hexagonal Lattice

Experimental Example 4

Figure 40:
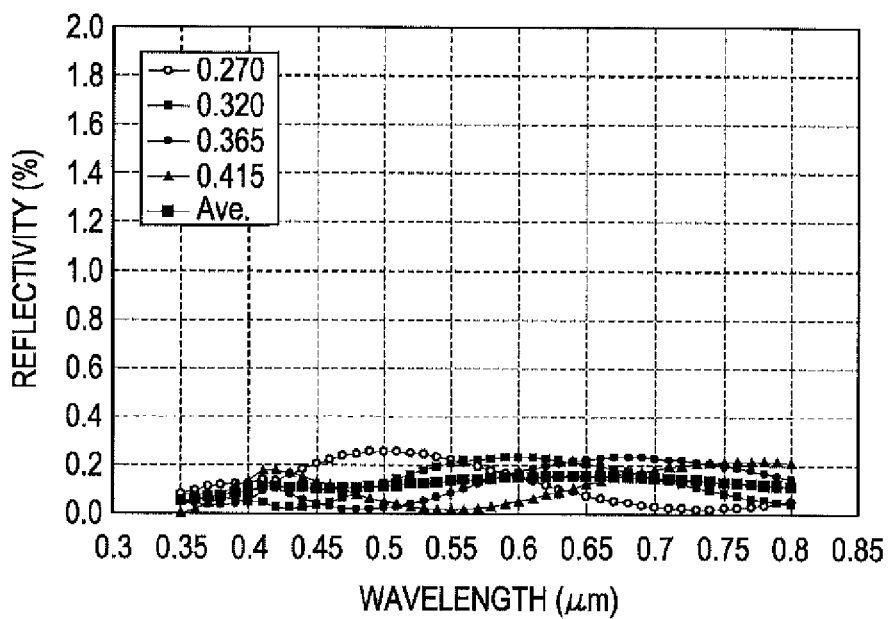
FIG. 40 is a graph representing the result of simulation of Experimental Example 4.

The result (Ave.) of a case where structural bodies having the heights of Experimental Example 3 are placed at the same ratio so as to have a depth distribution, which is added to the graph of Experimental Example 3, is shown in FIG. 40.

Based on FIGS. 39 and 40, it is found that a low reflection characteristic having low dependency on the wavelength can be acquired by arranging a low protruded portion between the structural bodies in the track direction and allowing the structural bodies to have a height distribution.

Experimental Example 5

Figure 41:
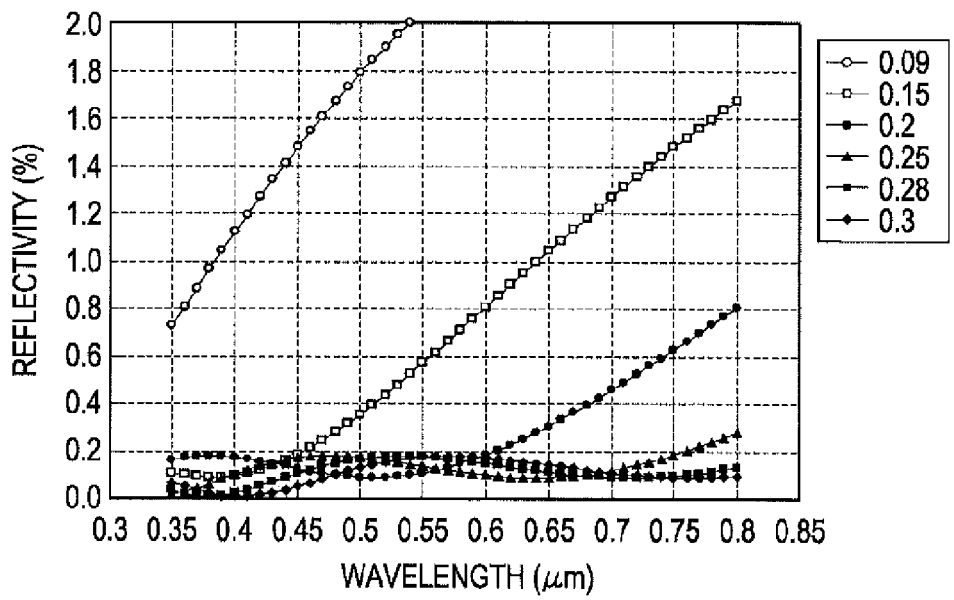
FIG. 41 is a graph representing the result of simulation of Experimental Example 5.
Figure 43:
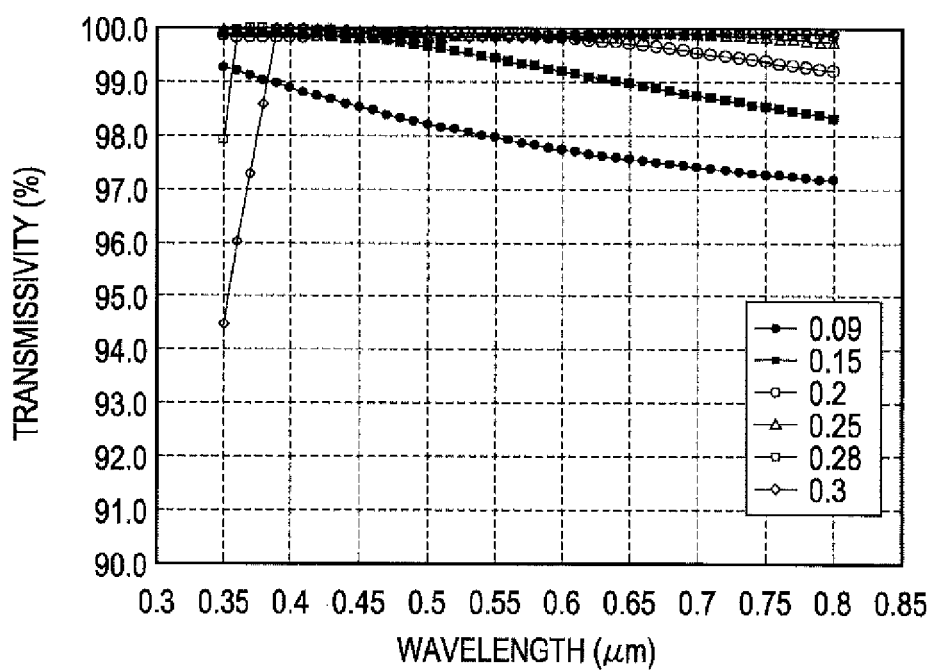
FIG. 43 is a graph representing the result of simulation of Experimental Example 5.

The RCWA simulation was performed by changing the track pitch. The result is represented in FIGS. 41 and 43.

The conditions of the simulation are represented as below.
Shape of Structural Body: Bell Type
Polarization: Non Polarization
Lattice Arrangement: Hexagonal Lattice
Refractive Index: 1.48
Track Pitch Tp: 0.09 to 0.30 μm
Height of Structural Body: 0.09 to 0.30 μm
Aspect Ratio: 1.0 (uniform)
Diameter of Bottom Surface of Structural Body: 99% of Track
Pitch Tp (Packing Ratio: Approximately Maximum)

Experimental Example 6

The RCWA simulation was performed under the same conditions as those of Experimental Example 5 except for arrangement of fine protruded portions around the structural bodies. The result is represented in FIG. 42.

Figure 42:
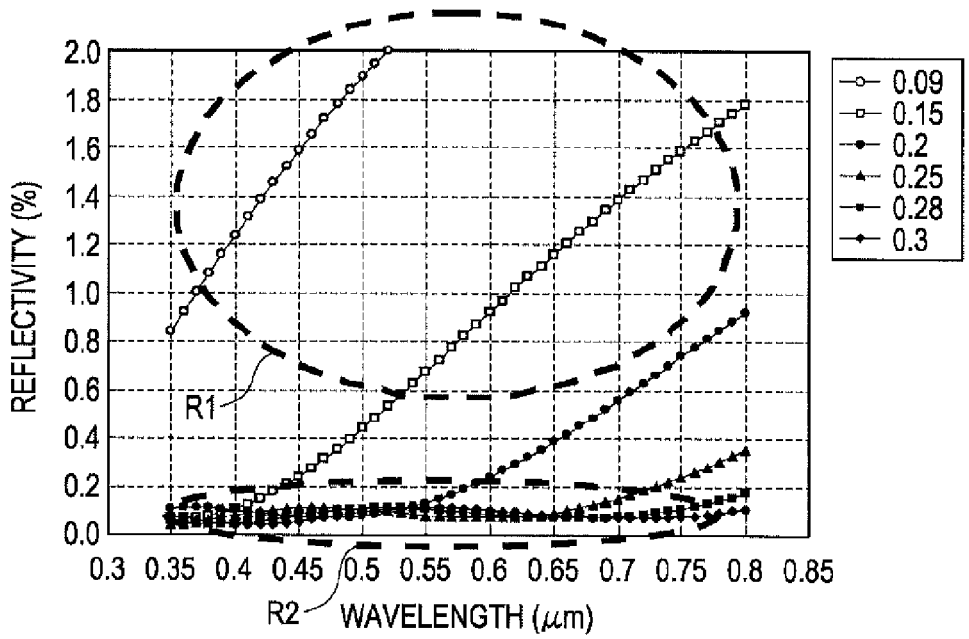
FIG. 42 is a graph representing the result of simulation of Experimental Example 6.

Based on FIGS. 41 and 42, it is found that, in a case where the track pitch Tp is large, when fine protruded portions are disposed around the structural bodies, the reflectivity tends to decrease, but when the structural bodies are small, the reflectivity tends to deteriorate on the contrary (particularly, see regions R1 and R2 in FIG. 42).

In addition, based on FIG. 43, it is found that, when the track pitch Tp is 0.3 μm, suppression of diffraction tends to decrease at the wavelength of 400 nm.

Experimental Example 7

Figure 44A:
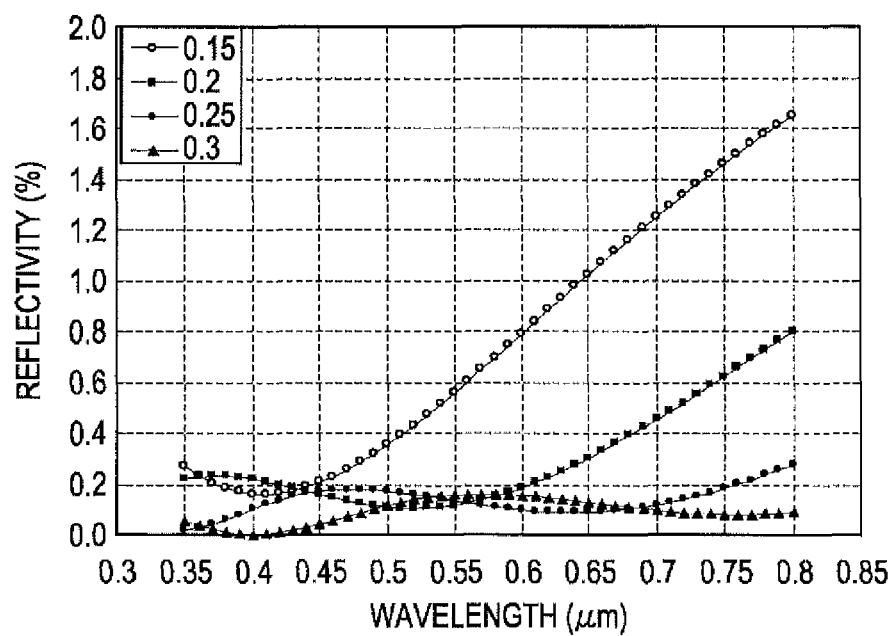
FIG. 44A is a graph representing the result of simulation of Experimental Example 7.

The RCWA simulation was performed with the track pitch of 0.25 μm while changing the height of the structural bodies and the aspect ratio. The result is represented in FIG. 44A.

The conditions of the simulation are represented as below.
Shape of Structural Body: Bell Type
Polarization: Non Polarization
Lattice Arrangement: Hexagonal Lattice
Refractive Index: 1.48
Track Pitch Tp: 0.25 μm
Height of Structural Body: 0.15 nm, 0.2 nm, 0.25 nm, and 0.3 nm
Aspect Ratio: 0.6, 0.8, 1.0, and 1.2
Diameter of Bottom Surface of Structural Body: 99% of Track Pitch Tp

Experimental Example 8

Figure 44B:
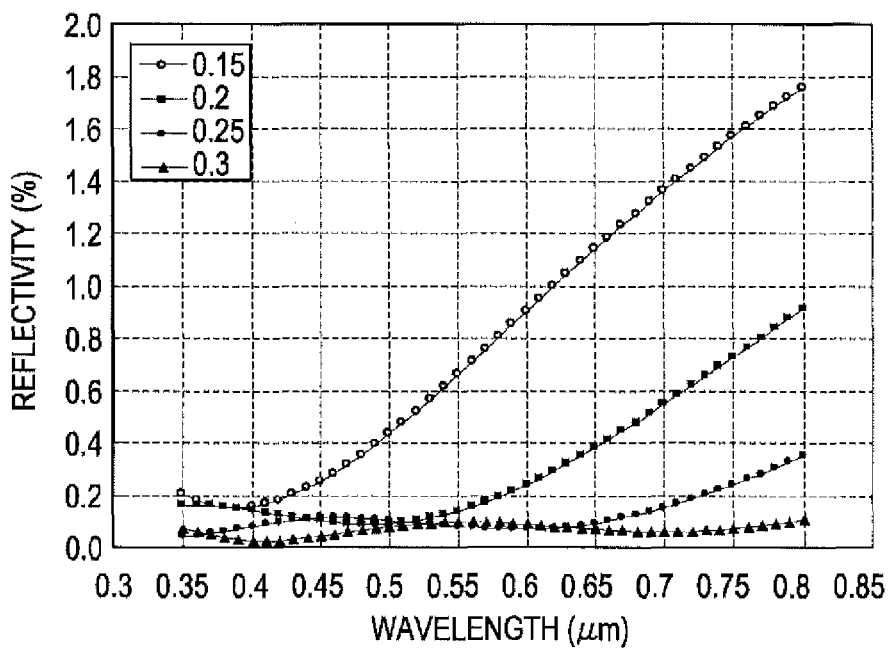
FIG. 44B is a graph representing the result of simulation of Experimental Example 8.

The RCWA simulation was performed under the same conditions as those of Experimental Example 7 except for disposition of fine protruded portions around the structural bodies. The result is represented in FIG. 44B.

Experimental Example 9

Figure 45A:
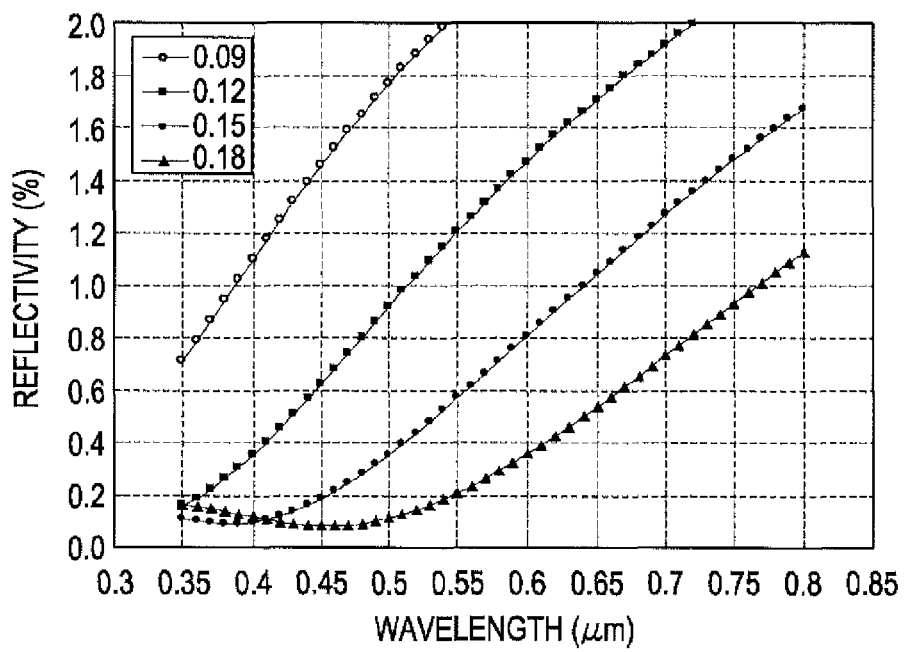
FIG. 45A is a graph representing the result of simulation of Experimental Example 9.

The RCWA simulation was performed under the same conditions as those of Experimental Example 7 except for setting the track pitch to 0.15 μm, the height of the structural bodies to 0.09 μm, 0.12 μm, 0.15 μm, and 0.18 μm, and the aspect ratio to 0.6, 0.8, 1.0, and 1.2. The result is represented in FIG. 45A.

Experimental Example 10

Figure 45B:
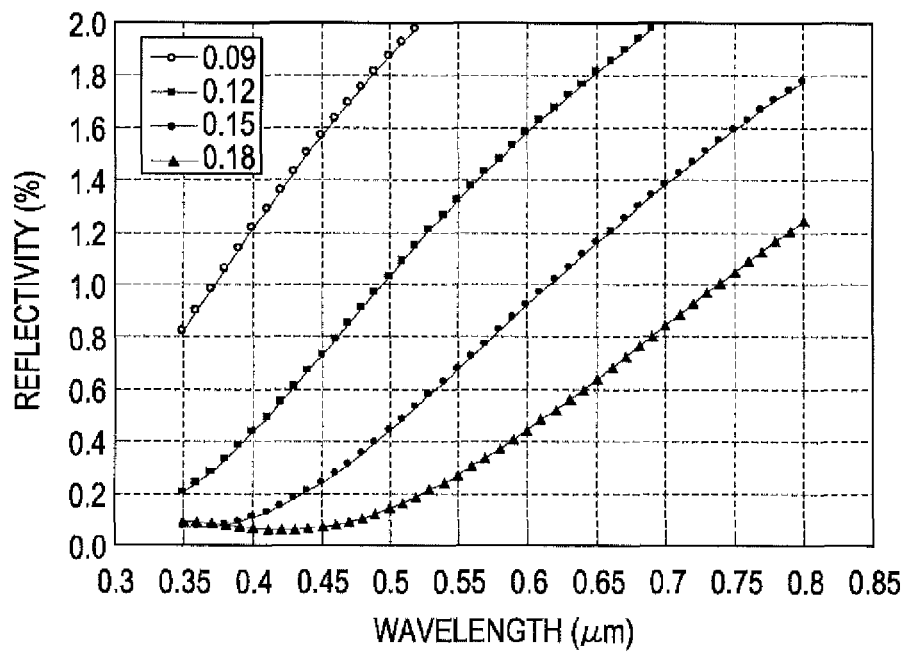
FIG. 45B is a graph representing the result of simulation of Experimental Example 10.

The RCWA simulation was performed under the same conditions as those of Experimental Example 9 except for disposition of fine protruded portions around the structural bodies. The result is represented in FIG. 45B.

Experimental Example 11

Figure 46A:
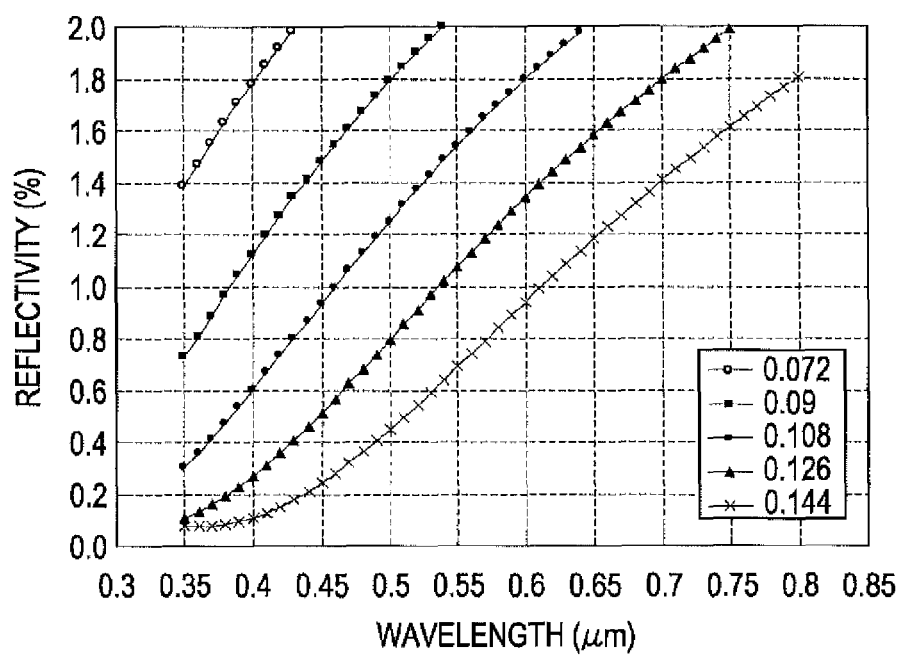
FIG. 46A is a graph representing the result of simulation of Experimental Example 11.

The track pitch was set to 0.09 µm, the height of the structural bodies was set to 0.072 µm, 0.09 µm, 0.108 µm, 0.126 µm, and 0.144 µm, and the aspect ratio was set to 0.8, 1.0, 1.2, 1.4, and 1.6. The conditions other than that were the same as those of Experimental Example 7, and the RCWA simulation was performed. The result is represented in FIG. 46A.

Experimental Example 12

The RCWA simulation was performed under the same conditions as those of Experimental Example 11 except for disposition of fine protruded portions around the structural bodies. The result is represented in FIG. 46B.

Figure 46B:
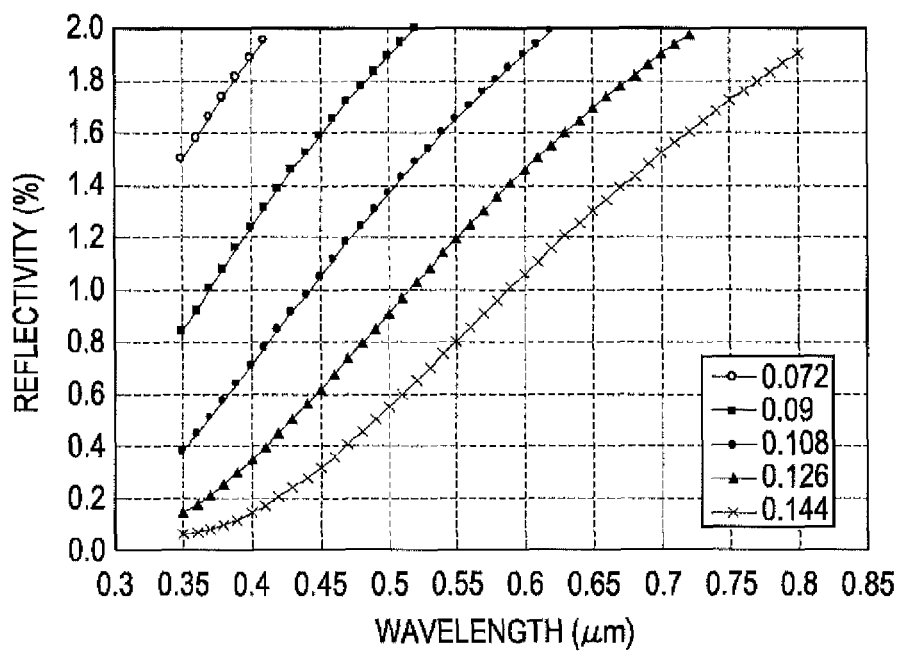
FIG. 46B is a graph representing the result of simulation of Experimental Example 12.

Based on FIGS. 44A, to 46B, in order to suppress the reflectivity R to be equal to or less than 1%, the limit of the track pitch Tp is thought to be 0.15 µm, and the limit of the aspect ratio is thought to be 1.0. In addition, it is found that, even in a case where the fine protruded portions are disposed, when the track pitch Tp is small, the effect of suppression of the reflectivity tends to decrease.

Next, the relationship between the ratio ((2r/P1)×100) and the antireflection characteristic was reviewed trough the RCWA (Rigorous Coupled Wave Analysis) simulation.

Experimental Example 13

Figure 47A:
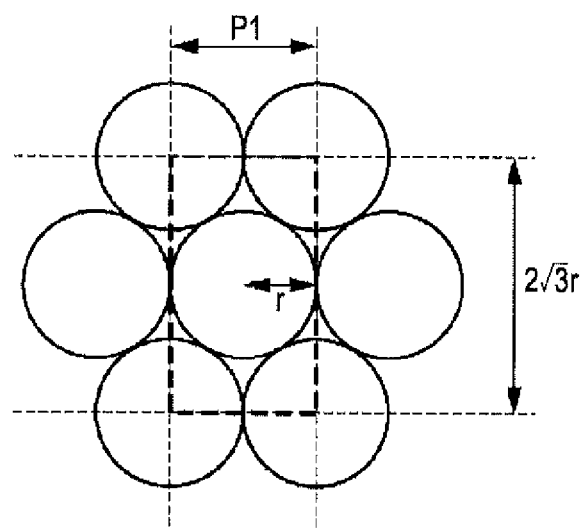
FIG. 47A is a diagram illustrating the packing ratio when the structural bodies are arranged in a hexagonal lattice shape.

FIG. 47A is a diagram illustrating the packing ratio when the structural bodies are arranged in a hexagonal lattice shape. As shown in FIG. 47A, in a case where the structural bodies are arranged in a hexagonal lattice shape, the packing ratio when the ratio (2r/P1)×100 (here, P1 is an arrangement pitch of the structural bodies within the same track, and r is the radius of the bottom surface of the structural bodies) was changed was calculated by using Equation (2).

$$\text{Packing Ratio}=(S(\text{hex.})/S(\text{unit}))\times 100 \qquad \text{Equation (2)}$$

Here, the unit lattice area $S(\text{unit})=2r\times(2\sqrt{3})r$, and the area of the bottom surface of the structural bodies existing within the unit lattice $S(\text{hex.})=2\times\pi r^2$ (here, when 2r>P1, the unit lattice area is calculated by drawing).

For example, when the arrangement pitch P1=2, and the radius of the bottom surface of the structural body r=1, S(unit), S(hex.), and the ratio((2r/P1)×100), and the packing ratio have the following values.

S(unit)=6.9282
S(hex.)=6.28319
(2r/P1)×100=100.0%
Packing Ratio=(S(hex.)/S(unit))×100=90.7%

In Table 5, the relationship between the packing ratio calculated by using the above-described Equation (2) and the ratio ((2r/P1)×100).

TABLE 5

| (2r/P1) × 100 | Packing Ratio |
|---|---|
| 115.4% | 100.0% |
| 100.0% | 90.7% |
| 99.0% | 88.9% |
| 95.0% | 81.8% |
| 90.0% | 73.5% |
| 85.0% | 65.5% |

TABLE 5-continued

| (2r/P1) × 100 | Packing Ratio |
|---|---|
| 80.0% | 58.0% |
| 75.0% | 51.0% |

Experimental Example 14

Figure 47B:
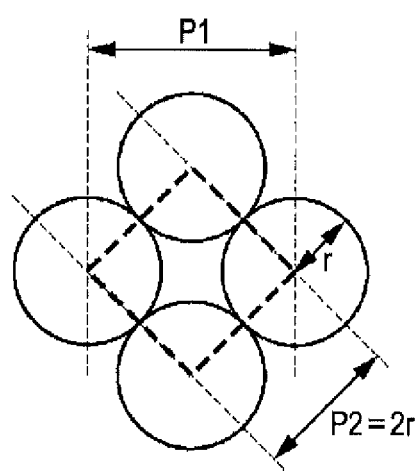
FIG. 47B is a diagram illustrating the packing ratio when the structural bodies are arranged in a tetragonal lattice shape.

FIG. 47B is a diagram illustrating the packing ratio when the structural bodies are arranged in a tetragonal lattice shape. As shown in FIG. 47B, in a case where the structural bodies are arranged in a tetragonal lattice shape, the packing ratio when the ratio (2r/P1)×100 and the ratio (2r/P2)×100 (here, P1 is the arrangement pitch of the structural bodies within the same track, P2 is the arrangement pitch in the direction of 45 degrees with respect to the track, and r is the radius of the bottom surface of the structural body) were changed was calculated by using the following Equation (3).

$$\text{Packing Ratio}=(S(\text{tetra})/S(\text{unit}))\times 100 \qquad \text{Equation (3)}$$

Here, the unit lattice area $S(\text{unit})=2r\times 2r$, and the area of the bottom surface of the structural bodies existing within the unit lattice $S(\text{tetra})=\pi r^2$ (here, when 2r>P1, the unit lattice area is calculated by drawing).

For example, when the arrangement pitch P2=2, and the radius of the bottom surface of the structural body r=1, S(unit), S(tetra), the ratio ((2r/P1)×100), the ratio ((2r/P2)×100), and the packing ratio have the following values.

S(unit)=4
S(tetra)=3.14159
(2r/P1)×100=70.7%
(2r/P2)×100=00.0%
Packing Ratio=(S(tetra)/S(unit))×100=78.5%

In Table 6, the relationship of the packing ratio calculated by using the above-described Equation (3), the ratio ((2r/P1)×100), and the ratio ((2r/P2)×100) is shown.

In addition, the relationship between the arrangement pitches P1 and P2 of the tetragonal lattice is $P1=\sqrt{2}\times P2$.

TABLE 6

| (2r/P1) × 100 | (2r/P2) × 100 | Packing Ratio |
|---|---|---|
| 100.0% | 141.4% | 100.0% |
| 84.9% | 120.0% | 95.1% |
| 81.3% | 115.0% | 92.4% |
| 77.8% | 110.0% | 88.9% |
| 74.2% | 105.0% | 84.4% |
| 70.7% | 100.0% | 78.5% |
| 70.0% | 99.0% | 77.0% |
| 67.2% | 95.0% | 70.9% |
| 63.6% | 90.0% | 63.6% |
| 60.1% | 85.0% | 56.7% |
| 56.6% | 80.0% | 50.3% |
| 53.0% | 75.0% | 44.2% |

Experimental Example 15

Figure 48:
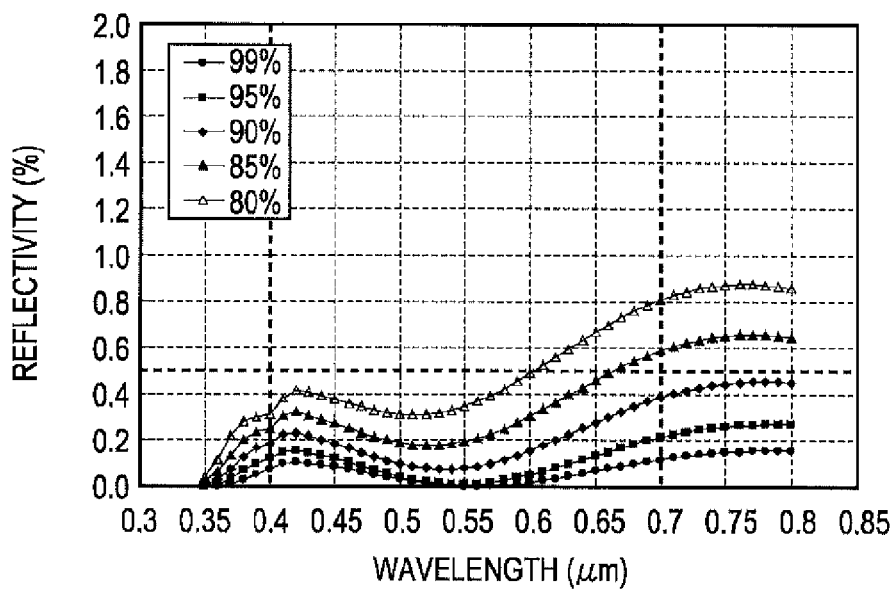
FIG. 48 is a graph representing the result of simulation of Experimental Example 15.

The reflectivity was calculated through simulation under the following conditions while the ratio ((2r/P1)×100) of the diameter 2r of the bottom surface of the structural body to the arrangement pitch P1 is set to 80%, 85%, 90%, 95%, and 99%. The resultant graph is shown in FIG. 48.

Shape of Structural Body: Bell Type
Polarization: Non Polarization
Refractive Index: 1.48
Arrangement pitch P1: 320 nm Height of Structural Body: 415 nm
Aspect Ratio: 1.30
Arrangement of Structural Body: Hexagonal Lattice Based on FIG. 48, when the ratio $((2r/P1)\times100)$ is equal to or higher than 85%, the average reflectivity R becomes "R<0.5%" for the wavelength band (0.4 to 0.7 μm) of the visible band. Accordingly, a sufficient antireflection effect can be acquired. At this time, the packing ratio of the bottom surface is equal to or higher than 65%. In addition, when the ratio $((2r/P1)\times100)$ is equal to or higher than 90%, the average reflectivity R becomes "R<0.3%" for the wavelength band of the visible band. Accordingly, a higher antireflection effect can be acquired. At this time, the packing ratio of the bottom surface is equal to or higher than 73%. The upper limit of the packing ratio is 100%, and as the packing ratio becomes higher, the performance is further improved. In a case where the structural bodies overlap with each other, the height of the structural body is assumed to be a height from the lowest position. In addition, the tendency of the packing ratio and the reflectivity was checked to be the same for a tetragonal lattice.

Example 9

First, a glass master having a disk shape is prepared, and a resist is attached to the surface of the glass master as a film as described below. In other words, a photo resist was diluted with thinner at the rate of 1/10, and by coating the diluted resist so as to have a thickness of about 130 nm on one principal surface of the glass master by using a spin coating method, and thereby a resist layer was formed. Next, by transporting the glass master as a recording medium to a disc master exposure device shown in FIG. 19 and exposing the resist layer, a latent image forming a tetragonal lattice pattern between tracks of three adjacent tracks was patterned in the resist layer.

Described in detail, laser beams having the power of 0.50 mW/m that expose up to the surface of the glass master are irradiated for an area in which the tetragonal lattice pattern is to be formed, and thereby a tetragonal lattice pattern having a concave shape was formed. In addition, the thickness of the resist in the row direction of the track row was about 120 nm, and the thickness of the resist in the extending direction of the track was about 100 nm.

Next, by performing a developing process for the resist layer on the glass master, the resist layer positioned in the exposed portion was dissolved so as to be developed. Described in detail, an undeveloped glass master was placed on a turntable of a developing unit not shown in the figure. Then, while the turntable was rotated, developer was dropped to the surface of the glass master, and thereby the resist on the surface was developed. Accordingly, a resist glass master of which the resist layer was open in a tetragonal lattice pattern could be acquired.

Next, a plasma etching process was performed at the atmosphere of $CHF_3$ gas. Accordingly, on the surface of the glass master, only the part of the tetragonal lattice pattern exposed from the resist layer was etched, and the other area was not etched due to the photoresist serving as a mask. Therefore, concave portions having an elliptic cone shape could be acquired. The etching amount (depth) of the pattern at this time was changed in accordance with the etching time. Finally, the resist layer was completely eliminated through $O_2$ ashing.

Accordingly, a disc master having a tetragonal lattice pattern in which the arrangement pitch P1 in the circumferential direction was 250 nm, and the depth of the concave portion was 285 nm could be acquired. The concave-convex shape of the disc master was observed through the AFM, and the depth of the concave portion in the row direction was larger than the depth of the concave portion in the extending direction of the track.

Next, a resin layer was formed by coating the glass substrate with a film forming composition containing siloxane resin by using a spin coating method. Next, an optical device was produced by pressing the disc master (mold) against the resin layer and then detaching the disc master.

Example 10

By adjusting the frequency of the polarity inverting formatter signal, the number of revolutions of the master, and the appropriate transmission pitch for each single track, a quasi-hexagonal lattice pattern was recorded in the resist layer by patterning the resist layer. Other than that, the disc master having the configuration described below was produced, similarly to Example 9.

Arrangement pitch P1 in Circumferential Direction: 270 nm
Arrangement pitch P2 in Direction of 60 Degrees (Direction of about −60 degrees) with respect to Circumferential Direction: 240 nm
Depth of Concave Portion: 184 nm
Lattice Pattern: Quasi-Hexagonal Lattice Pattern Comparative Example 1

High-quality glass (manufactured by Japan Electric Glass Corp.) that is used as cover glass in the market was prepared as a sample.

Comparative Example 2

A sample optical device was acquired by forming multi-layer ARs having about 5 to 10 layers on both surfaces of cover glass.

Evaluation of Reflectivity and Transmissivity

Figure 49:
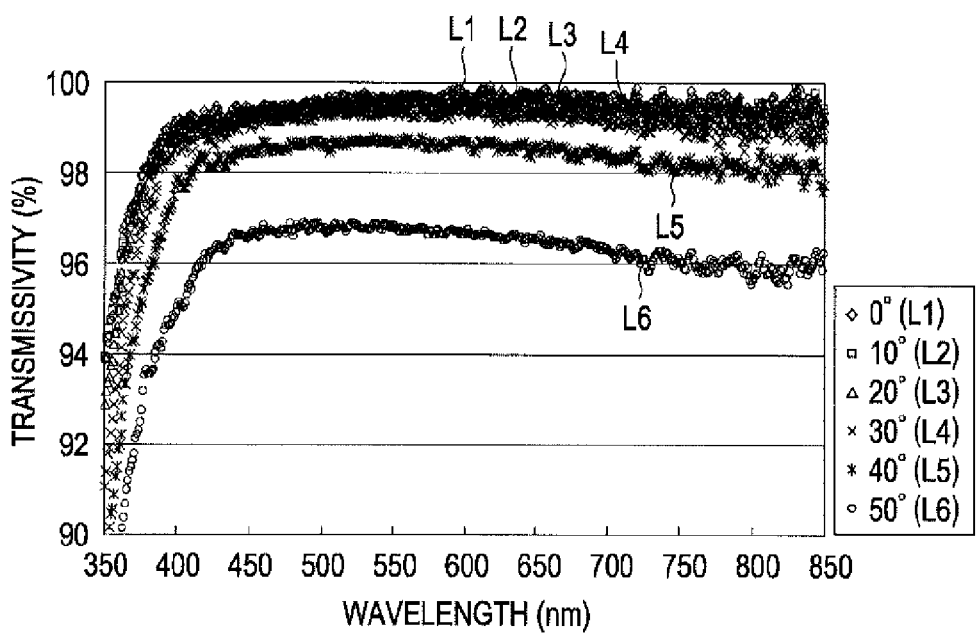
FIG. 49 is a graph showing the transmission characteristic of an optical device of Example 9.
Figure 50A:
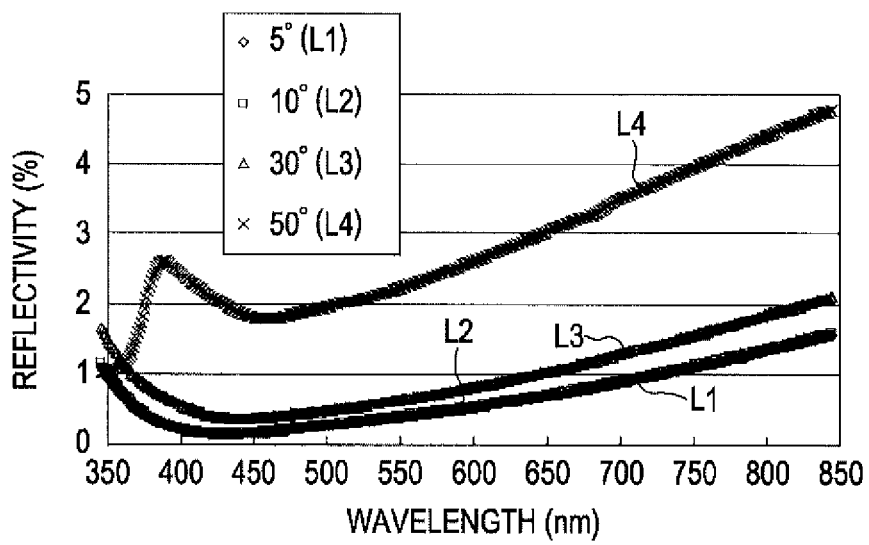
FIG. 50A is a graph showing the reflection characteristic of an optical device of Example 10.
Figure 50B:
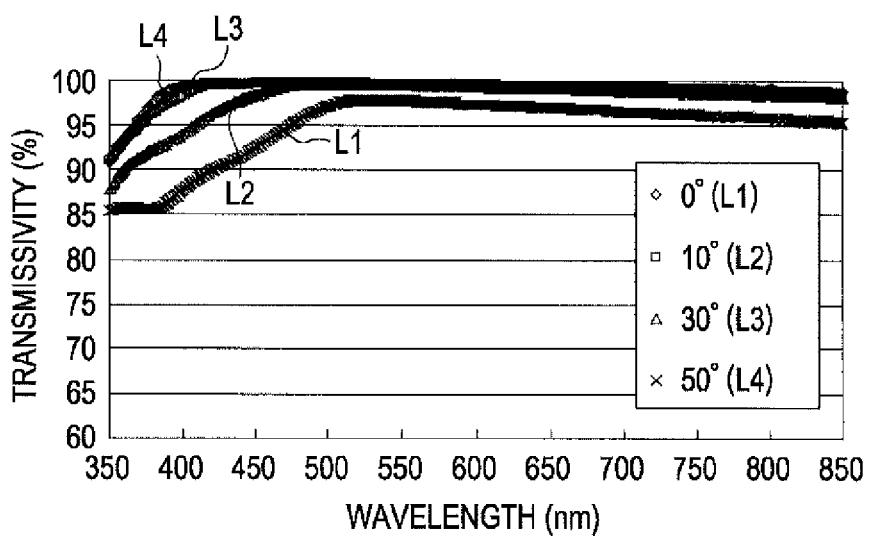
FIG. 50B is a graph showing the transmission characteristic of an optical device of Example 10.
Figure 51A:
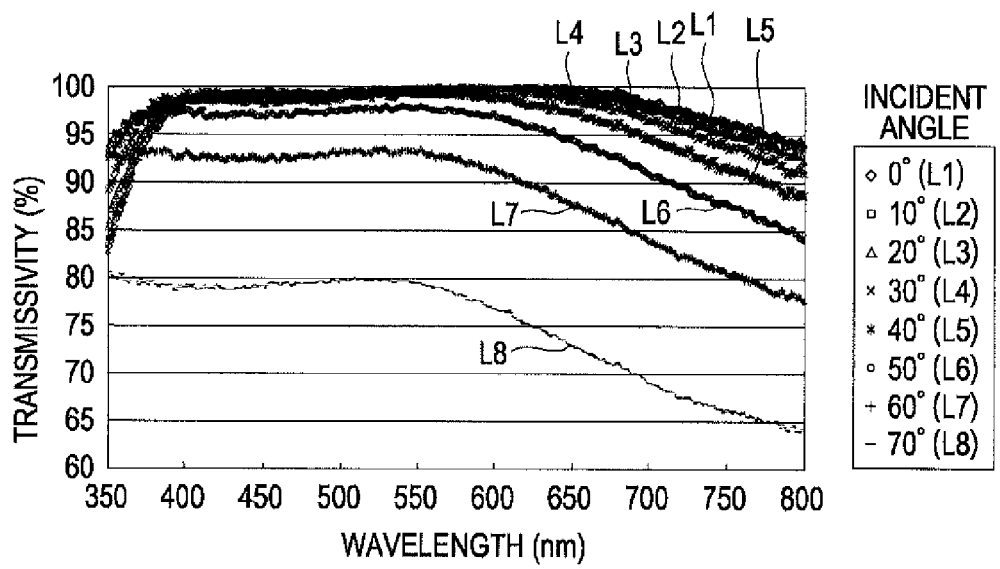
FIG. 51A is a graph showing the transmission characteristic of an optical device of Comparative Example 1.
Figure 51B:
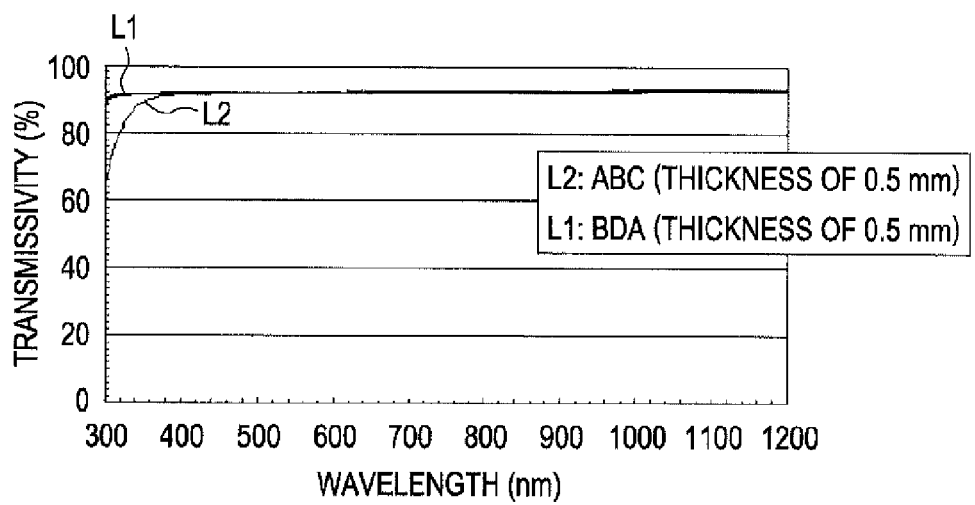
FIG. 51B is a graph showing the transmission characteristic of an optical device of Comparative Example 2.

The reflectivity and the transmissivity of the optical devices of Examples 9 and 10 and Comparative Examples 1 and 2 were evaluated by using an evaluation device (V-550) manufactured by JASCO Corporation. FIG. 49 shows the transmission characteristic of the optical device of Example 9. In addition, FIGS. 50A and 50B show the reflection characteristic and the transmission characteristic of the optical device of Example 10. FIG. 51A shows the transmission characteristic of the optical device of Comparative Example 2. In addition, FIG. 51B shows the transmission characteristic of the optical device of Comparative Example 1 that was separately measured.

In Comparative Example 1, a ghost is generated due to reflection 5% from the front surface and the rear surface of the cover glass.

In Comparative Example 2, multi-layer ARs having about 5 to 10 layers are disposed on both faces of the cover glass for improving the transmission characteristic, so that, it becomes difficult to generate a ghost. However, the transmission characteristic tends to deteriorate for the wavelength that is longer than the wavelength 650 nm of red. In addition, a reflow process at 230° C. is performed for the cover glass of the image sensor device for about 30 fines, and the cover glass has the heat resistance.

In Example 9, the transmission characteristic scarcely deteriorate even for the wavelength band corresponding to a wavelength that is longer than the wavelength 650 nm of red, and a superior transmission characteristic for the band (wavelength 400 nm to 850 nm) of visible light is acquired.

In Example 10, the reflectivity tends to increase in accordance with an increase in the wavelength for light incident at the incident angle of 50 degrees. However, for incident light having the incident angle of 30 degrees or less, the reflectivity tends to slightly increase but is suppressed to be equal to or less than 2%. Accordingly, a superior antireflection characteristic is acquired. In addition, in Example 10, similarly to Example 9, a superior transmission characteristic for the band of visible light (wavelength 400 nm to 850 nm) is acquired.

As presented above, examples of the present application have been described as antireflection substrates. However, the above-described examples can be variously changed or modified based on the technical idea of the present application.

As presented above, the embodiments and examples of the present application have been concretely described. However, the present application is not limited thereto and may be variously changed or modified based on the technical idea of the present application.

For example, the configurations, the methods, the shapes, the materials, the numeric values, and the like that have been described in the above-described embodiments and examples are merely examples. Thus, as is necessary, a configuration, a method, a shape, a material, a numeric value, or the like that is different from that of the embodiments or the examples may be used.

In addition, the configurations of the above-described embodiments can be combined together without departing from the concept of the present application.

In addition, in the above-described embodiments, cases where an embodiment is applied to a liquid crystal display device have been described as examples. However, an embodiment can be applied to various display devices other than the liquid crystal display device. For example, an embodiment can be applied to various display devices such as a cathode ray tube (CRT) display, a plasma display panel (PDP), an electroluminescence (EL) display, and a surface-conduction electron-emitter display (SED).

In addition, in the above-described embodiment, a peep preventing function may be implemented in the optical device by appropriately changing the pitch of the structural bodies and generating diffracted light in the direction tilted with respect to the front side.

In addition, in the above-described embodiments, on the surface of the base on which the structural bodies are formed, a low-refraction layer may be further formed. The low-refraction layer preferably has a material having the refractive index that is lower than those of the materials configuring the base and the structural bodies as its major component. As such a low-refraction layer, for example, there is an organic material such as fluorine resin or an inorganic low-refraction material such as LiF or $MgF_2$.

In addition, in the above-describe embodiments, a case where the optical device is manufactured by using photosensitive resin has been described as an example. However, the method of manufacturing the optical device is not limited thereto. For example, the optical device may be manufactured by heat transfer or ejection molding.

In addition, in the above-described embodiments, a case where structural bodies having a concave shape or a convex shape are formed on the outer circumferential surface of the master having a solid cylinder shape or a hollow cylinder shape has been described as an example. However, when the master has a hollow cylinder shape, structural bodies having a concave shape or a convex shape may be formed on the inner circumferential surface of the master.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

What is claimed is:

1. An optical device that has an antireflection function, the optical device comprising:
    a base; and
    a plurality of structural bodies, which are formed by convex portions or concave portions, arranged on a surface of the base with a fine pitch that is equal to or smaller than a wavelength of visible light,
    wherein the plurality of structural bodies are arranged so as to form tracks of a plurality of rows on the surface of the base and form a quasi-hexagonal lattice pattern, a tetragonal lattice pattern, or a quasi-tetragonal lattice pattern, and
    wherein a packing ratio of the structural bodies to the surface of the base is equal to or higher than 65%, the packing ratio being defined by the following Equation (3):

$$\text{packing ratio} = (S(\text{hex})/S(\text{unit})) \times 100 \qquad \text{Equation (3)}$$

where
    S(unit) is an area of a unit lattice defined by P1×2Tp, where P1 is an arrangement pitch of the plurality of structural bodies within a same track and Tp is a track pitch, and
    S(hex) is an area of bottom surfaces of the structural bodies that exist within the unit lattice.

2. The optical device according to claim 1, wherein the packing ratio of the structural bodies to the surface of the base is equal to or higher than 73%.

3. The optical device according to claim 2, wherein the packing ratio of the structural bodies to the surface of the base is equal to or higher than 86%.

4. The optical device according to claim 1,
    wherein the plurality of structural bodies are arranged so as to form tracks of a plurality of rows that have a linear shape and form a quasi-hexagonal lattice pattern, and
    wherein a height or depth of the structural body in an extending direction of the tracks is smaller than a height or depth of the structural body in a row direction of the tracks.

5. The optical device according to claim 1,
    wherein the plurality of structural bodies are arranged so as to form tracks of a plurality of rows that have a linear shape and form a tetragonal lattice pattern or a quasi-tetragonal lattice pattern, and
    wherein a height or depth of the structural body in an arrangement direction that is tilted with respect to an extending direction of the tracks is smaller than a height or depth of the structural body in an extending direction of the tracks.

6. The optical device according to claim 1, wherein the arrangement pitch P1 is longer than an arrangement pitch P2 of the plurality of structural bodies between two adjacent tracks.

7. A display device comprising the optical device according to claim 1.

8. A package comprising the optical device according to claim 1.

9. A method of manufacturing a master that is used for producing an optical device that has an antireflection function, the method comprising:
- forming a resist layer on a circumferential surface of the master having a solid cylinder shape or a hollow cylinder shape;
- forming a latent image with a pitch shorter than a wavelength of visible light by intermittently irradiating laser beams onto the resist layer while a spot of the laser beams is relatively moved in parallel with a center axis of the master having the solid cylinder shape or the hollow cylinder shape together with rotating the master in which the resist layer is formed;
- forming a resist pattern on a surface of the master by developing the resist layer; and
- forming a structural body having a concave shape or a convex shape on the surface of the master by performing an etching process using the resist pattern as a mask,
- wherein, in the forming of a latent image, the latent image is arranged so as to form tracks of a plurality of rows on the surface of the master and forms a quasi-hexagonal lattice pattern, a tetragonal lattice pattern, or a quasi-tetragonal lattice pattern, and
- wherein a packing ratio of the structural bodies to the surface of the base is equal to or higher than 65%, the packing ratio being defined by the following Equation (3):

packing ratio=($S$(hex)/$S$(unit))×100      Equation (3)

where
- $S$(unit) is an area of a unit lattice defined by P1×2Tp, Where P1 is an arrangement pitch of the plurality of structural bodies within a same track and Tp is a track pitch, and
- $S$(hex) is an area of bottom surfaces of the structural bodies that exist within the unit lattice.

10. A method of manufacturing a master that is used for producing an optical device that has an antireflection function, the method comprising the steps of:
- forming a resist layer on a circumferential surface of the master having a solid cylinder shape or a hollow cylinder shape;
- forming a latent image with a pitch shorter than a wavelength of visible light by intermittently irradiating laser beams onto the resist layer while a spot of the laser beams is relatively moved in parallel with a center axis of the master having the solid cylinder shape or the hollow cylinder shape together with rotating the master in which the resist layer is formed;
- forming a resist pattern on a surface of the master by developing the resist layer; and
- forming structural bodies having a concave shape or a convex shape on the surface of the master by performing an etching process using the resist pattern as a mask,
- wherein, in the forming of a latent image, the latent image is arranged so as to form tracks of a plurality of rows on the surface of the master and forms a quasi-hexagonal lattice pattern, and
- wherein, when an arrangement pitch of the plurality of structural bodies within a same track is P1 and a diameter of the structural body in a direction of the tracks is 2r, a ratio ((2r/P1)×100) of the diameter 2r to the arrangement pitch P1 is equal to or higher than 85%.

11. A method of manufacturing a master that is used for producing an optical device that has an antireflection function, the method comprising the steps of:
- forming a resist layer on a circumferential surface of the master having a solid cylinder shape or a hollow cylinder shape;
- forming a latent image with a pitch shorter than a wavelength of visible light by intermittently irradiating laser beams onto the resist layer while a spot of the laser beams is relatively moved in parallel with a center axis of the master having the solid cylinder shape or the hollow cylinder shape together with rotating the master in which the resist layer is formed;
- forming a resist pattern on a surface of the master by developing the resist layer; and
- forming structural bodies having a concave shape or a convex shape on the surface of the master by performing an etching process using the resist pattern as a mask,
- wherein, in the forming of a latent image, the latent image is arranged so as to form tracks of a plurality of rows on the surface of the master, and a tetragonal lattice pattern or a quasi-tetragonal lattice pattern is formed, and
- wherein, when an arrangement pitch of the plurality of structural bodies within a same track is P1 and a diameter of the structural body in a direction of the tracks is 2r, a ratio ((2r/P1)×100) of the diameter 2r to the arrangement pitch P1 is equal to or higher than 64%.

12. A method of manufacturing an optical device that has an antireflection function, the method comprising the steps of:
- forming a resist layer on a circumferential surface of the master having a solid cylinder shape or a hollow cylinder shape;
- forming a latent image with a pitch shorter than a wavelength of visible light by intermittently irradiating laser beams onto the resist layer while a spot of the laser beams is relatively moved in parallel with a center axis of the master having the solid cylinder shape or the hollow cylinder shape together with rotating the master in which the resist layer is formed;
- forming a resist pattern on a surface of the master by developing the resist layer;
- forming structural bodies having a concave shape or a convex shape on the surface of the master by performing an etching process using the resist pattern as a mask; and
- producing the optical device to which the structural bodies are transferred by using the master in which the structural bodies are formed,
- wherein, in the forming of a latent image, the latent image is arranged so as to form tracks of a plurality of rows on the surface of the master and forms a quasi-hexagonal lattice pattern, a tetragonal lattice pattern, or a quasi-tetragonal lattice pattern,
- wherein the transferring of the structural bodies includes forming a resin layer containing siloxane resin on the base, and
- transferring the structural bodies of the master by pressing the master against the resin layer, and
- wherein a packing ratio of the structural bodies to the surface of the base is equal to or higher than 65%, the packing ratio being defined by the following Equation (3):

packing ratio=($S$(hex)/$S$(unit))×100      Equation (3)

where
- $S$(unit) is an area of a unit lattice defined by P1×2Tp, where P1 is an arrangement pitch of the plurality of structural bodies within a same track and Tp is a track pitch, and
- $S$(hex) is an area of bottom surfaces of the structural bodies that exist within the unit lattice.

* * * * *